(12) United States Patent
Miyazawa

(10) Patent No.: US 6,288,410 B1
(45) Date of Patent: Sep. 11, 2001

(54) SEMICONDUCTOR OPTICAL DEVICE WITH TENSILE-STRAINED QUANTUM WELL STRUCTURE

(75) Inventor: Seiichi Miyazawa, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/944,586

(22) Filed: Oct. 6, 1997

(30) Foreign Application Priority Data

| | | |
|---|---|---|
| Oct. 7, 1996 | (JP) | 8-284693 |
| Nov. 30, 1996 | (JP) | 8-334554 |
| Apr. 25, 1997 | (JP) | 9-122926 |
| Apr. 25, 1997 | (JP) | 9-122927 |
| Apr. 25, 1997 | (JP) | 9-122928 |
| Jul. 11, 1997 | (JP) | 9-202543 |

(51) Int. Cl.$^7$ .............................. H01L 33/00; H01S 3/19
(52) U.S. Cl. ................ 257/14; 257/18; 257/22; 257/96; 257/97; 372/27; 372/45; 372/46
(58) Field of Search .................... 257/14, 17, 18, 257/22, 21, 96, 97; 372/43, 44, 45, 46, 27

(56) References Cited

U.S. PATENT DOCUMENTS 5,473,173 * 12/1995 Takiguchi et al. ............. 257/14
5,780,867 * 7/1998 Fritz et al. ..................... 257/18

FOREIGN PATENT DOCUMENTS

| | | |
|---|---|---|
| 674 372 A1 | 9/1995 | (EP) . |
| 718 937 A2 | 6/1996 | (EP) . |
| 784 366 A2 | 7/1997 | (EP) . |
| 02117190 | 5/1990 | (JP) . |
| 07162088 | 6/1995 | (JP) . |
| wo/9635248 | 11/1996 | (WO) . |

OTHER PUBLICATIONS

"Quantum Well Visible Algainp Light–Emitting Diodes", IBM Technical Disclosure Bulletin, vol. 34, No. 12, May 1, 1992, pp. 219–222.
Mathur A et al: "1.55–MU M dual–Polarization Lasers Implemented with Compressive and Tensile–Strained quantum Wells", IEEE Photonics Technology Letters, vol. 7, No. 11, Nov. 1, 1995, pp. 1243–1245.
Newkirk M A: "1.5 M Multiquantum–Well Semiconductor Optical Amplifier with Tensile and Compressively Strained Wells For Polarization–Independent Gain", IEEE Photonics Technology Letters, vol. 5, No. 4, Apr. 1, 1993, pp. 406–408.
Ishikawa and Furuta, "LiNbO$_3$ Optical Wavelength Modulation For Bi–directional Transmission in Optical CATV Subscriber Systems", OCS 91–82, Mar. 12, 1992.

* cited by examiner

*Primary Examiner*—Minh Loan Tran
(74) *Attorney, Agent, or Firm*—Fitzpatrick, Cella, Harper & Scinto

(57) ABSTRACT

An optical semiconductor device includes a substrate and an active region formed on the substrate. The active region includes a plurality of quantum well layers containing at least one tensile-strained well layer, and the plurality of quantum well layers include a plurality of quantum well layers whose band gaps are different from each other. Such an active region makes it possible to expand a wavelength range over which TE-mode and TM-mode gains balance with each other or are approximately equal to each other.

23 Claims, 49 Drawing Sheets

SEMICONDUCTOR OPTICAL DEVICE WITH TENSILE-STRAINED QUANTUM WELL STRUCTURE

BACKGROUND OF THE INVENTION

1. Field of the Invention

The present invention relates to a semiconductor optical device having an active layer of a quantum well structure, such as an oscillation polarization mode selective semiconductor laser whose oscillation polarization mode can be changed by a direct modulation method with its dynamic wavelength fluctuation being oppressed even at the time of high-speed modulation and an polarization-insensitive optical amplifier which can amplify light substantially irrespective of its polarized condition, a use method of the semiconductor optical device and a method for driving the semiconductor optical device. The present invention also relates to a light source apparatus, an optical communication method and an optical communication system using the optical semiconductor device with an active layer of a quantum well structure.

2. Related Background Art

As an oscillation polarization-mode selective dynamic single-mode semiconductor laser, the following device has been developed and proposed. The oscillation polarization mode selective device has a structure that can be modulated by a digital signal which is produced by superposing a small-amplitude digital signal on a bias injection current (see, for example, Japanese Patent Laid-Open Application No. 7(1995)-162088). The device is a distributed feedback (DFB) laser in which a distributed reflector of a grating is provided in a semiconductor laser resonator or cavity and wavelength selectivity of the grating is utilized. In the device, a bulk active layer is used, or strain is introduced into an active layer of a quantum well structure and its Bragg wavelength is located at a position shorter than a peak wavelength of a gain spectrum, so that gains for transverse electric (TE) mode and transverse magnetic (TM) mode are approximately equal to each other for light at wavelengths close to its oscillation wavelength, under a current injection condition near its oscillation threshold. Further, a plurality of electrodes are arranged and currents are unevenly injected through those electrodes.

An equivalent refractive index of the cavity is unevenly distributed by the uneven current injection, and its oscillation occurs in one of the TE mode and the TM mode and at a wavelength which satisfies a phase matching condition and takes a minimum threshold gain. When the balance of the uneven current injection is slightly changed to vary a competitive relation of the phase matching condition between the TE mode and the TM mode (i.e., in which mode is the threshold lower than the other's threshold in a state which satisfies the phase matching condition), the oscillation polarization mode and wavelength of the device can be switched.

In that semiconductor device, an antireflection coating is provided on one end facet to asymmetrically employ effects of the uneven current injection into its output-side portion (a modulation current is not injected into the output-side portion with one electrode so as not to fluctuate an output power) and its modulation-electrode portion (a portion where the other electrode is arranged). Alternatively, lengths of those electrodes are made different from each other to obtain a structural asymmetry.

Further, Japanese Patent Laid-Open Application No. 2-117190 discloses a semiconductor laser apparatus in which two semiconductor structures are arranged serially or in parallel. One of the semiconductor structures principally oscillates or amplifies a light wave in a predetermined polarization mode, and the other one chiefly oscillates or amplifies a light wave in another polarization mode. Those semiconductor structures are formed on a common layer plane or in parallel layer planes.

In the polarization selective DFB laser in which the oscillation polarization mode is selected depending on its above-discussed phase condition (i.e., the oscillation in a polarization mode having a lower threshold is selected at a wavelength which satisfies its phase condition), it is important to approximately equalize gains for the TE mode and the TM mode with each other in its cavity. As an active layer for such a purpose, there have been proposed a method of forming a bulk active layer with about the same TE-mode and TM-mode gains, a method of arranging an active layer with a dominant TM-mode gain obtained by the introduction of strain or the like thereinto in sequence with an active layer for generating a TE-mode gain (see Japanese Patent Laid-Open Application No. 2(1990)-117190).

Those structures, however, have the following drawbacks. In the bulk active layer, though the TE gain can be made equal to the TM gain, its threshold current tends to increase. Therefore, its threshold current needs to be reduced by its quantization or the like.

On the other hand, in the method of Japanese Patent Laid-Open Application No. 2-117190 in which active layers with dominant TE and TM gains are serially or in parallel are arranged, the number of its growth steps is increased and its fabrication process is complicated since active layers with different strains must be formed.

Furthermore, in those active layers, a wavelength band width, over which gains are substantially constant or uniform under a near-threshold condition, is narrow. For example, in a simple quantum well structure, a wavelength range, over which the gain is within a three-dB-down value from its peak and which includes a peak wavelength, is approximately 20 nm. Therefore, considering into account difficulties of the wavelength control near the gain peak wavelength of the active layer and the control of a grating pitch, it is hard to fabricate a low-threshold current laser with a good reproducibility and a stable oscillation wavelength by precisely controlling those gain peak wavelength and grating pitch.

In addition, when considering it necessary that respective wavelength ranges, over which TE-mode and TM-mode gains are substantially uniform and balance with each other, overlap on each other, it is desirable that a wavelength range, over which a gain for each polarization mode is approximately constant, is sufficiently wide. Furthermore, when an array laser consisting of a plurality of lasers with different oscillation wavelengths are to be achieved by using a common active layer, it is necessary that a wavelength range, over which each gain is approximately uniform, be expanded.

SUMMARY OF THE INVENTION

It is therefore an object of the present invention to provide an optical semiconductor device, such as a low-threshold current laser which can be fabricated with a relatively small number of growth steps and a laser with an active layer which achieves a wide wavelength range over which TE-mode and TM-mode gains balance with each other or are approximately equal to each other, an optical communication system or method using the optical semiconductor device and the like.

The present invention is directed to an optical semiconductor device including a substrate and an active region formed on the substrate, wherein the active region includes a plurality of quantum well layers containing at least one tensile-strained well layer, and the plurality of quantum well layers include a plurality of quantum well layers whose band gaps are different from each other. According to such a fundamental structure, a wavelength range, over which gains for two different polarization modes respectively have certain degrees of magnitudes, can be set relatively wide. Further, in that fundamental structure, a balancing fashion of the gains for two different polarization modes in the wavelength range and its wavelength range can be flexibly set by appropriately setting the number of quantum well layers, kind and degree of strains thereof, their compositions, their thicknesses and their band gaps.

In this specification, the "band gap" of the quantum well or barrier layer means transition energy between quantum levels. The band gap is not uniquely determined by material composition of the quantum well or barrier layer (hereinafter represented by the quantum well), and is determined by the composition, thickness and introduced strain amount of the quantum well. In general, the transition between the level of electrons and the level of heavy holes primarily causes a gain for the TE mode, while the transition between the level of electrons and the level of light holes primarily causes a gain for the TM mode (this transition, however, also causes a certain degree of gain for the TE mode). Therefore, when a plurality of tensile-strained quantum well layers are arranged and band gaps of those quantum wells are varied (i.e., transition energies between the level of electrons and the level of light holes in the respective quantum wells are varied from each other), a wavelength range, over which at least the gain for the TM mode has an enough magnitude, can be expanded. When a plurality of non-strained or compressively-strained quantum well layers are arranged and band gaps of those quantum wells are varied (i.e., transition energies between the level of electrons and the level of heavy holes in the respective quantum wells are varied from each other), a wavelength range, over which at least the gain for the TE mode has an enough magnitude, can be expanded.

In a tensile-strained quantum well in which the ground level of holes is the level of light holes, the transition between the level of electrons and the level of light holes causes gains not only for the TM mode but for the TE mode, and/or the transition can also occur between the level of electrons and the level of holes other than the ground level. Therefore, even in a structure in which a plurality of tensile-strained quantum well layers are arranged but no non-strained or compressively-strained quantum well layers are arranged, transition energies for causing TE-mode light can be made different from each other between the respective quantum wells by varying the composition, thickness and strain amount of those quantum wells from each other. Thus, a wavelength range, over which the gain for the TE mode has an enough magnitude, can be extended (this structure is employed in a second construction described later).

Further, since the transition can occur between the level of electrons and the level of light holes other than the ground level, even when the tensile strain amount is small or when the non-strained or compressively-strained quantum well, whose ground level of holes is the level of heavy holes, is arranged, a wavelength range, over which gains not only for the TE mode but also for the TM mode have enough magnitudes, can be widened by arranging a plurality of quantum well layers whose compositions, thicknesses and strain amounts are varied from each other.

Thus, according to the present invention, band gaps of a plurality of quantum well layers can be varied from each other by appropriately setting their compositions, thicknesses and strain amounts, and wide gain spectra for the two polarization modes can be obtained. Optical semiconductor devices of the present invention make use of that concept.

Further, according to the concept of the present invention, gains for the two polarization modes can be made close to each other (for example, a gain difference therebetween can be set within several decibels by controlling strain amounts and well thicknesses of the respective well layers and/or by considering the gain for each polarization mode in each well.

On the basis of the above basic structure and recognition, the above object of the present invention can be effectively achieved by adopting the following more specific structures.

According to a first construction, the plurality of quantum well layers contain at least one tensile-strained well layer and at least one non-strained or compressively-strained well layer. An appropriate balance between gains for the TE mode and the TM mode can be readily attained by arranging not only the tensile-strained well layer but also the non-strained or compressively-strained well layer and providing plural well layers with respect to at least one of them.

In the above construction, the following methods exist as a method for varying band gaps of the plural quantum wells to properly shift wavelength ranges of gains in the respective well layers from each other. Thicknesses are made different from each other, or tensile strain amounts are made different from each other (those methods can also be used in the following second and third constructions). Further, the balancing gain and wavelength range can be flexibly set when the plural quantum well layers with different band gaps include plural tensile-strained quantum well layers or plural non-strained or compressively-strained quantum well layers (those structures can also be used in the following third construction).

In a second construction, the active region consists of a plurality of tensile-strained quantum well layers and at least a barrier layer formed between the tensile-strained quantum well layers, and at least one of the tensile-strained quantum well layers has a band gap different from a band gap of another tensile-strained quantum well layer. Gains for the TE mode and the TM mode are generated in a competitive fashion by using the active layer with the tensile-strained well layers. Further, wavelength ranges of gains due to the respective well layers are varied from each other by using a multi-well structure in the active layer. Thus, a wavelength range of competitive gains for the TE mode and the TM mode can be expanded.

In the second construction, the following specific structures can be adopted. As a method for varying wavelength ranges of gains due to the respective wells by varying their band gaps, thicknesses and/or strain amounts of the tensile-strained well layers are varied from each other. Specifically, when tensile strain amounts of the plural tensile-strained quantum well layers approximately ranges from 0.5% to 0.75%, a wavelength range of competing gains for the TE mode and the TM mode can be sufficiently expanded by using the tensile-strained quantum well layers only. Those values refer to the limit of the strain amount in the case where wells in the active layer are all tensile-strained quantum well layers.

In a third construction, a quantum well layer with the worst carrier confinement out of the quantum well layers with different band gaps is placed on a minority carrier supply side (this is a hole supply side when non-doped or n-doped, and an electron supply side when p-doped) and a quantum well layer with the best carrier confinement is formed adjacently to the quantum well layer with the worst carrier confinement. In this case, the tensile-strained quantum well layer and the non-strained quantum or compressively-strained well layer may be treated not only separately but also in a mixed way. Hence, the supply of carriers, which are hard to move, to each well can be improved, and a wavelength range, over which gains for the TE mode and the TM mode preferably compete, can be extended. Thus, the gain can be preferentially generated in a wavelength range where the gain is hard to generate.

Specifically, in the third construction, a quantum well layer with the widest band gap out of the quantum well layers with different band gaps is placed on the minority carrier supply side and a quantum well layer with the narrowest band gap is then formed adjacently to the quantum well layer with the widest band gap. In this structure, the degree of the carrier confinement is defined by the width of the band gap. Further, in the third construction, a quantum well layer with the thinnest thickness out of the quantum well layers with different band gaps is placed on the minority carrier supply side and a quantum well layer with the thickest thickness is then formed adjacently to the quantum well layer with the thinnest thickness. In this structure, the degree of the carrier confinement is defined by the layer thickness of the well.

In each of the above structures, the following structure may be employed. The active region includes at least a tensile-strained quantum well layer and at least a compressively-strained or non-strained quantum well layer which are laid down in a direction of layering, and the at least one tensile-strained quantum well layer and the at least one compressively-strained or non-strained quantum well layer are separated from each other with a barrier layer provided therebetween. Alternatively, the active region includes at least a tensile-strained quantum well layer and at least a compressively-strained or non-strained quantum well layer which are laid down in a direction of layering in a mixed manner.

Further, a quantum well layer with a wide band gap is placed on a minority carrier carrier supply side and the band gap of the quantum well layer decreases as its location approaches a majority carrier supply side in at least a portion of the quantum well layers with different band gaps. Hence, carriers can be more effectively supplied to all of the active layer, and approximately uniform gains can be obtained. Furthermore, the thickness of the quantum well layer increases as its location approaches the majority carrier supply side from the minority carrier supply side in at least a portion of the quantum well layers with different band gaps. Also in this case, carriers can be more effectively supplied to all of the active layer.

Further, there are arranged a plurality of barrier layers each being interposed between the quantum well layers, and the band gap of the barrier layer increases as its location approaches a majority carrier supply side from a minority carrier supply side in at least a portion of the barrier layers. Furthermore, the thickness of the barrier layer increases as its location approaches a majority carrier supply side from a minority carrier supply side in at least a portion of the barrier layers. Also in those cases, carriers can be more effectively supplied to all of the active layer.

Further, the active region is non-doped or at least partly n-doped. Or, the active region is at least partly p-doped. Thereby, the entire threshold is reduced, and p-type carriers with a short diffusion length are sufficiently supplied to all of the active layer. Further, carriers can be more effectively supplied to all of the active layer, and approximately uniform gains can be obtained.

Further, there are arranged a plurality of regions in a cavity direction and the regions are constructed such that currents can be injected into the respective regions independently. In this case, at least two of the plural regions may be constructed such that propagation constants thereof are structurally different from each other.

Further, the optical semiconductor device includes the active region as a common active layer and is constructed as an array laser in which a plurality of polarization selective lasers with different oscillation wavelengths are arranged in a direction perpendicular to a direction of a laser stripe.

According to another aspect of the present invention, there is provided a light source apparatus which includes the above-discussed optical semiconductor device and a polarization mode selecting unit, such as a polarizer, for selecting light in one of the two different polarization modes emitted from the semiconductor device.

According to still another aspect of the present invention, there is provided an optical communication system for communicating over a light transmission line that transmits a signal from a transmitter side to a receiver side. The system includes the above light source apparatus, a coupling unit for coupling light in one of the two different polarization modes from the semiconductor device to the light transmission line, and a receiver for receiving the light in one of the two different polarization modes transmitted through the light transmission line.

According to yet another aspect of the present invention, there is provided an optical communication method for communicating over a light transmission line that transmits a signal from a transmitter side to a receiver side. In the method, the above light source apparatus is used, a current, which is produced by superimposing a modulation signal modulated in accordance with a transmission signal on a predetermined bias current, is supplied to the semiconductor device and a signal intensity-modulated in accordance with the transmission signal is selected by the polarization mode selecting unit to transmit the intensity-modulated signal to the receiver side.

These advantages and others will be more readily understood in connection with the following detailed description of the preferred embodiments in conjunction with the drawings.

DESCRIPTION OF THE PREFERRED EMBODIMENT

Embodiments of a semiconductor optical device and the like constructed in accordance with the present invention will be described with reference to the drawings.

First Embodiment

Figure 1A:
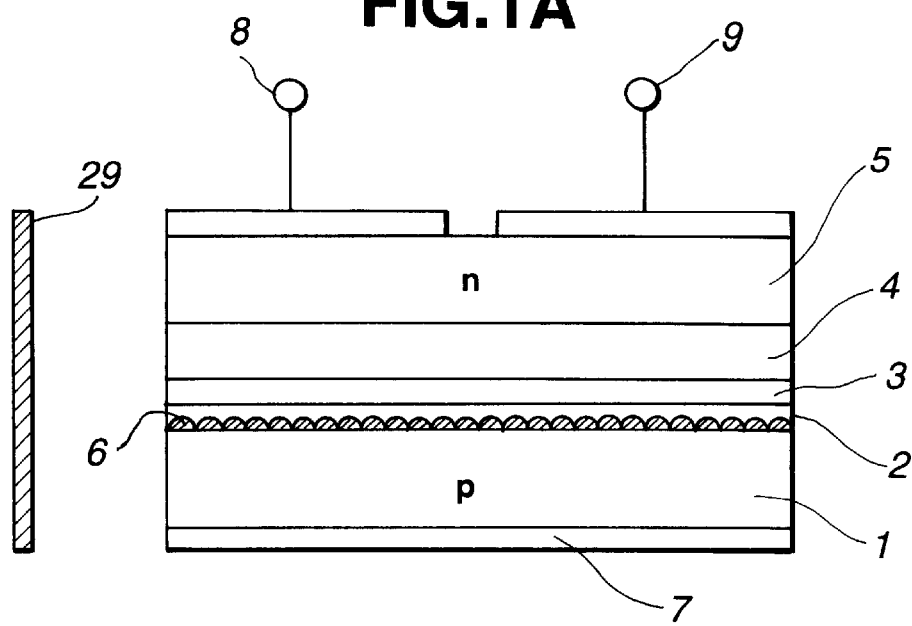
FIG. 1A illustrates a cross-section in a cavity direction of an optical semiconductor device of a first embodiment or the like of the present invention.

A first embodiment will be described with reference to FIGS. 1A through 3C. In FIG. 1A showing the entire structure of the first embodiment, reference numeral 1 denotes a p-InP substrate, and a diffraction grating 6 with a depth of 500 Å is formed on the substrate 1. On the diffraction grating 6, a Be-doped InGaAsP light guide layer 2 is deposited with a thickness of 0.15 μm. Thereon, an active region 3 is formed and then an upper clad layer 4 including a light guide layer is formed. The upper light guide layer is comprised of a Si-doped InGaAsP layer of a thickness of 0.2 μm, and the upper clad layer consists of a Si-doped InP layer having a thickness of 1.5 μm. Thereon, a contact layer 5 of Si-doped InGaAs having a thickness of 0.3 μm is laid down, and thus the growth process is completed.

Further, in FIG. 1A, reference numeral 7 designates a p-side electrode of Cr/Au, and reference numerals 8 and 9 designate n-side electrodes. Thus, a multi-electrode laser is built. A light component in one of polarization modes out of light emitted from the thus-fabricated polarization switchable laser is selected by a polarizer 29.

Figure 1B:
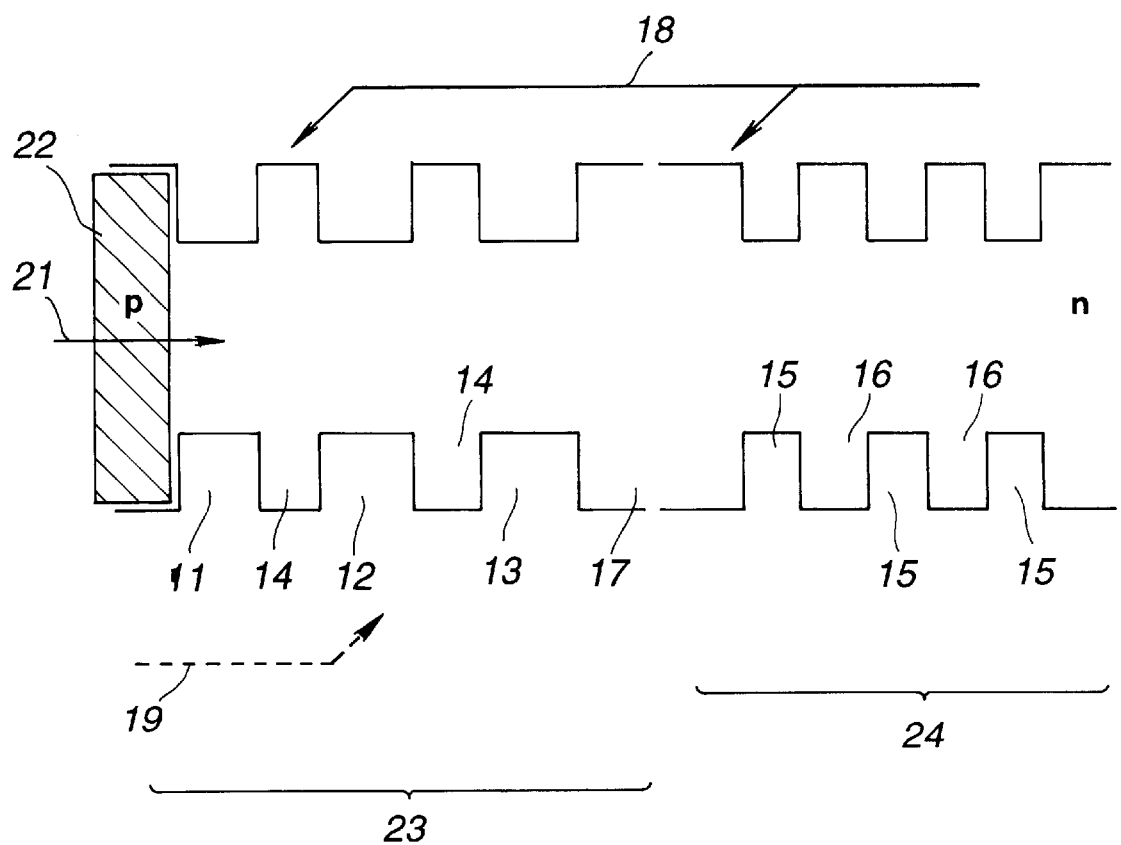
FIG. 1B illustrates the band gap structure of layers around an active layer used in the first embodiment.

The layer structure of the active region 3 will be described with reference to FIG. 1B. In FIG. 1B, an arrow 21 indicates a direction of layering. Reference numeral 22 designates a Be-doped light guide region which corresponds to the light guide layer 2 in FIG. 1A. The structure of the active layer 3 is divided into a tensile-strained region 23 and a non-strained region 24. The structure of the tensile-strained region 23 will be described. On the light guide layer 22, a well layer 11 of undoped InGaAs is initially grown with a thickness of 90 Å. A tensile strain of 1.0% is introduced into the well layer 11. Then, a barrier layer 14 is grown. The barrier layer 14 is comprised of undoped InGaAsP having a thickness of 70 Å, and a compressive strain of 0.2% is introduced into the layer 14. The compressive strain opposite to the tensile strain is introduced into the barrier layer 14 to improve the crystal quality of the well layer and the like due to strain compensation effect.

On the barrier layer 14, a well layer 12 is laid down. The well layer 12 is composed of undoped InGaAs, its thickness is 110 Å and its tensile strain amount is 1.0%. Then a barrier layer, whose composition is the same as that of the barrier layer 14 and whose thickness is 70 Å, is formed. On this barrier layer 14, a well layer 13 of undoped InGaAs is formed with a thickness of 130 Å and a tensile strain amount of 1.0%. Such is the structure of the tensile-strained region 23. Since thicknesses of the well layers 11, 12 and 13 are varied as 90 Å, 110 Å and 130 Å, quantum levels in those well layers differ from each other and their band gaps corresponding to inter-quantum-level transition energies diverge from each other. Thus, oscillation wavelengths due to those well layers 11, 12 and 13 diverge from each other. Hence, wavelength ranges of gains due to those well layers 11, 12 and 13 preferably and continuously overlap, and it is possible to obtain the gain which has a magnitude to some extent and is approximately uniform over a wide wavelength range. In this case, the gain is primarily for the TM mode though a small amount of gain for the TE mode can also be obtained.

Figure 2:
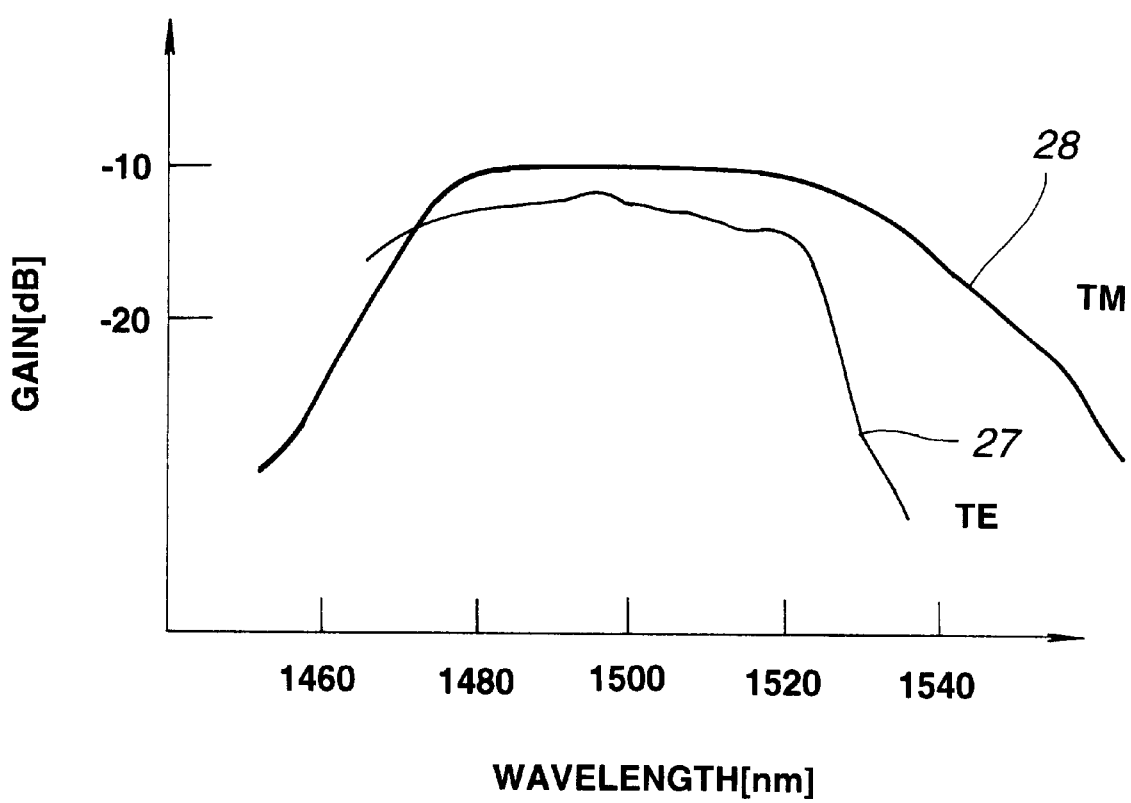
FIG. 2 is a view illustrating gain spectra for the TE and the TM mode in the first embodiment.

FIG. 2 illustrates the gain distribution or profile. Its ordinate indicates the gain while its abscissa indicates the wavelength. As indicated by a line 28 in FIG. 2, the gain of the TM mode can have an approxilately uniform magnitude over a range from 1480 nm to 1530 nm due to the presence of the well layers 11, 12 and 13.

In the tensile-strained region 23 of FIG. 1B, the reason a narrow well layer is placed near the p-type layer is as follows. The diffusion distance of p-type holes 19 is relatively short, compared with that of n-type electrons 18, and thus the diffusion length of the holes 19 is short while the n-type electrons 18 are supplied over the entire active layer. Thus, initially the well layer located near the p-side can acquire the gain more easily than the others. On the other hand, the quantum level rises as the thickness of the well layer decreases, and the confinement of carriers is lowered therein. As a result, it is considered that the gain is harder to generate when the well layer with a narrow thickness is formed away from the p-type layer. Therefore, the narrower the well layer is, the nearer the well layer is positioned to the p-side in order to compensate for Hence, as shown in FIG. 2, it is possible to regulate the gains of the well layers 11, 12 and 13 in the tensile-strained region 23, and a substantially uniform gain can be obtained over a wide range. If a sufficiently uniform gain can not be attained even by that structure, an additional well layer, which can provide a gain in a wavelength range with an insufficient gain, only needs to be formed. Also in this case, it is desirable that a well layer with a narrower thickness is positioned nearer the p-side in the tensile-strained region 23.

Here, the tensile-strained well layers 11, 12 and 13 generate not only the gain for the TM mode but also the gain for the TE mode, as already described. In a well layer with a tensile strain of 1.0%, a peak wavelength of the gain for the TE mode generated thereby is on a shorter wavelength side than a peak wavelength of the gain for the TM mode, and this difference is about 20 nm under its near-threshold condition.

Then, the structure of the non-strained active region 24 for generating the gain for the TE mode will be described. Initially, a barrier layer 17 for separating the tensile-strained active region 23 from the non-strained active region 24 is formed on the tensile-strained well layer 13. Its composition is undoped InGaAsP and its thickness is 100 Å. On the barrier layer 17, a non-strained undoped InGaAs well layer 15 is formed with a thickness of 6 nm. An undoped InGaAsP barrier layer 16 is then laid down over the well layer 15. No strain is introduced into the barrier layer 16 having a thickness of 70 Å. Thus, three well layers 15 of the same structure and two barrier layers 16 of the same structure are deposited. The non-strained active region 24 has such a construction.

An oscillation wavelength range due to the non-strained active region 24 has a center of 1500 nm, and a wavelength width of an approximately uniform gain is about 20 nm. In this embodiment, the gain for the TE mode consists of the gain generated by the non-strained active region 24 and the gain for the TE mode generated by the tensile-strained active region 23. Therefore, the total wavelength range of an approximately uniform gain for the TE mode is wider than the wavelength range of an approximately uniform gain for the TE mode generated by the non-strained well layers 15, and extends from about 1480 nm to about 1520 nm (i.e., a band width of about 40 nm), as illustrated by reference numeral 27 in FIG. 2.

Figure 3A:
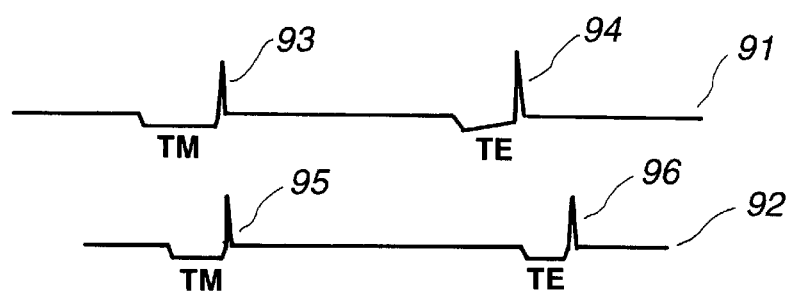
FIGS. 3A–3C are views respectively illustrating the operation the first embodiment of the present invention.
Figure 3B:
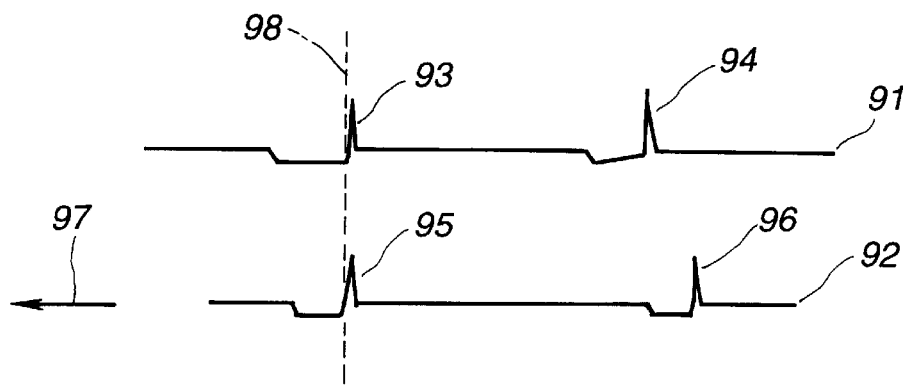
Figure 3C:
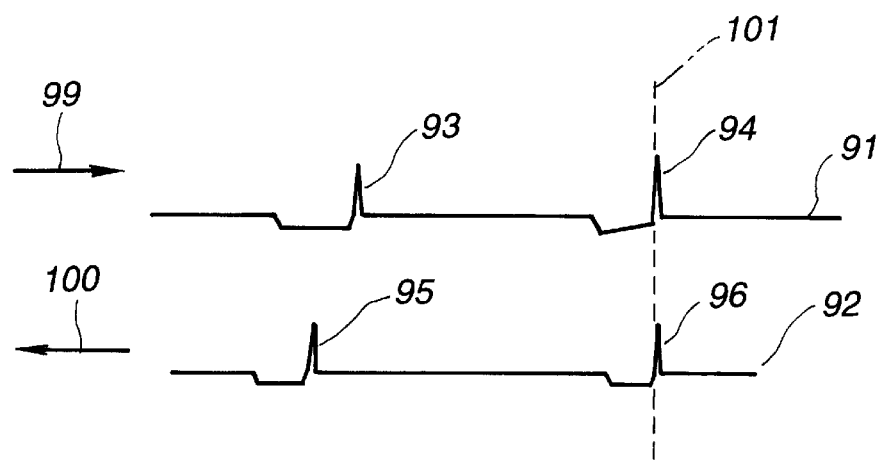

A method for driving the above-discussed first embodiment will be described with reference to FIGS. 1A and 3A through 3C. In FIG. 3A through 3C, the ordinate indicates a light output (a relative value), and the abscissa indicates a wavelength. FIG. 3A shows oscillation spectra at the time currents are respectively supplied to the electrodes 8 and 9. Locations of and a difference between oscillation spectra for the TE mode and the TM mode are varied by the currents into the regions with the electrodes 8 and 9 (the region with the electrode 8 is on a light emission side and the polarizer 29 is placed in front thereof). In FIG. 3A, an upper portion shows oscillation spectra for the respective modes in the region with the electrode 8 and a lower portion shows oscillation spectra for the respective modes in the region with the electrode 9. Here, the oscillation spectra for the respective modes are illustrated as a single spectrum for the sake of easy understanding, since those oscillation spectra are almost identical with each other except their spectral peaks and it is important here to differentiate the positions of those oscillation spectral peaks from each other.

A sufficient current is injected through the electrode 8 such that oscillation can occur in a polarization mode when the wavelength of oscillation spectral peak for this polarization mode in the region with the electrode 8 coincides with that in the region with the electrode 9. Spectra for the TE mode and the TM mode appearring at this time are indicated by reference numeral 91 in FIG. 3A. Here, reference numeral 93 denotes a stop band of the TM mode (more accurately, this is a peak at one end of the stop band, and this stably appears at a central point of the stop band if a λ/4 shift section or the like is introduced into the diffraction grating 6), and reference numeral 94 denotes a stop band of the TE mode. A wavelength difference between the two stop bands 93 and 94 is several nanometers.

On the other hand, a slightly larger current than that injected through the electrode 8 is injected through the electrode 9. Spectra in this case are as indicated by reference numeral 92 in FIG. 3A. Here, reference numeral 95 denotes a stop band of the TM mode and reference numeral 96 denotes a stop band of the TE mode. A wavelength difference between the two stop bands 95 and 96 in the region with the electrode 9 is larger than that of the spectrum 91 in the region with the electrode 8. As the injected current increases, there occur a plasma effect that the refractive index is lowered due to injected carriers and a thermal effect that the refractive index increases due to generated heat. For a direct current component, the thermal effect is greater than the plasma effect. Therefore, the wavelength of each position of the spectrum for each mode in the region with the electrode 9 is longer than that in the region with the electrode 8, and a wavelength difference between the stop bands 95 and 96 in the region with the electrode 9 is also larger than that in the region with the electrode 8.

A switching operation will be described. In the laser structure illustrated in FIG. 1A, the current injected through the electrode 9 is initially increased slightly. Then, as illustrated by reference numeral 97 in FIG. 3B, the spectrum 92 in the region with the electrode 9 shifts to a shorter wavelength side (a left-hand side in the figure) due to the plasma effect. Thus, the stop band 95 for the TM mode comes to be coincident with the stop band 93 of the spectrum 91 for the TM mode in the region with the electrode 8, as indicated by reference numeral 98. As a result, the gain for the TM mode in the entire cavity increases, and laser oscillation occurs in the TM mode.

An oscillation in the TE mode will be described. The stop bands 94 and 96 for the TE mode are brought into a coincidence state by further increasing the current injected through the electrode 9 or decreasing the current injected through the electrode 8. As the current through the electrode 9 is further increased, the spectrum 92 in the region with the electrode 9 is further shifted toward a shorter wavelength side, as indicated by reference numeral 100 in FIG. 3C. As a result, the stop band 96 of the spectrum 92 for the TE mode is brought into the coincidence condition with the stop band 94 of the spectrum 91 for the TE mode, as indicated by reference numeral 101 in FIG. 3C, and hence the TE-mode gain in the entire cavity increases to cause the oscillation in the TE mode.

Another method can be used as a method for overlapping the stop bands for the TE mode each other. In this method, the spectrum 91 is shifted to a longer wavelength side by decreasing the current injected through the electrode 8, as indicated by reference numeral 99 in FIG. 3C, to make the stop bands 94 and 96 of the TE mode coincident with each other. The amount of the current to be used for performing the switching between the TE mode and the TM mode is less than several milliamperes.

As is already referred to, it can be said that when the refractive index changes due to a small current less than several milliamperes, the plasma effect of the index change due to injected carriers is dominant while the thermal effect is small. Similarly, also in a case of high-speed modulation below several nanoseconds, the index change due to the current is considered to be primary. Therefore, high-speed modulation is possible in this embodiment. This embodiment can be built, if propagation constants can be made different between the regions with the electrodes 8 and 9 and refractive indices of the regions with the respective electrodes can be changed by the currents. As a method for varying the propagation constants or refractive indices of the regions with the respective electrodes different from each other, there are the following methods, for example, other than the above-discussed method of differentiating the amounts of carriers injected into the respective regions from each other: a method of differentiating thicknesses (especially, of the light guide layer) of areas with the active layer, over which light spreads, in the respective regions from each other; and a method of differentiating compositions (especially, of the light guide layer) of areas with the active layer, over which light spreads, in the respective regions from each other.

In the structure of this embodiment, a gain difference between the TE mode and the TM mode is small in the active layer and gains for the both modes balance and are stable over a wide wavelength range, so that the laser switching between the TE mode and the TM mode can be stably conducted. As a switching method between the TE mode and the TM mode, there also exists a method of directly changing the gain for each polarization mode. In this case, the switching is possible not only in a multi-electrode structure but in a single-electrode structure.

In the above-discussed structure, though no reference is made to a structure for oppressing occurrence of the stop band, a single longitudinal mode can be achieved by using a low-reflection coat provided on one end facet or using a λ/4 shift section in the diffraction grating.

As described in the foregoing, in the first embodiment, thicknesses of the well layers in the tensile-strained active region are made different from each other to expand a wavelength range over which gains are approximately uniform and balance, and the well layer of a narrower thickness is placed nearer the p-side layer. Thus, a semiconductor optical device, such as a semiconductor laser whose gains are approximately uniform and balance over a wide wavelength range, can be established.

Well layers with various thicknesses are not limited to the tensile-strained wells. The non-strained well layers may have various thicknesses to improve the wavelength range of a uniform gain. Further, where the well layer of a narrower thickness is located nearer the p-side layer, there is an assumption that the well or barrier in the active layer is undoped or n-doped. Here, "undoped" should be understood as doping is not conducted intentionally.

Second Embodiment

Figure 4:
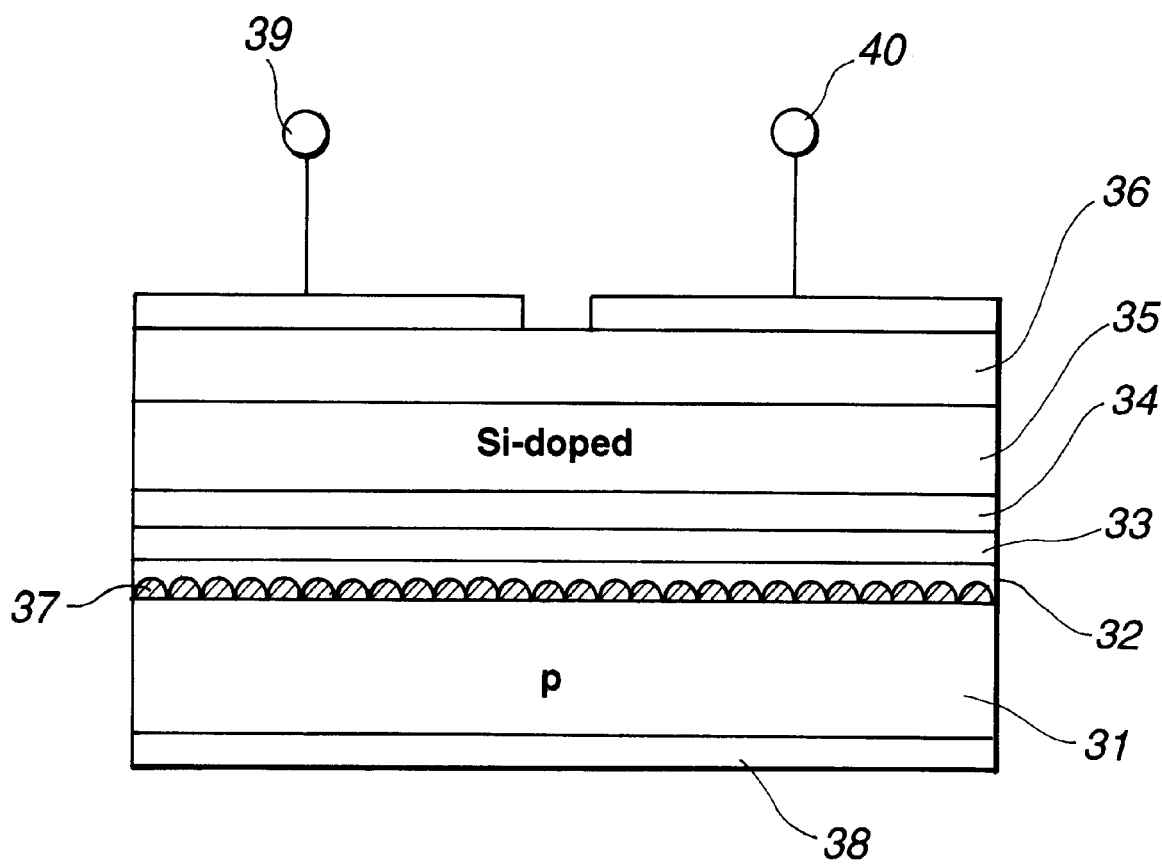
FIG. 4 illustrates a cross-section in a cavity direction of an optical semiconductor device of a second embodiment or the like of the present invention.

A second embodiment will be described with reference to FIGS. 4 through 6. In FIG. 4 showing the entire structure of the second embodiment, reference numeral 31 denotes a p-InP substrate, and a diffraction grating 37 with a depth of 400 Å is formed on the substrate 31. On the diffraction grating 37, a Be-doped InGaAsP light guide layer 32 is deposited with a thickness of 0.1 μm. Thereon, an active region 33 is formed, and then a light guide layer 34 is formed. The light guide layer 34 is comprised of a Si-doped InGaAsP layer of a thickness of 0.1 μm, and its composition is determined such that its band gap wavelength is equal to 1.15 μm. Then, after an upper clad layer 35 of a Si-doped InP layer having a thickness of 1.5 μm is formed, a contact layer 36 of Si-doped InGaAs having a thickness of 0.4 μm is laid down thereover, and thus the growth process is completed.

Further, in FIG. 4, reference numeral 38 designates a p-side electrode of Cr/Au, and reference numerals 39 and 40 designate n-side electrodes. Thus, a multi-electrode laser is fabricated.

The layer structure of the active region 33 will be described with reference to FIG. 5. The feature of the second embodiment is that thicknesses of well layers not only in a tensile-strained active region but in a compressively-strained active region are varied in order to expand a wavelength range of balancing gains. In FIG. 5, an arrow 52 indicates a direction of layering. Reference numeral 32 designates a Be-doped light guide region which corresponds to the light guide layer 32 in FIG. 4. The structure of the active layer 33 is divided into a tensile-strained region 53 and a compressively-strained region 54.

The structure of the tensile-strained region 53 will be described. On the light guide layer 32, a well layer 41 of undoped InGaAs is initially grown with a thickness of 80 Å. A tensile strain of 0.8% is introduced into the well layer 41. Then, a barrier layer 44 is grown. The barrier layer 44 is comprised of an undoped InGaAsP layer having a thickness of 100 Å, and a compressive strain of 0.2% is introduced into the barrier layer 44.

On the barrier layer 44, a well layer 42 is laid down. The well layer 42 is composed of undoped InGaAs, its thickness is 100 Å and its tensile strain amount is 0.8%. Then, a barrier layer, whose composition is the same as that of the barrier layer 44 and whose thickness is 100 Å, is formed. On this barrier layer, a well layer 43 of undoped InGaAs is formed with a thickness of 120 Å and a tensile strain amount of 0.8%. Such is the structure of the tensile-strained region 53. Since the thicknesses of the well layers 41, 42 and 43 are varied as above, quantum levels or band gaps of those well layers differ from each other and their oscillation wavelengths diverge from each other. Hence, gains due to those well layers 41, 42 and 43 are appropriately overlapped on each other and compensate for each other, and it is possible to obtain a wide wavelength range over which gains are approximately constant and balance.

Figure 6:
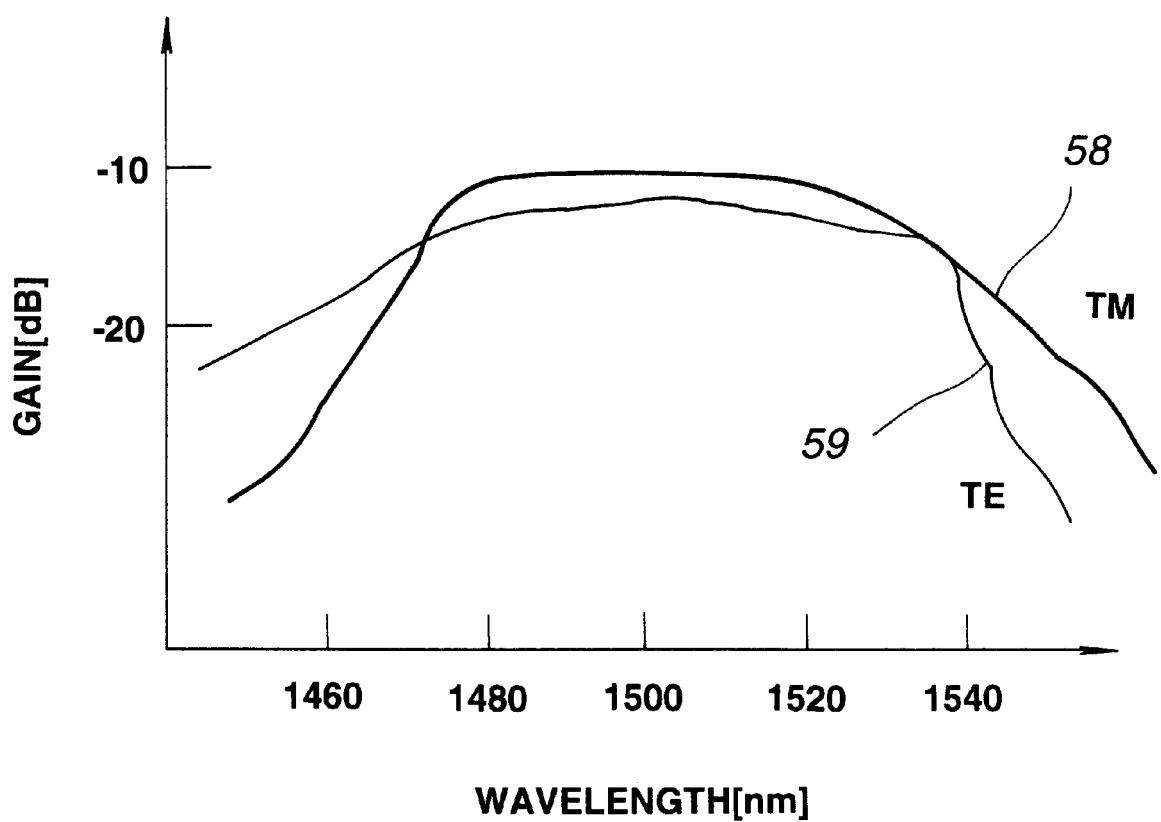
FIG. 6 is a view illustrating gain spectra for the TE mode and the TM mode in the second embodiment.

FIG. 6 illustrates the gain distribution or profile. Its ordinate indicates the gain while its abscissa indicates the wavelength. As indicated by a line 58 in FIG. 6, the gain for the TM mode can have an approxilately uniform magnitude over a range from 1480 nm to 1520 nm due to the presence of the well layers 41, 42 and 43.

Figure 5:
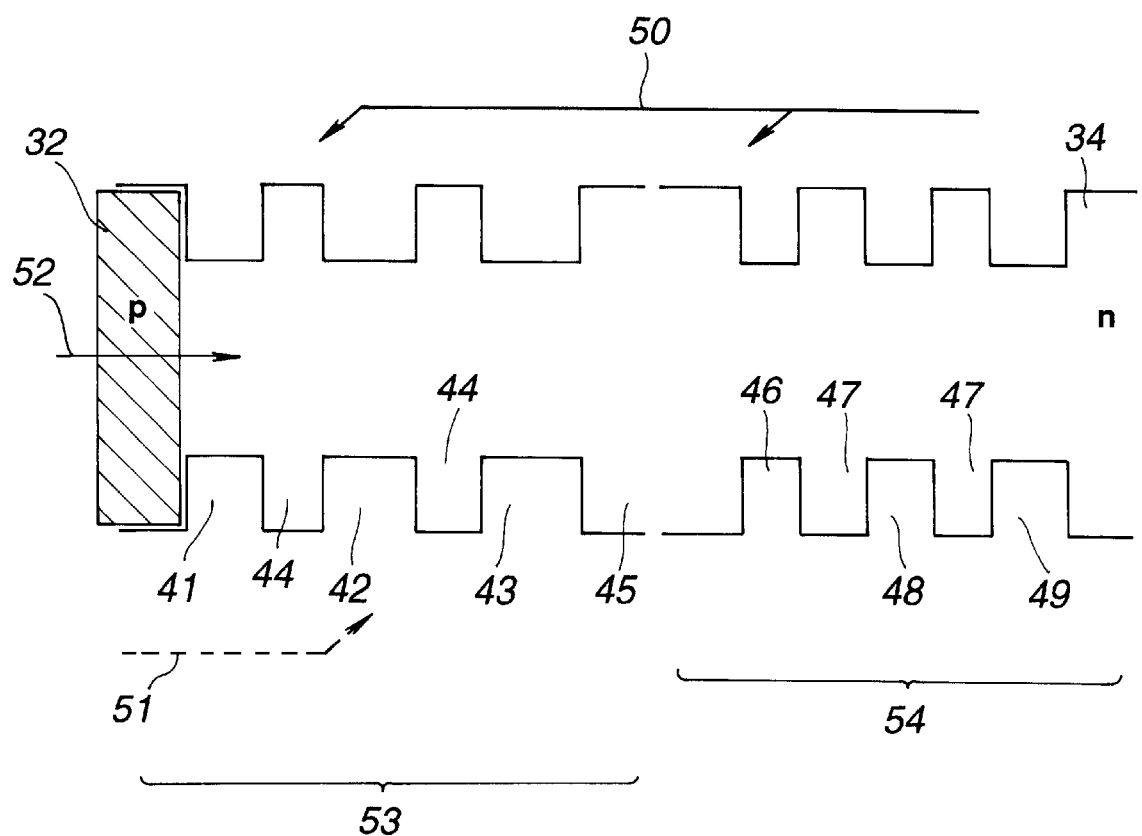
FIG. 5 illustrates the band gap structure of layers around an active layer used in the second embodiment.

In the tensile-strained region 53 of FIG. 5, the reason a narrower well layer is placed nearer the p-type layer is the same as that described in the first embodiment. Hence, as shown in FIG. 6, it is possible to regulate the gains of the well layers 41, 42 and 43 in the tensile-strained region 53, and a substantially uniform gain can be obtained over a wide wavelength range. If a sufficiently uniform gain can not be attained even by that structure, an additional well layer, which can provide a gain for a wavelength range with an insufficient gain, only needs to be formed. Also in this case, it is desirable that a well layer with a narrower thickness is positioned nearer the p-side in the tensile-strained region 53.

Then, the structure of the compressively-strained active region 54 for generating the gain for the TE mode will be described. Initially, a barrier layer 45 for separating the tensile-strained active region 53 from the compressively-strained active region 54 is formed on the tensile-strained well layer 43. Its composition is undoped nGaAsP and its thickness is 150 Å. On the barrier layer 45, a 0.4% compressively-strained undoped InGaAs well layer 46 is formed with a thickness of 30 Å. An undoped InGaAsP barrier layer 47 is then laid down over the well layer 46. No strain is introduced into the barrier layer 47. On the barrier layer 47, a 0.4% compressively-strained undoped InGaAs well layer 48 is formed with a thickness of 40 Å. An undoped InGaAsP barrier layer laid down over the well layer 48 is the same as the barrier layer 47. No strain is introduced into this barrier layer.

Further, a 0.4% compressively-strained undoped InGaAs well layer 49 is formed with a thickness of 50 Å. On the layer 49, the upper light guide layer 34 of undoped InGaAsP is formed with a thickness of 0.2 μm. Such is the structure of the compressively-strained region 54. As indicated by a line 59 in FIG. 6, the gain for the TE mode can have an approxilately uniform magnitude over a range from about 1470 nm to 1530 nm (i.e., a band width of 60 nm) due to the presence of the compressively-strained active layer 54. In FIG. 5, reference numeral 50 designates electrons whose diffusion length is long, and reference numeral 51 designates holes whose diffusion length is short.

A wavelength range, over which gains for both of the TE mode and the TM mode are approximately constant and balance, extends over a width of about 50 nm from 1470 nm to 1520 nm. If the TE-mode and TM-mode gains do not well balance under its near-threshold condition even by that structure, an additional well layer, which can provide a gain for a wavelength range with an insufficient gain, only needs to be formed to improve the balance of gains. Further, in this embodiment, though three well layers are provided in each of the tensile-strained region 53 and the compressively-strained region 54, the number of well layers is not limited to this number. The concept of the present invention can be applied to any structure that has plural well layers.

The switching method between the TE mode and the TM mode is the same as that of the first embodiment. Further, though the p-type substrate is used in this embodiment, an n-type substrate can also be employed. Also in this case, a well layer of a narrower thickness is placed nearer to the p-side layer.

As described in the foregoing, in both of the tensile-strained region and the compressively-strained region of this embodiment, thicknesses of the well layers are varied and the well layer of a narrower thickness is positioned nearer to the p-side layer, so that a wavelength range of approximately uniform gains is widened. Compared with the first embodiment, a wavelength range, over which the gains for the TE mode and the TM mode balance, can be more freely set. Thus, a semiconductor optical laser, such as a semiconductor laser which has an approximately constant gain in a wide wavelength range, can be realized.

Third Embodiment

A third embodiment will be described with reference to FIGS. 3A–3C and 7A through 9. The features of this embodiment are that a tensile-strained region is not separated from a compressively-strained region in an active layer, that well layers are arranged from a p-side to an n-side in the order of their thicknesses (i.e., a narrower well layer is placed nearer the p-side) and that propagation constants of waveguides are controlled by their pre-fabricated physical structures such that the switching between the TE mode and the TM mode can be readily achieved.

Figure 7A:
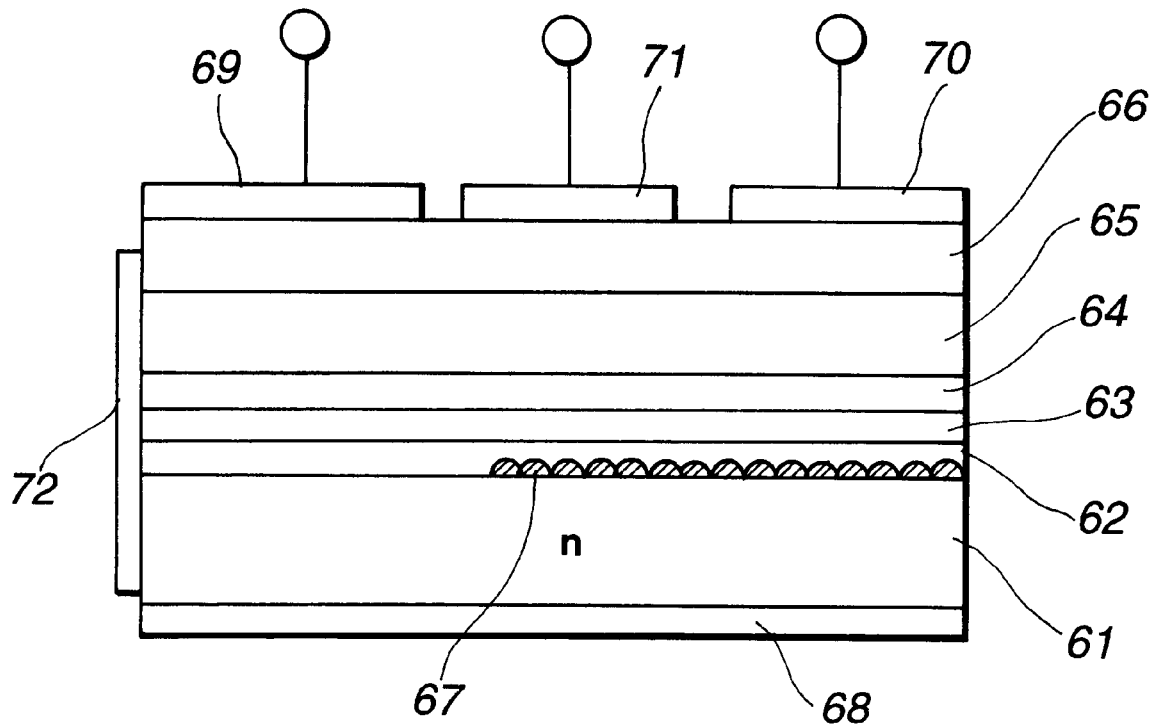
FIG. 7A illustrates a cross-section in a cavity direction of an optical semiconductor device of a third embodiment or the like of the present invention.
Figure 7B:
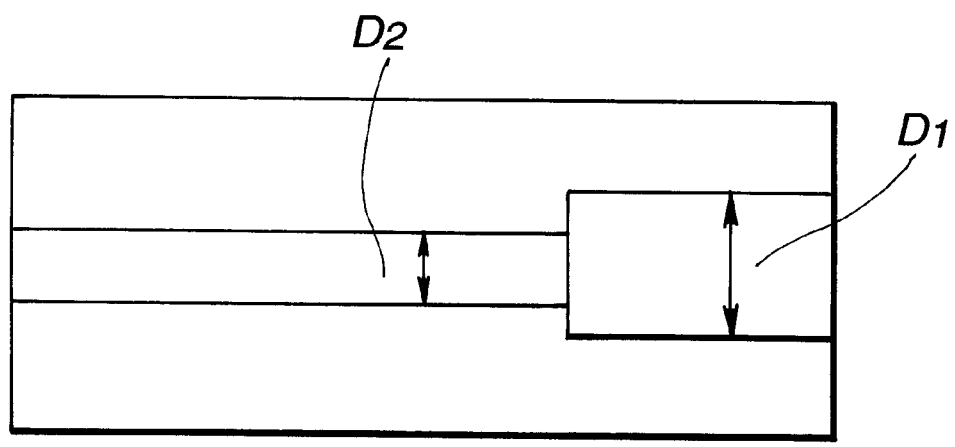
FIG. 7B is a plan view of the third embodiment or the like of the present invention.

In FIGS. 7A and 7B showing the entire structure of the third embodiment, reference numeral 61 denotes an n-InP substrate, and a diffraction grating 67 with a depth of 300 Å is partly formed on the substrate 61. On the diffraction grating 67, a Si-doped InGaAsP light guide layer 62 is deposited with a thickness of 0.15 μm. Thereon, an active region 63 is formed, and then a light guide layer 64 is formed. The light guide layer 64 is comprised of a Be-doped InGaAsP layer of a thickness of 0.2 μm, and its composition is determined such that its band gap wavelength is equal to 1.15 μm. Then, after an upper clad layer 65 of a Be-doped InP layer having a thickness of 1.5 μm is deposited, a contact layer 66 of Be-doped InGaAs having a thickness of 0.4 μm is laid down thereover, and thus the growth process is completed.

Further, in FIG. 7A, reference numeral 68 designates an n-side electrode of AuGe/Au, and reference numerals 69, 70 and 71 respectively designate p-side electrodes. A region with the electrode 69 corresponds to a region without the grating. Reference numeral 72 denotes a low-reflection coat.

In FIG. 7B illustrating a plan view of a semiconductor laser of this embodiment, stripe widths of the waveguides are shown. The stripe width D2 of the region with the electrodes 69 and 71 is relatively narrow, say 1 μm, and the stripe width D1 of the region with the electrode 70 is relatively wide, say 3.5 μm. As the stripe structure, a ridge waveguide type is selected in this embodiment, but a burying type or the like can also be used. The reason for varying the stripe width is that a difference in the propagation constant or the refractive index is beforehand established between the waveguides such that the switching between the TE mode and the TM mode can be stably executed. That is, the switching between the TE mode and the TM mode based on the principle described with reference to FIGS. 3A through 3C can be achieved by that structure.

The layer structure of the active region 63 will be described with reference to FIG. 8. In the first and second embodiments, the tensile-strained region is separated from the compressively-strained or non-strained region by the barrier layer. As a result, the gains for the TE mode and the TM mode can be changed by varying injected current, and thus the switching between the TE mode and the TM mode can be performed. In the active layer of the third embodiment, a gain difference between the TE mode and the TM mode is small and changes in gains for both modes due to the change in the injected current are about equal to each other. The switching between the TE mode and the TM mode is performed using such an active layer. In this embodiment, a narrower well layer is placed nearer to a side into which carriers with a short diffusion length are injected, and the thickness of the well layer becomes wider towards the other side.

Figure 8:
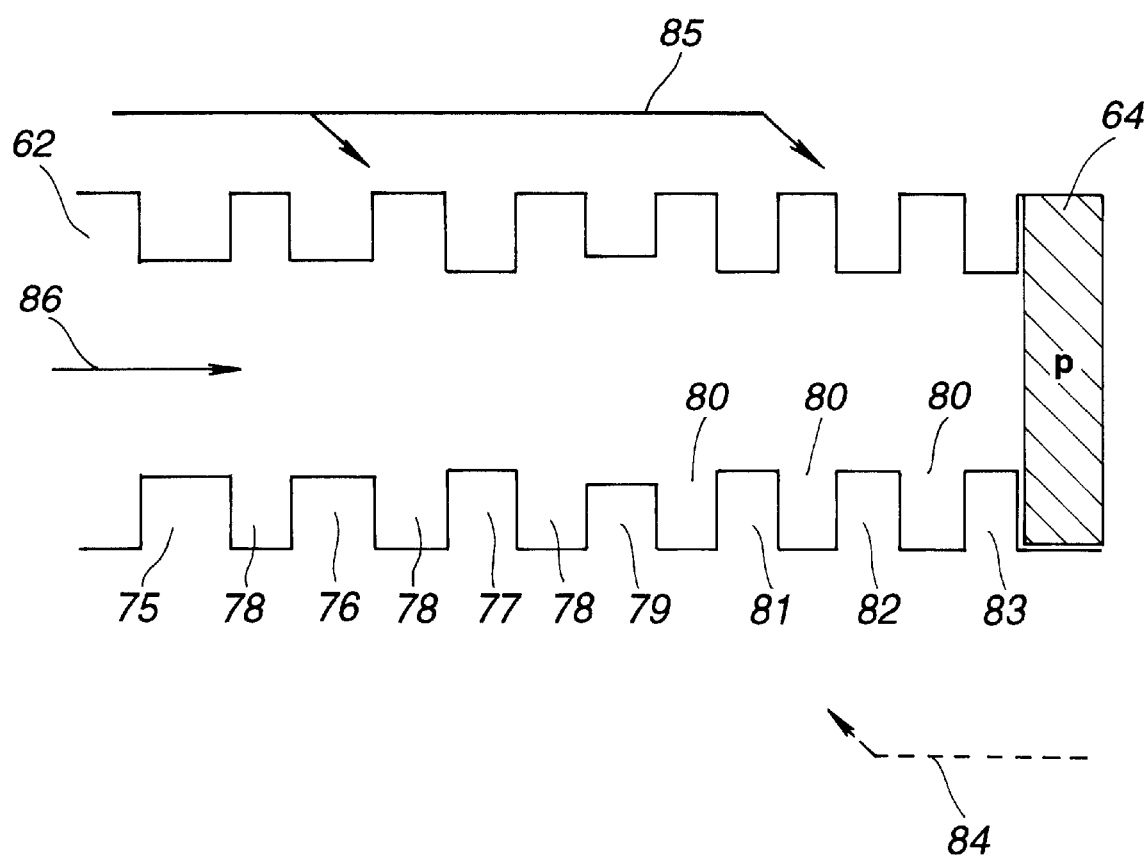
FIG. 8 illustrates the band gap structure of layers around an active layer used in the third embodiment.

In FIG. 8, reference numeral 86 designates a direction of layering, and reference numeral 62 designates the lower light guide layer. The layer 62 is composed of Si-doped InGaAsP, its carrier concentration is $1 \times 10^{17} cm^{-3}$, and its thickness is 0.2 μm. On the lower light guide layer 62, the following layers are formed in the following order. A well layer 75 of undoped InGaAs is initially grown with a thickness of 120 Å. A tensile strain of 1.0% is introduced into the well 75. Then, a barrier layer 78 is grown. The barrier layer 78 is comprised of an undoped InGaAsP layer having a thickness of 100 Å, and a compressive strain of 0.3% is introduced into the barrier layer 78. On the barrier layer 78, a well layer 76 is laid down. The well layer 76 is composed of undoped InGaAs, its thickness is 100 Å and its tensile strain amount is 1.0%. Then, a barrier layer, whose composition is the same as that of the barrier layer 78, is formed. On this barrier layer, a non-strained well layer 77 of undoped InGaAs is formed with a thickness of 85 Å.

Reference numeral 78 denotes a barrier layer. Reference numeral 79 denotes a 1.0% tensile-strained well layer of undoped InGaAs, and its thickness is 80 Å. Reference numeral 80 designates a barrier layer of undoped InGaAsP having a thickness of 100 Å, and its band gap wavelength is set to 1.18 μm. Reference numeral 81 denotes a non-strained layer of undoped InGaAs having a thickness of 70 Å. Then, a barrier layer 80 is formed. Reference numeral 82 designates a non-strained layer of undoped InGaAs having a thickness of 60 Å. Reference numeral 80 designates a barrier layer of undoped InGaAsP having a thickness of 100 Å. Reference numeral 83 designates a non-strained layer of undoped InGaAs having a thickness of 50 Å. Reference numeral 84 designates the upper light guide layer of Be-doped InGaAsP having a thickness of 0.2 μm. Such is the structure of the active layer 63.

Well layers having relatively narrow thicknesses are placed on the side of holes 84 with a short diffusion distance (i.e., the side of the p-type light guide layer 64), and the thickness of the well layer increases as its location approaches the n-side to which electrons 85 are supplied. As a result, the non-strained well layer for generating the TE-mode gain is interposed between the tensile-strained well layers 76 and 79 for primarily generating the TM-mode gain. The reason for placing a narrower well layer nearer the side of the conduction type of the carriers 84 with a short diffusion length is described above. This reason will be further described. The gain of a well layer tends to be readily saturated as its thickness decreases. If carriers are supplied to a well layer with a wide thickness, which is hard to saturate, preferentially to narrow well layers, the gain of the wide well layer increases and it is impposible that the gain of the narrow well layer catch up with the gain of the narrow well layer. In order to make the gain approximately uniform over a wide wavelength range, it is necessary to obtain the gain of the narrow well layer preferentially. Therefore, a narrower well layer needs to be placed closer to the side of the conduction type of carriers having a shorter diffusion length. In the above-discussed active layer 63, there are arranged three tensile-strained well layers for primarily generating the gain for the TM mode and four non-strained well layers for generating the gain for the TE mode. Also in this embodiment, the number of well layers in the active layer is not limited to the above example. However, there are physical limitations, such as critical layer thickness and the like. This is the same in the other embodiments.

Figure 9:
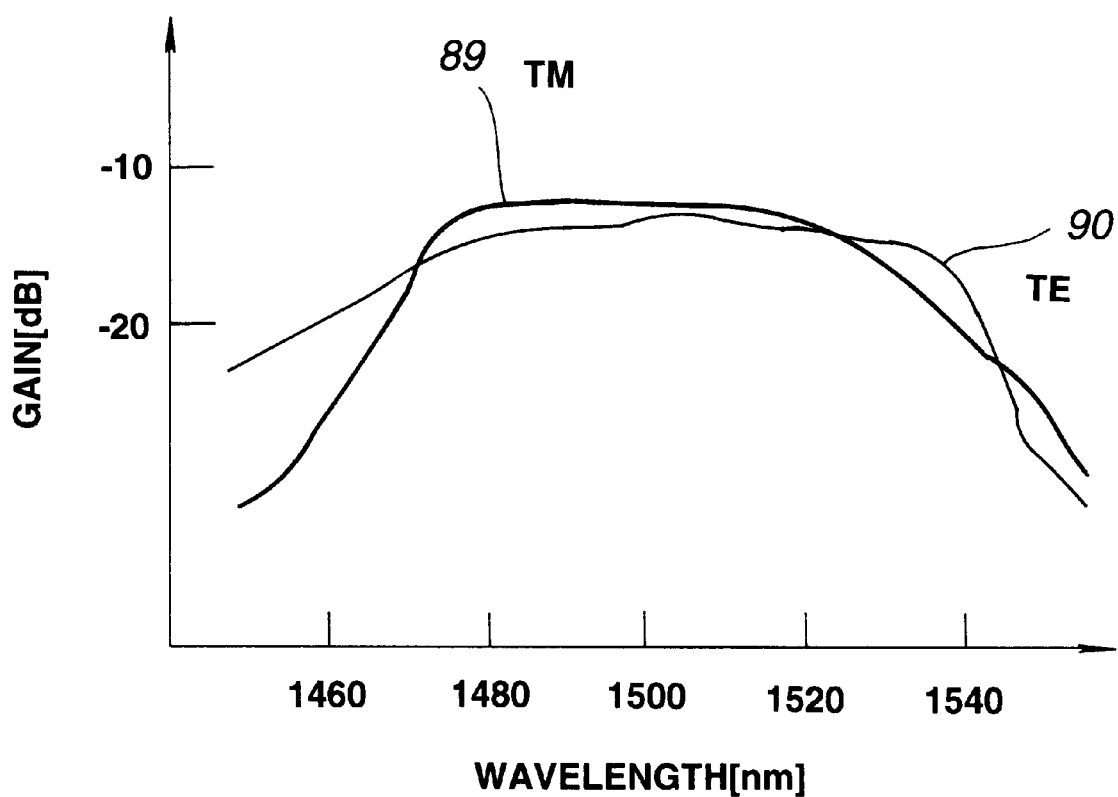
FIG. 9 is a view illustrating gain spectra for the TE mode and the TM mode in the third embodiment.

FIG. 9 illustrates the gain distribution or profile of the laser using the above-discussed well layers. Its ordinate indicates the gain while its abscissa indicates the wavelength. Since four non-strained well layer are arranged and their well thicknesses are varied from 50 Å to 85 Å, a wavelength range of the TE-mode gain indicated by reference numeral 90 extends to a longer wavelength side and is expanded up to 1550 nm. With respect to the TM-mode gain indicated by reference numeral 89, a wavelength range of about 50 nm is obtained. As described above, the feature of the active layer 63 is that a gain difference between the TE mode and the TM mode can be maintained approximately at a constant value even if the amount of injected current is changed.

If a sufficiently uniform gain can not be attained even by that structure, an additional well layer, which can provide a gain for a wavelength range with an insufficient gain, only needs to be formed. Also in this case, it is desirable that a well layer with a narrower thickness is positioned nearer the p-side and its thickness increases as the location of the well layer approaches the n-side in the entire active layer.

A method for driving the above-discussed third embodiment will be described with reference to FIGS. 3A through 3C, which are used in the description of the first embodiment, and FIGS. 7A and 7B. In the third embodiment, conditions for attaining respective portions of FIGS. 3A through 3C are different from those of the first embodiment. FIG. 3A shows oscillation spectra at the time the same current density is supplied to each of the electrodes 70 and 71. The regions with those electrodes 70 and 71 respectively have different stripe widths as illustrated in FIG. 7B. A gain spectrum of the region with a narrower stripe width D2 and the electrode 71 is indicated by reference numeral 91. In this spectrum 91, reference numeral 93 denotes a stop band for the TM mode and reference numeral 94 denotes a stop band for the TE mode. A wavelength difference between those two stop bands is about several nanometers.

On the other hand, reference numeral 92 designates a gain spectrum of the region with a wider stripe width D1 and the electrode 70 at the time current is supplied to the region with a wider stripe width D1 and the electrode 70. In this spectrum 92, reference numeral 95 denotes a stop band for the TM mode and reference numeral 96 denotes a stop band for the TE mode. A wavelength difference between those two stop bands 95 and 96 of the region with a wider stripe width D1 is larger than that of the gain spectrum 91. As the stripe width increases, ooze of light into the clad layer decreases and its refractive index increases (i.e., since a lot of light exists at a portion of the active layer 63 with a large refractive index, the refractive index sensed by the light effectively increases). Hence, wavelengths at respective portions of the oscillation spectrum for each mode are longer in the region with a wider stripe width D1 than in the with a narrower stripe width D2, and the wavelength difference between the stop bands increases.

A switching operation will be described. In the laser structure illustrated in FIG. 7B, the current injected into the region with a wider stripe width D1 is initially increased. Then, as illustrated by reference numeral 97 in FIG. 3B, the spectrum 92 in this region shifts to a shorter wavelength side (a left-hand side in the figure). Thus, the stop band 95 of the TM mode comes to be coincident with the stop band 93 of the spectrum 91 for the TM mode in the region with a narrower width D2, as indicated by reference numeral 98. As a result, the gain of the TM mode in the entire cavity increases, and laser oscillation occurs in the TM mode. At this time, a sufficient current is injected through the electrode 69 such that when the stop bands of each mode come to be coincident with each other in the regions with the electrodes 70 and 71, oscillation can occur in this mode.

An oscillation in the TE mode will be described. The stop bands 94 and 96 of the TE mode are brought into a coincidence state by further increasing the current injected through the electrode 70 or decreasing the current injected through the electrode 71. As the current through the electrode 70 is further increased, the spectrum 92 in the region with the electrode 70 is further shifted toward a shorter wavelength side, as indicated by reference numeral 100 in FIG. 3C. As a result, the stop band 96 of the spectrum 92 for the TE mode is brought into the coincidence condition with the stop band 94 of the spectrum 91 for the TE mode, and hence the TE-mode gain in the entire cavity increases to cause the laser oscillation in the TE mode.

Another method can be used as a method for making the stop bands for the TE mode coincident with each other. In this method, the spectrum 91 is shifted to a longer wavelength side by decreasing the current injected through the electrode 71, as indicated by reference numeral 99 in FIG. 3C, to overlap the stop bands 94 and 96 of the TE mode each other. The amount of the current to be used for performing the switching between the TE mode and the TM mode is less than several milliamperes.

This embodiment can be built if propagation constants can be made different between the respective regions and refractive indices of those regions can be changed by the current. As a method for varying the propagation constants of the regions from each other, there are the following methods, for example, other than the above-discussed method of differentiating the stripe widths: a method of differentiating thicknesses of areas with the active layers, over which light spreads, in the respective regions from each other; and a method of differentiating compositions of areas with the active layers, over which light spreads, in the respective regions from each other.

In the above-discussed structure, as a structure for oppressing occurrence of the stop band, the low-reflection coat 72 provided on one end facet is used, but a $\lambda/4$ shift section in the diffraction grating can be used to attain a single longitudinal mode.

In the structure of this embodiment, a gain difference between the TE mode and the TM mode is very small in the active layer and gains for the both modes balance and are stable over a wide wavelength range, so that the laser switching between the TE mode and the TM mode can be more stably performed.

Fourth Embodiment

Figure 10:
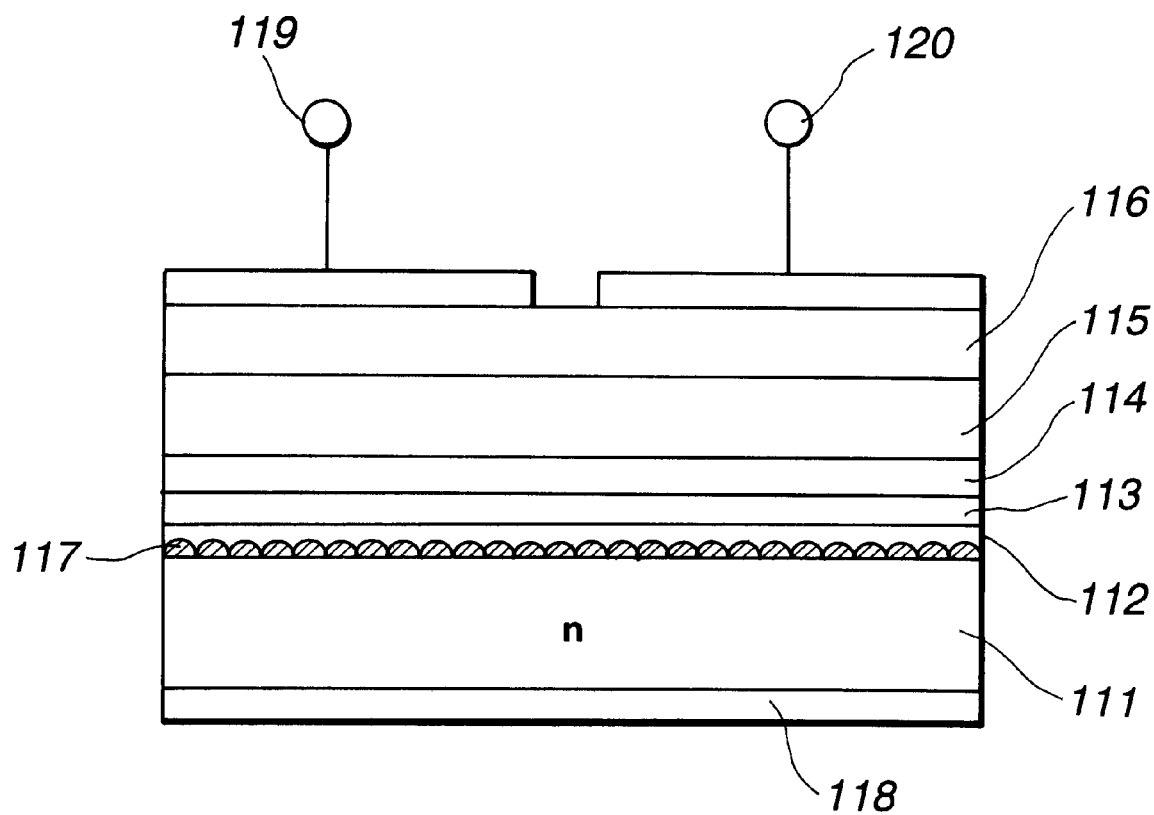
FIG. 10 illustrates a cross-section in a cavity direction of an optical semiconductor device of a fourth embodiment or the like of the present invention.

A fourth embodiment will be described with reference to FIGS. 10 and 11. In FIG. 10 showing the entire structure of the fourth embodiment, reference numeral 111 denotes an n-InP substrate, and a diffraction grating 117 with a depth of 300 Å is formed on the substrate 111. On the diffraction grating 117, a Si-doped InGaAsP light guide layer 112 is deposited with a thickness of 0.2 $\mu$m. Thereon, an active region 113 is formed, and then a light guide layer 114 is deposited. Its composition is Be-doped InGaAsP, its band gap wavelength is set to 1.15 $\mu$m and its thickness is 0.2 $\mu$m. Then, an upper clad layer 115 is formed. The upper clad layer 115 is comprised of a Be-doped InP layer of a thickness of 1.5 $\mu$m. Thereon, a contact layer 116 of Be-doped InGaAs having a thickness of 0.4 $\mu$m is laid down, and thus the growth process is completed.

Further, in FIG. 10, reference numeral 118 designates an n-side electrode of AuGe/Au, and reference numerals 119 and 120 designate p-side electrodes. Thus, a multi-electrode laser is built.

The layer structure of the active region 113 will be described with reference to FIG. 11. The feature of the fourth embodiment is that the active layer is doped with p-type impurities and that as the thickness of the well layer is narrower, the well layer is placed closer to the n-side. In FIG. 11, an arrow 132 indicates a direction of layering. Reference numeral 112 designates the Si-doped light guide region. The structure of the active layer 113 is divided into a tensile-strained region 134 and a compressively-strained region 133.

Figure 13:
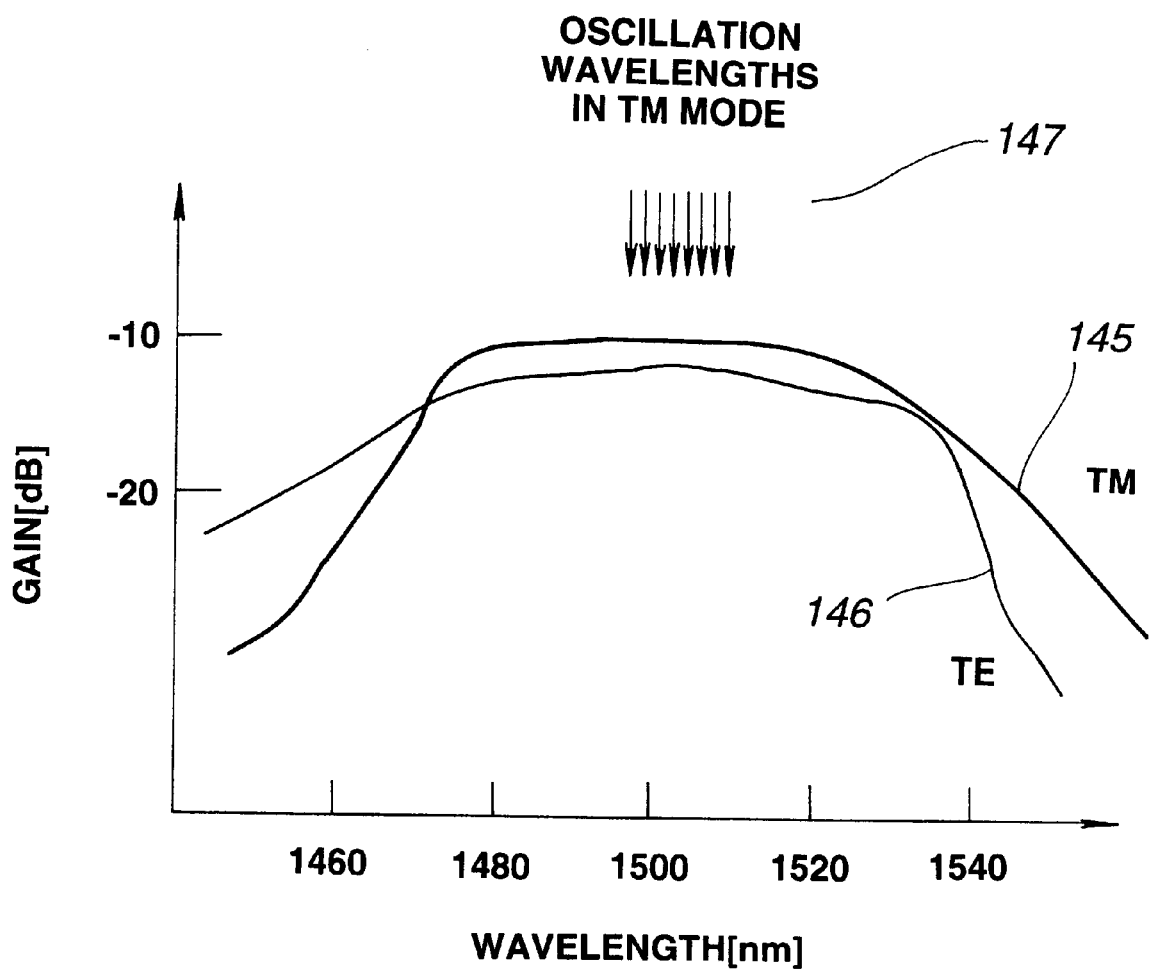
FIG. 13 is a view illustrating gain spectra for the TE mode and the TM mode in the fourth embodiment and oscillation wavelengths in the TM mode of the laser array.

The structure of the compressively-strained region 133 will be described. On the light guide layer 112, a well layer 121 of undoped InGaAsP is initially grown with a thickness of 50 Å. A compressive strain of 0.8% is introduced into the well 121. Then, a barrier layer 122 is grown. The barrier layer 122 is comprised of Be-doped InGaAs, and no strain is introduced into the layer 122. On the barrier layer 122, a well layer 123 is laid down. The well layer 123 is composed of undoped InGaAsP, its thickness is 60 Å and its compressive strain amount is 0.8%. Then, a barrier layer, whose composition is the same as that of the barrier layer 122 and into which no strain is introduced, is formed. On this barrier layer, a well layer 124 of undoped InGaAsP is formed with a thickness of 70 Å and a compressive strain amount of 0.8%. Then, a barrier layer 125 for separating the compressively-strained active region 133 from the tensile-strained active region 134 is formed on the well layer 124. Its composition is Be-doped InGaAsP and its thickness is 200 Å. The compressively-strained active region 133 has such a construction. As indicated by a line 146 in FIG. 13, the gain of the TE mode can have an approxilately uniform magnitude over a range from 1480 nm to 1540 nm (i.e., a wide band width of about 60 nm) due to the presence of the compressively-strained active region 133.

The structure of the tensile-strained region 134 will be described. On the barrier layer 125, a well layer 126 of undoped InGaAs is initially grown with a thickness of 80 Å. A tensile strain of 1.0% is introduced into the well layer 126. Then, a barrier layer 127 is grown. The layer 127 is comprised of a Be-doped InGaAsP having a thickness of 100 Å, and a compressive strain of 0.2% is introduced into the layer 127. On the barrier layer 127, a well layer 128 is laid down. The well layer 128 is composed of undoped InGaAs, its thickness is 100 Å and its tensile strain amount is 1.0%. Then, a barrier layer, whose composition is the same as that of the barrier layer 127 and whose thickness is 100 Å, is formed. On this barrier layer, a well layer 129 of undoped InGaAs is formed with a thickness of 120 Å and a tensile strain amount of 1.0%. Such is the structure of the tensile-strained region 134. Since thicknesses of the well layers 126, 128 and 129 are varied as 80 Å, 100 Å and 120 Å, quantum levels of those well layers differ from each other and their band gaps corresponding to inter-quantum-level transition energies become different from each other. Thus, oscillation wavelengths of those well layers 126, 128 and 129 diverge from each other. Hence, wavelength ranges of gains due to those well layers 126, 128 and 129 (primarily for the TM mode) overlap appropriately, and it is possible to obtain approximately uniform gains over a wide wavelength range. As indicated by reference numeral 145 in FIG. 13, due to those well layers 126, 128 and 129, the gain for the TM mode can be approximately uniform over a range from 1470 nm to 1540 nm.

Figure 11:
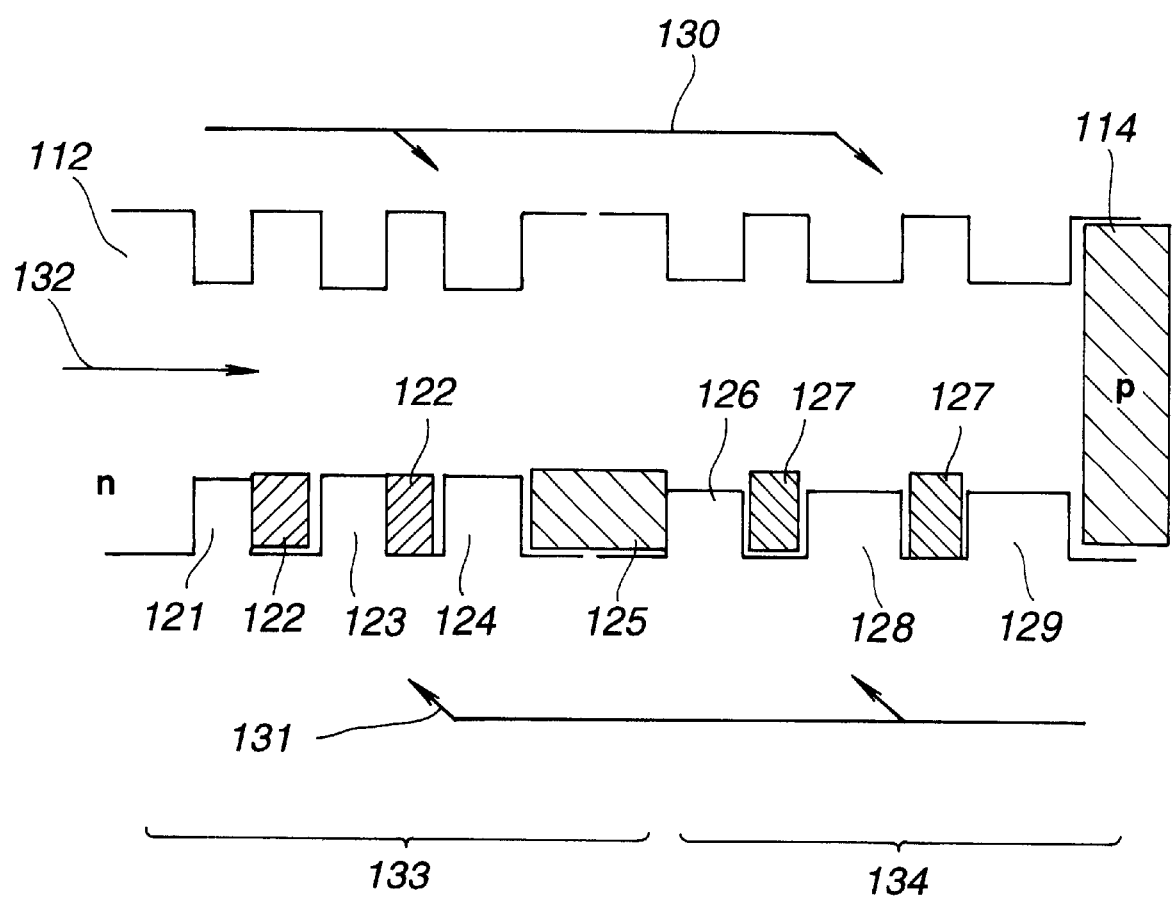
FIG. 11 illustrates the band gap structure of layers around an active layer used in the fourth embodiment.

In FIG. 11, the reason for the p-type doping of the barrier layers in the active layer 113 is to lower the threshold current density. Further, due to the p-type doping, uniformity of the gains in the active layer is promoted by using electrons 130, which are easier to diffuse, as control carriers. As a result, it is possible to achieve the oscillation and the switching in a low-current range due to the readily-diffusible electrons.

The reason for placing a narrower well layer nearer the side of the n-conduction type in the compressively-strained region 133 in FIG. 11 is described above. Namely, uniformity of the gains in a wide wavelength range is promoted by preferentially supplying minority carriers to the well layer with a narrow thickness (the minority carriers in this case are the electrons 130 but not holes 131 since the p-type active layer is used). Further, in this emodiment, though only the barrier layers are doped with p-type impurities, the well layers may also be p-doped. Furthermore, it is possible to dope only the compressively-strained region 133 while not Be-doping the tensile-strained region 134. Hence, the rise of the TE-mode gain can be improved and the switching in a low-current range is assured.

The operation of the fourth embodiment of FIG. 10 is the same as that of the first embodiment. Further, although the grating 117 is formed under the active layer 113 in this embodiment, the grating may be formed above the active layer. This is also true in the other embodiments.

As described in the foregoing, in order to widen the gain-constant ranges in the tensile-strained and compressively-strained regions, thicknesses of the well layers are varied and the p-doped active layer is used in the fourth embodiment. Thus, the range, over which the TE-mode and TM-mode gains are approximately constant, can be freely set, and an optical semiconductor device, such as a semiconductor laser with approximately constant gains in a wide range, can be achieved.

Figure 12:
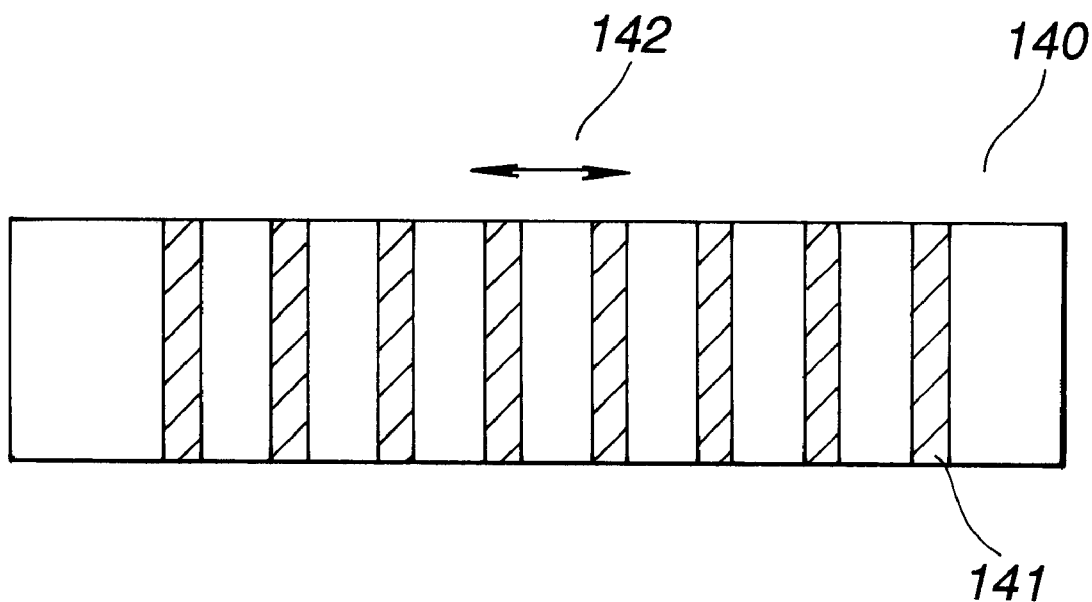
FIG. 12 is a plan view of an array laser to which the fourth embodiment or the like of the present invention is applied.

FIG. 12 shows an example in which the above-discussed active layer is used as a common active layer in an array laser 140. In FIG. 12, reference numeral 141 denotes a stripe of each laser, and an interval 142 of the array laser with plural lasers arranged in a lateral direction of FIG. 12 is set to 600 μm. Here, grating pitches of the respective lasers are made different from each other, and an interval between oscillation wavelengths of the respective lasers is set to 1 nm. The array laser 140 is constructed such that eight different oscillation wavelengths can be emitted therefrom as illustrated by reference numeral 147 in FIG. 13. One of the most useful applications of the present invention is such an array laser. Since a wavelength range, over which the TE-mode and TM-mode gains are approximately uniform and balance, can be expanded, it is possible to readily fabricate a multi-wavelength array laser using a common active layer by a small number of process steps. The other embodiments can also be applied to such an array laser.

As a method of varying the oscillation wavelength, there are the following methods, other than the method of varying the grating pitch of each laser: a method of varying the waveguide width of each laser to vary the propagation constant; a method of varying the thickness of the active layer or the like of each laser to vary the propagation constant; and a method of varying the composition of the layer near the active layer of each laser to vary the propagation constant.

Fifth Embodiment

In the fifth embodiment, heights of barriers in an active layer are made different from each other to control supplied carriers and promote uniformity of the gain in a wide wavelength range. The barrier height is a difference between quantum levels of the barier layer and the well layer adjacent thereto on the carrier-supply side, and as the barrier height increases, it becomes harder for carriers to get over the barrier height.

Figure 14:
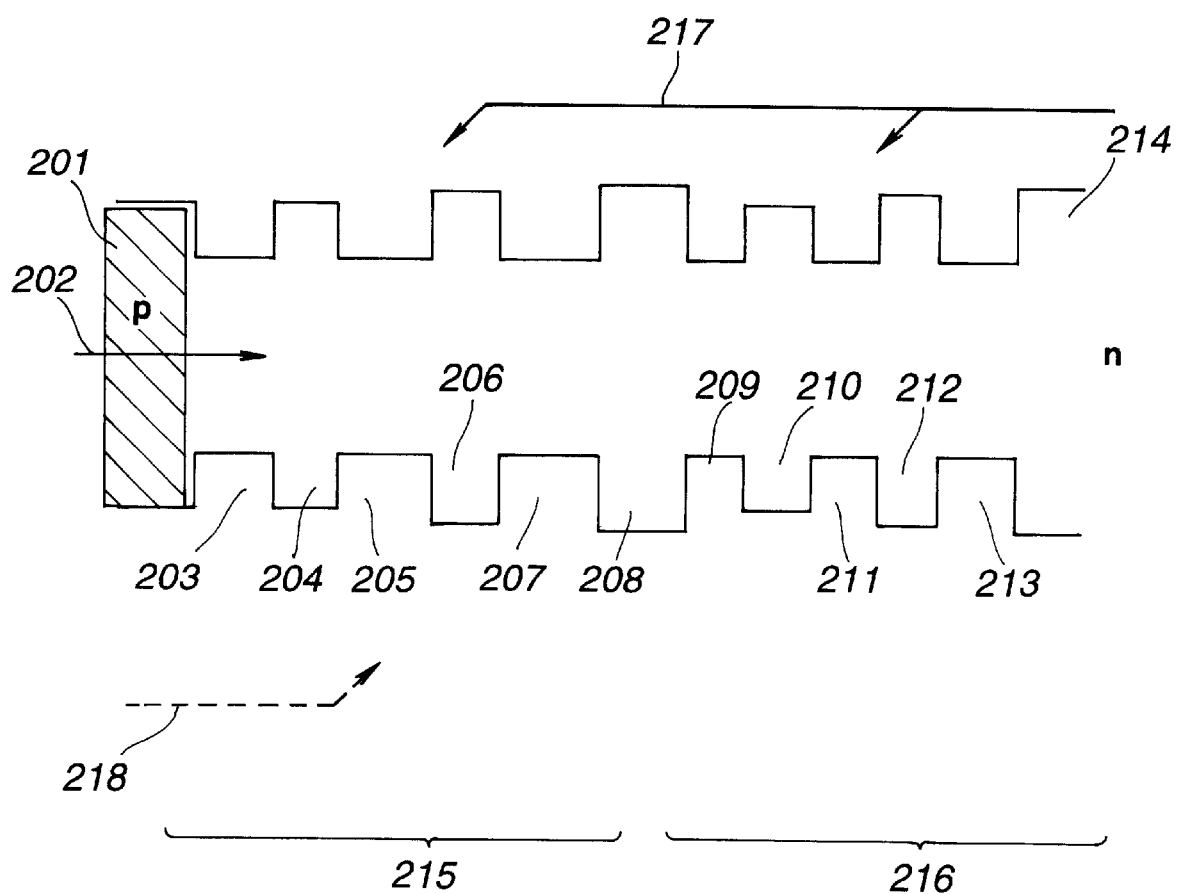
FIG. 14 illustrates the band gap structure of layers around an active layer used in a fifth embodiment.

The layer structure of the active region of this embodiment will be described with reference to FIG. 14. FIG. 14 shows the band gap structure of layers near the active layer. The structure of the other portion of this embodiment is the same as that of FIG. 4. In FIG. 14, reference numeral 202 designates a direction of layering, and reference numeral 201 designates a Be-doped light guide layer region which corresponds to the light guide layer region 32 in FIG. 4. The active layer is divided into a tensile-strained active region 215 and a compressively-strained active region 216.

The structure of the tensile-strained active region 215 will be described. On the light guide layer 201, the following layers are formed in the following order. A well layer 203 of undoped InGaAs is initially grown with a thickness of 80 Å. A tensile strain of 0.8% is introduced into the well 203.

Then, a barrier layer 204 is grown. The barrier layer 204 is comprised of an undoped InGaAsP layer with a thickness of 100 Å and a band gap wavelength set to 1.20 µm, and a compressive strain of 0.2% is introduced into the barrier layer 204. On the barrier layer 204, a well layer 205 is laid down. The well layer 205 is composed of undoped InGaAs, its thickness is 100 Å and its tensile strain amount is 0.8%. Then, a barrier layer 206, whose composition is set such that its band gap wavelength is 1.15 µm (its band gap is wider than that of the barrier layer 204), is formed with a thickness of 100 Å. On this barrier layer, a 0.8% tensile-strained well layer 207 of undoped InGaAs is formed with a thickness of 120 Å. Such is the structure of the tensile-strained region 215. The band gaps or the barrier heights of the barrier layers 204 and 206 are made lower nearer the p-side whose carriers are harder to supply. Thus, carriers 218 can be uniformly supplied to the active layer more effectively. As a result, wavelength ranges of gains due to the well layers 203, 205 and 207 appropriately overlap, so that it is possible to obtain a wide wavelength range over which gains are approximately uniform.

Then, the structure of a compressively-strained active region 216 for generating the gain for the TE mode will be described. Initially, a barrier layer 208 for separating the tensile-strained active region 215 from the compressively-strained active region 216 is formed on the tensile-strained well layer 207. Its composition is undoped InGaAsP, its thickness is 150 Å and its band gap wavelength is set to 1.15 µm. On the barrier layer 208, a 0.4% compressively-strained undoped InGaAs well layer 209 is formed with a thickness of 40 Å. An undoped InGaAsP barrier layer 210 is then laid down over the layer 209. No strain is introduced into the barrier layer 210 and its band gap wavelength is set to 1.2 µm. On the barrier layer 210, a 0.4% compressively-strained undoped InGaAs well layer 211 is formed with a thickness of 50 Å. An undoped InGaAsP barrier layer 212 laid down over the well layer 211 is non-strained and its band gap wavelength is set to 1.15 µm.

Further, a 0.4% compressively-strained undoped InGaAs well layer 213 is formed with a thickness of 60 Å. On the well layer 213, an upper light guide layer 214 of undoped InGaAsP is formed with a thickness of 0.2 µm. Its band gap wavelength is set to 1.15 µm. Such is the structure of the compressively-strained active region 216.

As described above, the barrier height in the active layer is controlled such that the barrier height nearer the side of carriers harder to supply, in this case the holes 218, is made smaller. Thus, the holes 218 are easier to get over the barrier and can be uniformly spread over the active layer. In this embodiment, though the barrier height is controlled separately and independently between the tensile-strained region 215 and the compressively-strained region 216, the barrier height can be continuously varied from the p-side to the n-side, for example.

Further, in this embodiment, the holes 218 are carriers harder to move. However, as described in the fourth embodiment, it is possible to cause electrons 217 to function as control carriers by p-doping the barrier or the well layer. In this case, as the barrier becomes closer to the n-side, its height is made lower such that the electrons 217 can be made easier to supply to each well layer.

Sixth Embodiment

In the fifth embodiment, heights of barriers in the active layer are varied from each other to improve the supply of carriers which are hard to move. In a sixth embodiment, thicknesses of barriers in an active layer are varied to control supplied carriers and even the gain at each wavelength. The structure of the active layer will be described with reference to FIG. 15.

Figure 15:
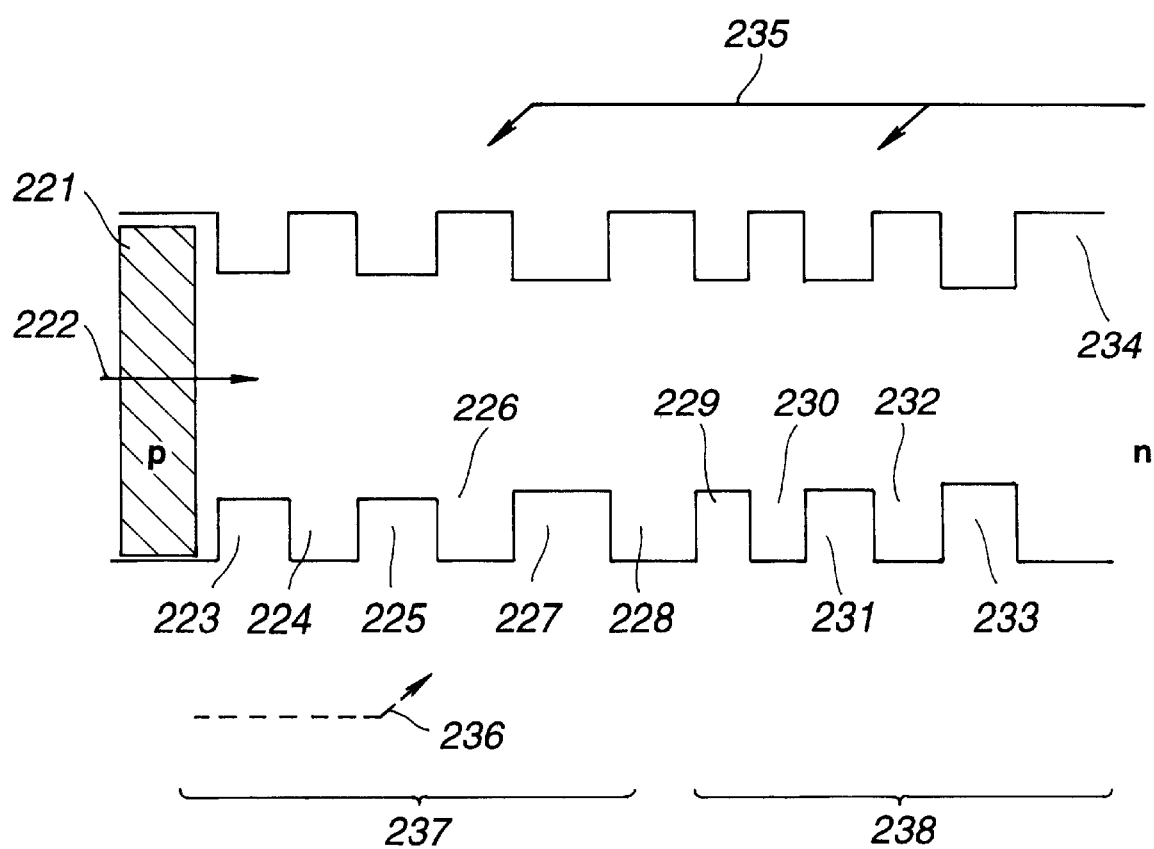
FIG. 15 illustrates the band gap structure of layers around an active layer used in sixth embodiment.

In FIG. 15, reference numeral 222 designates a direction of layering, and reference numeral 221 designates a Be-doped light guide layer region which corresponds to the light guide layer region 32 in FIG. 4. The active layer is divided into a tensile-strained active region 237 and a compressively-strained active region 238.

The structure of the tensile-strained active region 237 will be initially described. On the light guide layer 221, the following layers are formed in the following order. A well layer 223 of undoped InGaAs is initially grown with a thickness of 80 Å. A tensile strain of 1.1% is introduced into the well 223. Then, a barrier layer 224 is grown. The layer 224 is comprised of an undoped InGaAsP layer having a thickness of 60 Å, and a compressive strain of 0.2% is introduced into the layer 224. On the barrier layer 224, a well layer 225 is laid down. The well layer 225 is composed of undoped InGaAs, its thickness is 100 Å and its tensile strain amount is 1.1%. Then, a barrier layer 226 having the same composition as that of the layer 224 is formed with a thickness of 80 Å. On this barrier layer, a 1.1% tensile-strained well layer 227 of undoped InGaAs is formed with a thickness of 120 Å. Such is the structure of the tensile-strained region 237. The band gaps of the well layers 223, 225 and 227 are varied from each other by varying thicknesses thereof, and their oscillation wavelengths are varied from each other. As a result, wavelength ranges of gains due to the well layers 223, 225 and 227 appropriately overlap, so that it is possible to obtain a wide wavelength range over which gains are approximately uniform. Additionally, in the sixth embodiment, thicknesses or widths of the barriers 224 and 226 are varied to improve the supply of carriers which are hard to move.

The reason for placing a narrower barrier layer nearer the p-side in the tensile-strained region 237 is as follows, as described in the first embodiment. Since the diffusion distance of p-type hole carriers 236 is relatively short, compared with that of n-type electrons 235, the n-type electrons are supplied to the entire active layer as indicated by reference numeral 235 in FIG. 15, and hence well layers nearer to the p-side more are easier to generate the gain at an initial stage. As a result, the well layer becomes harder to obtain the gain if the well layer is placed away from the p-type layer. Therefore, the thickness of the barrier layer at the p-side is made thin in order to compensate for an insufficient supply of hole carriers to the well layer placed relatively away from the p-side layer. Thus, gains of the respective well layers 223, 225 and 227 in the tensile-strained region 237 can be regulated, and gains can be made approximately even over a wide wavelength range.

Then, the structure of the compressively-strained active region 238 for generating the gain for the TE mode will be described. Initially, a barrier layer 228 for separating the tensile-strained active region 237 from the compressively-strained active region 238 is formed on the tensile-strained well layer 227. Its composition is undoped InGaAsP and its thickness is 100 Å. On the barrier layer 228, a 0.8% compressively-strained undoped InGaAsP layer 229 is formed with a thickness of 50 Å. An undoped InGaAsP barrier layer 230 is then laid down over the layer 229. No strain is introduced into the barrier layer 230, and its thickness is 60 Å. On the barrier layer 230, a 0.8% compressively-strained undoped InGaAsP well layer 231 is formed with a thickness of 60 Å. An undoped InGaAsP barrier layer 232 laid down over the well layer 231 has the same composition as that of the barrier layer 230, and its thickness is 80 Å.

Further, a 0.8% compressively-strained undoped InGaAsP layer 233 is formed with a thickness of 70 Å. On the layer 233, an upper light guide layer 234 of undoped InGaAsP is formed with a thickness of 0.2 μm. Such is the structure of the compressively-strained region 236.

As described above, the barrier thickness in the active layer near the side of carriers harder to supply, in this case the holes 236, is made thinner. Thus, the holes can more easily get over the barrier and can be uniformly spread over the active layer. In this embodiment, though the barrier thickness is controlled separately and independently between the tensile-strained region 237 and the compressively-strained region 238, the barrier thickness can be continuously varied from the p-side to the n-side, for example.

Further, in this embodiment, the holes are carriers harder to move. However, as described in the fourth embodiment, it is possible to cause the electrons to function as control carriers by p-doping the barrier or the well layer. In this case, as the barrier is close to the n-side, its thickness is made thinner such that the electrons can be more easily supplied to each well layer.

In the above embodiments, the device is described as a polarization selective laser, but a device of the present invention can also be used as an optical amplifier with a small polarization dependency. In this case, light is input into an optical semiconductor device of this invention which is stimulated to a state a little below its threshold. Not only a DFB laser but a DBR laser can be used as such an amplifier. This also holds true in embodiments to be described later.

Seventh Embodiment

A cross section of the entire structure of a polarization selective laser of a seventh embodiment in its cavity direction is the same as that illustrated in FIG. 1A. In the seventh embodiment, band gaps of well layers are varied by varying amounts of strain of those well layers, and thus a wavelength range, over which gains are approximately uniform, is widened.

Figure 16:
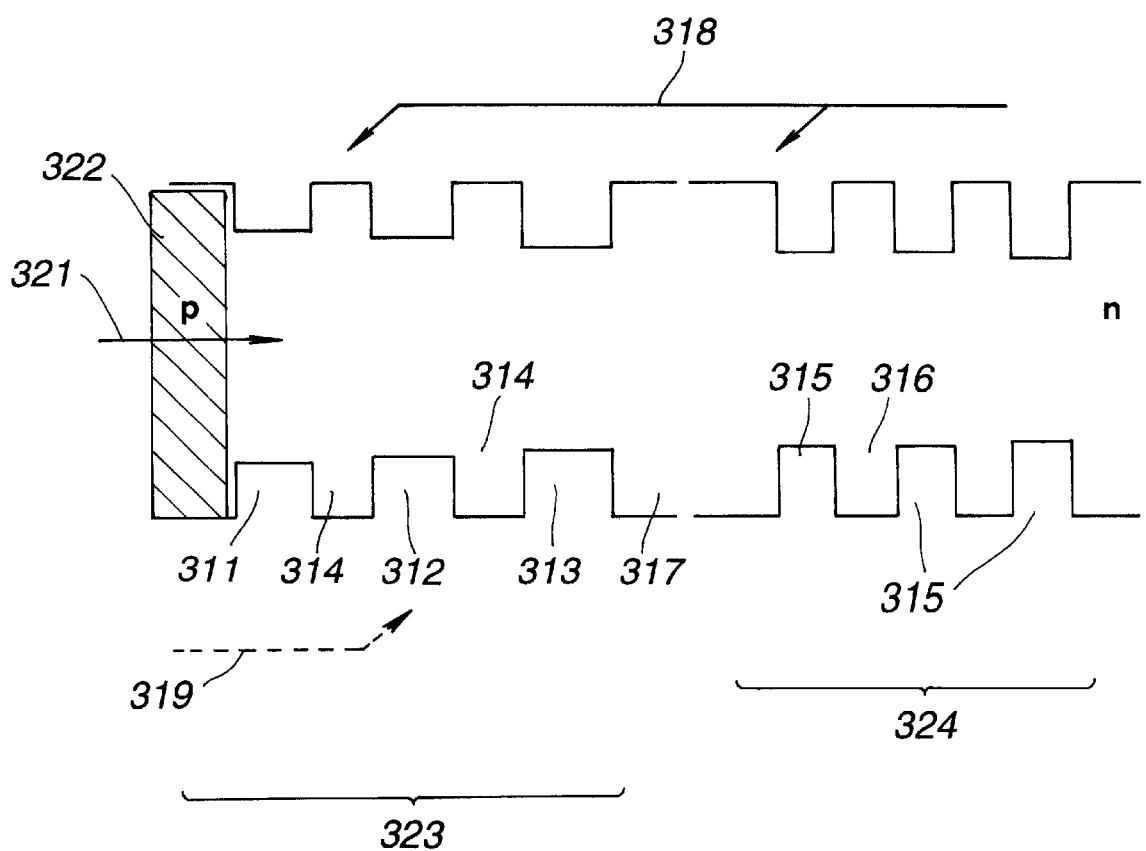
FIG. 16 illustrates the band gap structure of layers around an active layer used in a seventh embodiment.

The layer structure of an active region will be described with reference to FIG. 16 that illustrates its band gap structure. In FIG. 16, an arrow 321 indicates a direction of layering. Reference numeral 322 designates a Be-doped light guide region, and this region corresponds to the light guide layer 2 in FIG. 1A. The structure of the active layer 3 is divided into a tensile-strained region 323 and a non-strained region 324. The structure of the tensile-strained region 323 will be described. On the light guide layer 322, a well layer 311 of undoped InGaAs is initially grown with a thickness of 120 Å. A tensile strain of 1.2% is introduced into the well 311. Then, a barrier layer 314 is grown. The layer 314 is comprised of an undoped InGaAsP having a thickness of 100 Å, and a compressive strain of 0.2% is introduced into the layer 314. The compressive strain opposite to the tensile strain is introduced into the barrier layer 314 to improve the crystal quality of the well layer and the like due to the strain compensation effect.

On the barrier layer 314, a well layer 312 is laid down. The well layer 312 is composed of undoped InGaAs, its thickness is 120 Å and its tensile strain amount is 0.9%. Then, a barrier layer, whose composition is the same as that of the barrier layer 314 and whose thickness is 100 Å, is formed. On this barrier layer 314, a well layer 313 of undoped InGaAs is formed with a thickness of 120 Å and a tensile strain amount of 0.6%. Such is the structure of the tensile-strained region 323. Since the amounts of the tensile strain of the well layers 311, 312 and 313 are varied as 1.2%, 0.9% and 0.6%, quantum levels of those well layers are varied from each other and their band gaps corresponding to inter-quantum-level transition energies are different from each other. Thus, oscillation wavelengths of those well layers 311, 312 and 313 diverge from each other. Hence, wavelength ranges of gains due to those well layers 311, 312 and 313 are preferably and continuously overlapped each other, and it is possible to obtain the gain (primarily the TM mode though the TE-mode gain can also be obtained) which has an enough magnitude and is approximately uniform over a wide wavelength range. In this case, the gain is primarily in the TM mode though a small amount of gain for the TE mode can also be obtained.

Figure 17:
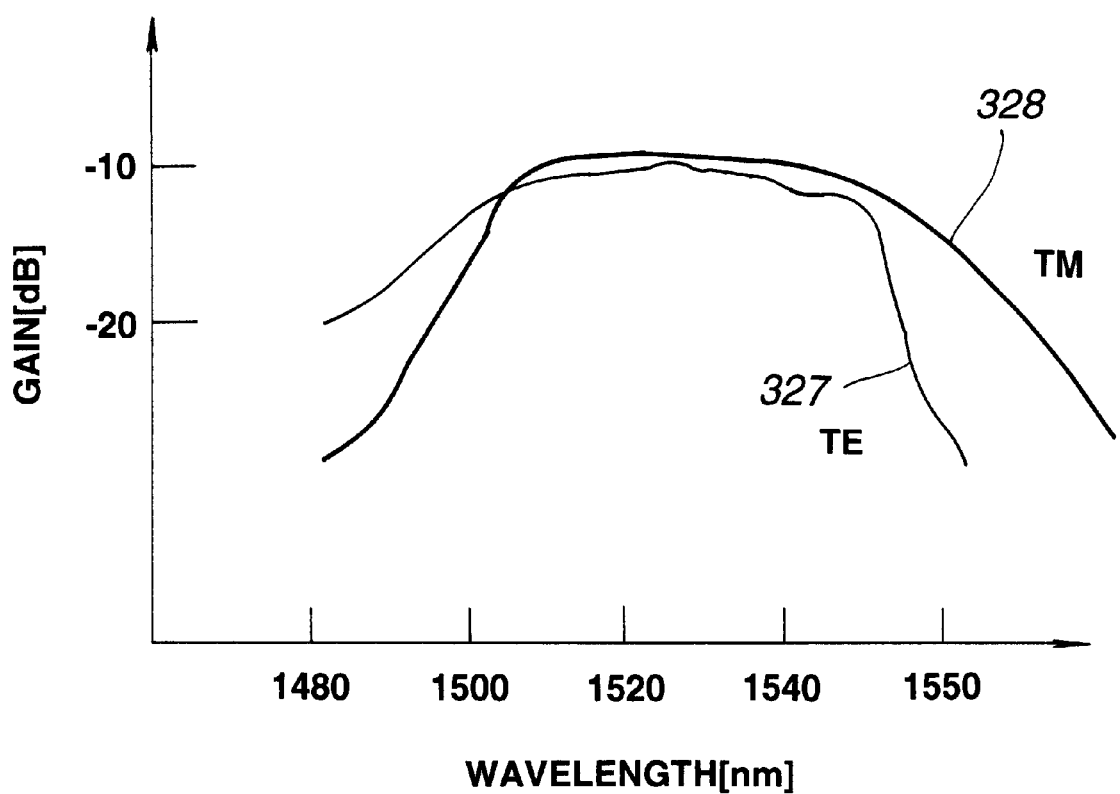
FIG. 17 is a view illustrating gain spectra for the TE mode and the TM mode the seventh embodiment.

FIG. 17 illustrates the gain distribution or profile. Its ordinate indicates the gain while its abscissa indicates the wavelength. As indicated by a line 328 in FIG. 17, the gain of the TM mode can have an approxilately uniform magnitude over a range from 1500 nm to 1550 nm due to the presence of the well layers 311, 312 and 313.

In the tensile-strained region 323 of FIG. 16, the reason a largely-strained well layer is placed near the p-type layer is substantially the same as the reason described in the first embodiment. The diffusion distance of p-type holes is relatively short compared with that of n-type electrons, and thus the diffusion length of holes 319 is short while n-type electrons 318 are supplied over the entire active layer as illustrated in FIG. 16. Thus, initially the well layer located near the p-side can acquire the gain more easily. On the other hand, the quantum level rises as the strain amount of the well layer increases, and hence a barrier difference between the well layer and its adjacent barrier layer decreases to lower the confinement of carriers therein. As a result, it is considered that the gain is harder to generate when the well layer with a greater strain (i.e., the well layer with a wider band gap) is formed away from the p-type layer. Therefore, the larger the strain amount of the well layer is, the closer the well layer is positioned to the p-side in order to compensate for the decrease in the comfinement of carriers.

Hence, as shown in FIG. 17, it is possible to regulate the gains of the well layers 311, 312 and 313 in the tensile-strained region 323, and a substantially uniform gain can be obtained over a wide wavelength range. If a sufficiently uniform gain can not be attained even by that structure, an additional well layer, which can provide a gain in a wavelength range with an insufficient gain, only needs to be formed. Also in this case, it is desirable that a well layer with a larger strain is positioned nearer the p-side in the tensile-strained region 323.

Here, the tensile-strained well layers 311, 312 and 313 generate not only the gain for the TM mode but also the gain for the TE mode, as already described. In a well layer with a tensile strain of 1.0%, a peak wavelength of the gain for the TE mode generated thereby is on a shorter wavelength side than that of the gain for the TM mode, and this difference is about 20 nm under a current-injected condition near its threshold.

Then, the structure of the non-strained active region for generating the gain for the TE mode will be described. Initially, a barrier layer 317 for separating the tensile-strained active region 323 from the non-strained active region 324 is formed on the tensile-strained well layer 313.

Its composition is undoped InGaAsP and its thickness is 150 Å. On the barrier layer 317, a non-strained undoped InGaAs layer 315 is formed with a thickness of 6 nm. An undoped InGaAsP barrier layer 316 having a thickness of 100 Å is then laid down over the layer 315. No strain is introduced into the barrier layer 316. Thus, three well layers of the same structure and two barrier layers of the same structure are deposited. The non-strained active region 324 has such a construction.

An oscillation wavelength range of the non-strained active region 324 has a center of 1500 nm, and a wavelength width of an approximately uniform gain is about 20 nm. In this embodiment, the gain for the TE mode consists of the gain generated by the non-strained active region 324 and the gain for the TE mode generated by the tensile-strained active region 323. Therefore, the total wavelength range of an approximately uniform gain for the TE mode is wider than the wavelength range of an approximately uniform gain for the TE mode generated by the non-strained well layer only, and extends from about 1500 nm to about 1550 nm (i.e., a band width of about 50 nm), as illustrated by reference numeral 327 in FIG. 17.

A method for driving the above-discussed seventh embodiment with the above construction is the same as that of the first embodiment.

As described in the foregoing, in the seventh embodiment, the strain amounts of the well layers in the tensile-strained active region are made different from each other to widen a wavelength range over which gains are approximately uniform and balance, and the well layer of a larger strain is placed nearer the p-side layer. Thus, a semiconductor optical device, such as a semiconductor laser whose gains are approximately uniform and balance over a wide wavelength range, can be established.

Well layers with various strain amounts are not limited to the tensile-strained wells. The non-strained well layers may have various strain amounts to improve the wavelength range of a uniform gain. Further, where the well layer of a larger strain is located nearer the p-side layer, there is an assumption that the well or barrier in the active layer, to which holes are hard to diffuse, is undoped or n-doped.

Eighth Embodiment

An eighth embodiment will be described with reference to FIG. 18. The entire structure of a cross section of the eighth embodiment in its cavity direction is the same as illustrated in FIG. 4.

The layer structure of the active region 33 will be described with reference to FIG. 18. The feature of the eighth embodiment is that strain amounts of well layers not only in a tensile-strained active region but in a compressively-strained active region are varied in order to expand a wavelength range of stable gains. In FIG. 18 illustrating the band gap structure, an arrow 352 indicates a direction of layering. Reference numeral 32 designates the Be-doped light guide region which corresponds to the light guide layer 32 in FIG. 4. The structure of the active layer 33 is divided into a tensile-strained region 353 and a compressively-strained region 354.

The structure of the tensile-strained region 353 will be described. On the light guide layer 32, a well layer 341 of undoped InGaAs is initially grown with a thickness of 130 Å. A tensile strain of 1.1% is introduced into the well 341. Then, a barrier layer 344 is grown. The layer 344 is comprised of an undoped InGaAsP layer having a thickness of 80 Å, and a compressive strain of 0.2% is introduced into the layer 344.

On the barrier layer 344, a well layer 342 is laid down. The well layer 342 is composed of undoped InGaAs, its thickness is 130 Å and its tensile strain amount is 0.9%. Then, a barrier layer, whose composition is the same as that of the barrier layer 344 and whose thickness is 80 Å, is formed. On this barrier layer, a well layer 343 of undoped InGaAs is formed with a thickness of 130 Å and a tensile strain amount of 0.7%. Such is the structure of the tensile-strained region 353. Since the strain amounts of the well layers 341, 342 and 343 are varied as above, quantum levels or band gaps of those well layers differ from each other and their oscillation wavelengths diverge from each other. Hence, gains due to those well layers 341, 342 and 343 are appropriately overlapped each other and compensate for each other, and it is possible to obtain a wide wavelength range over which gains are approximately constant and balance. By using those well layers, the gain for the TM mode can be approximately even over a wide wavelength range from 1500 nm to 1560 nm.

Figure 18:
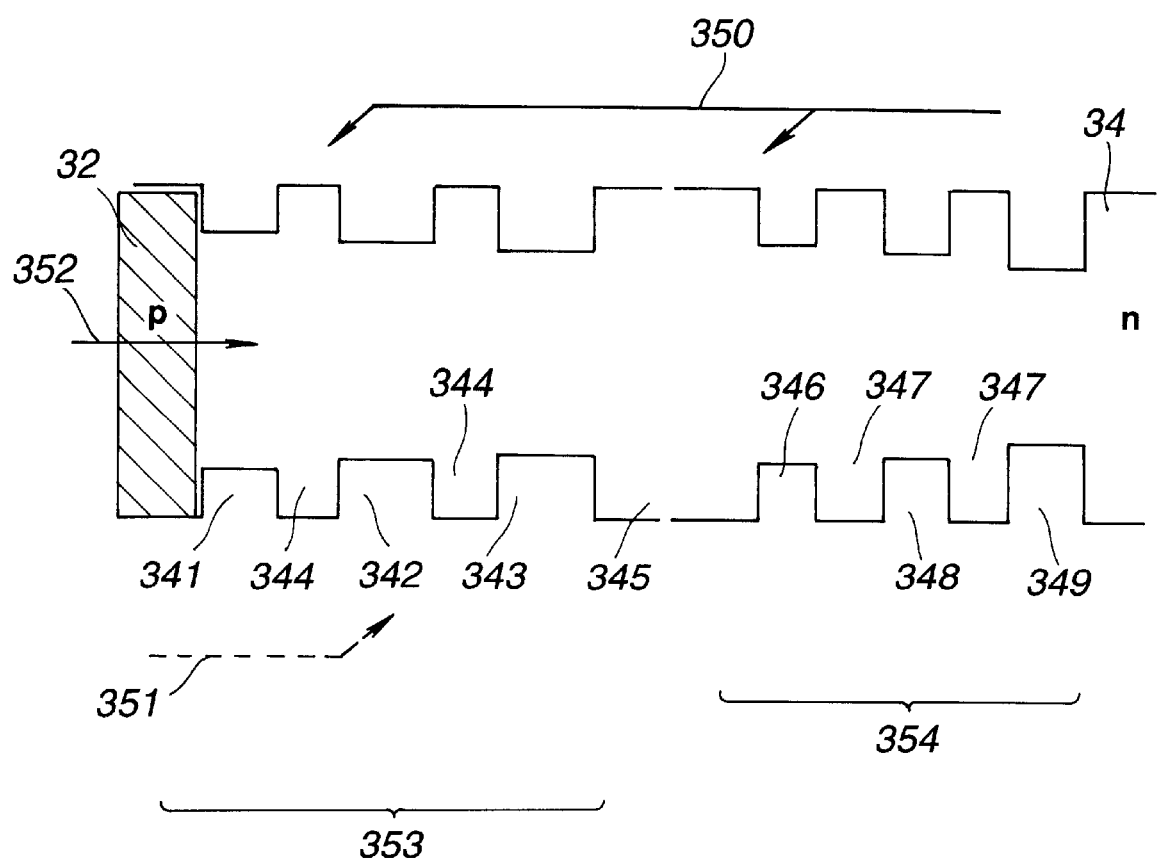
FIG. 18 illustrates the band gap structure of layers around an active layer used in an eighth embodiment.

In the tensile-strained region 353 of FIG. 18, the reason a well layer with a larger strain is placed nearer the p-type layer is the same as that described in the seventh embodiment.

Then, the structure of the compressively-strained active region 354 for generating the gain for the TE mode will be described. Initially, a barrier layer 345 for separating the tensile-strained active region 353 from the compressively-strained active region 354 is formed on the tensile-strained well layer 343. Its composition is undoped InGaAsP and its thickness is 100 Å. On the barrier layer 345, a 0.6% compressively-strained undoped InGaAsP well layer 346 is formed with a thickness of 5 nm. An undoped InGaAsP barrier layer 347 is then laid down over the layer 346. No strain is introduced into the barrier layer 347. On the barrier layer 347, a 0.8% compressively-strained undoped InGaAsP well layer 348 is formed with a thickness of 5 nm. An undoped InGaAsP barrier layer laid down over the layer 348 is the same as the barrier layer 347. No strain is introduced into this barrier layer.

Further, a 1.1% compressively-strained undoped InGaAs layer 349 is formed with a thickness of 50 Å. On the layer 349, the upper light guide layer 34 of undoped InGaAsP is formed with a thickness of 0.2 μm. Such is the structure of the compressively-strained region 354. In the compressively-strained region 354, where the thickness of a well layer is unchanged, the mole fraction of In contained in the well layer increases as the strain amount thereof increases. Therefore, the band gap of InGaAsP used as the well is decreased and its band gap wavelength is increased. In such a structure, the band gap of the well layer 346 is the widest, and the band gaps of the well layers 348 and 349 decrease as the strain amounts thereof increase. As a result, also in the compressively-strained region 354, the gain can be unified over a wide wavelength range. The gain for the TE mode can have an approxilately uniform magnitude over a range from about 1480 nm to 1550 nm (i.e., a band width of 70 nm) due to the presence of the compressively-strained active region 354.

A wavelength range, over which gains for both of the TE mode and the TM mode are approximately constant and balance, extends over a width of about 50 nm from 1500 nm to 1550 nm. If the TE-mode and TM-mode gains do not well balance under the near-threshold condition even by the presence of the well layers having gains over a wide range, an additional well layer, which can provide a gain for a wavelength range with an insufficient gain, only needs to be formed to improve the balance of gains. Further, in this embodiment, though three well layers are provided in each of the tensile-strained region 353 and the compressively-strained region 354, the number of the well layers is not limited to this number.

In this embodiment, though the tensile-strained region 353 is placed near the p-side at which minority carriers 351 are supplied (in this case, minority carriers are holes 351 and majority carriers are electrons 350), this placement is not necessary. The compressively-strained region 354 may be placed near the minority carrier supply side. The feature of this embodiment is that the well layer with a wider band gap is placed closer to the minority carrier supply side in each of the tensile-strained and compressively-strained regions 353 and 354.

The switching method between the TE mode and the TM mode is the same as that of the seventh embodiment. Further, though the p-type substrate is used in this embodiment, an n-type substrate can also be employed. Also in this case, the well layer of a wider band gap is placed nearer the minority carrier supply side.

As described in the foregoing, in both of the tensile-strained region and the compressively-strained region of this embodiment, strain amounts of the well layers are varied and the well layer of a wider band gap is positioned nearer the p-side layer, so that a wavelength range of balancing gains is widened. Compared with the seventh embodiment, a wavelength range, over which the gains of the TE mode and the TM mode balance, can be more freely set in this embodiment. Thus, a semiconductor optical laser, such as a semiconductor laser which has an approximately constant gain over a wide wavelength range, can be realized.

Ninth Embodiment

A ninth embodiment will be described with reference to FIGS. 19 and 20. The features of this embodiment are that a tensile-strained region is not separated from a compressively-strained region in an active layer, that well layers are arranged from a p-side to an n-side in the order of their band gaps (i.e., a well layer with a wider band gap is placed nearer the p-side) and that propagation constants of waveguides are controlled by their physical structures such that the switching between the TE mode and the TM mode can be readily achieved by the phase control.

In FIGS. 7A and 7B showing the entire structure of this embodiment, the stripe width D2 of the region with the electrodes 69 and 71 is relatively narrow, say 1.5 μm, and the stripe width D1 of the region with the electrode 70 is relatively wide, say 3.0 μm.

The layer structure of the active region 63 will be described with reference to FIG. 19. In the seventh and eighth embodiments, the tensile-strained region is separated from the compressively-strained or non-strained region by the barrier layer. As a result, the gains for the TE mode and the TM mode can be changed by varying injected currents, and thus the switching between the TE mode and the TM mode can be performed. In the active layer of the ninth embodiment, a gain difference between the TE mode and the TM mode is small and changes in gains for both modes due to a change in the injected currents are about equal to each other. The switching between the TE mode and the TM mode is performed using such an active layer. In this embodiment, a well layer with a wider band gap is placed nearer a side into which carriers with a short diffusion length are injected, and widths of band gaps of well layers become narrower towards the other side.

Figure 19:
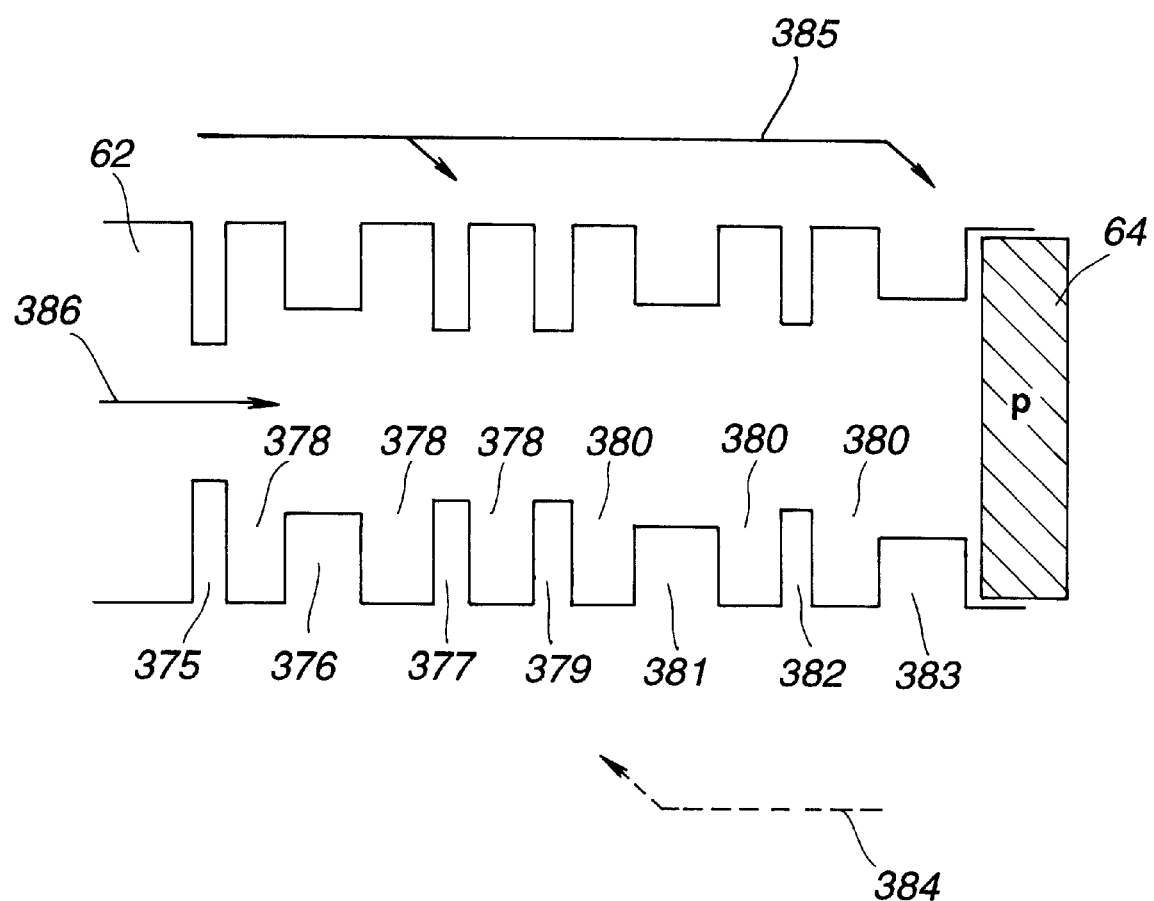
FIG. 19 illustrates the band gap structure of layers around an active layer used in a ninth embodiment.

In FIG. 19, reference numeral 386 designates a direction of layering, and reference numeral 62 designates the lower light guide layer. The layer 62 is composed of Si-doped InGaAsP, its carrier concentration is $1 \times 10^{17} cm^{-3}$, and its thickness is 0.2 μm. On the lower light guide layer 62, the following layers are formed in the following order. A well layer 375 of undoped InGaAs is initially grown with a thickness of 40 Å. A compressive strain of 0.8% is introduced into the well 375. Then, a barrier layer 378 is grown. The layer 378 is comprised of an undoped InGaAsP layer having a thickness of 100 Å, and no strain (0.0%) is introduced into the layer 378. On the barrier layer 378, a well layer 376 is laid down. The well layer 376 is composed of undoped InGaAs, its thickness is 110 Å and its tensile strain amount is 0.4%. Then, a barrier layer, whose composition is the same as that of the barrier layer 378, is formed. On this barrier layer, a 0.6% compressively-strained well layer 377 of undoped InGaAs is formed with a thickness of 40 μ. Reference numeral 378 denotes a barrier layer. Reference numeral 379 denotes a well layer composed of the same construction as that of the compressively-strained well layer 377 to acquire a gain in a central wavelength range. Reference numeral 380 designates a barrier layer of undoped InGaAsP having a thickness of 100 Å, and its band gap wavelength is set to 1.18 μm. Reference numeral 381 denotes a 1.0% tensile-strained layer of undoped InGaAs having a thickness of 110 Å. Then, a barrier layer 380 is formed. Reference numeral 382 designates a 0.5% compressively-strained layer of undoped InGaAs having a thickness of 40 Å. Reference numeral 380 designates a barrier layer of undoped InGaAsP having a thickness of 100 Å. Reference numeral 383 designates a 1.2% tensile-strained layer of undoped InGaAs having a thickness of 110 Å. Reference numeral 64 designates the upper light guide layer of Be-doped InGaAsP having a thickness of 0.2 μm. Such is the structure of the active layer 63.

Well layers having relatively wide band gaps are placed at the side of holes 384 with a short diffusion distance (i.e., the side of the p-type light guide layer 64), and the band gap of the well layer decreases as its location approaches the n-side to which electrons 385 are supplied. As a result, approximately even gains for the TE-mode and the TM-mode can be obtained. The reason for placing the well layer with a wider band gap nearer the side of the conductivity type of the carriers 384 with a short diffusion length is described above. This reason will be further described. The gain of a well layer tends to be readily saturated as its band gap (the gap between the quantum level of holes in the valence band and the quantum level of electrons in the conduction band) increases. If carriers are supplied to a well layer with a narrow band gap, which is hard to saturate, the gain of this well layer increases and it becomes impposible that the gain of a well layer with a wide band gap catch up with the gain of the well layer with a narrow band gap. In order to make the gain approximately uniform over a wide wavelength range, it is necessary to preferentially obtain the gain of the well layer with a wide band gap. Therefore, a well layer with a wider band gap needs to be placed closer to the side of the conduction type of carriers having a shorter diffusion length. In the above-discussed active layer 63, there are arranged three tensile-strained well layers for primarily generating the gain for the TM mode and four compressively-strained well layers for generating the gain for the TE mode. Also in this embodiment, the number of the well layers in the active layer is not limited to the above example. However, there are physical limitations, such as critical layer thickness and the like. This is the same in the other embodiments.

Figure 20:
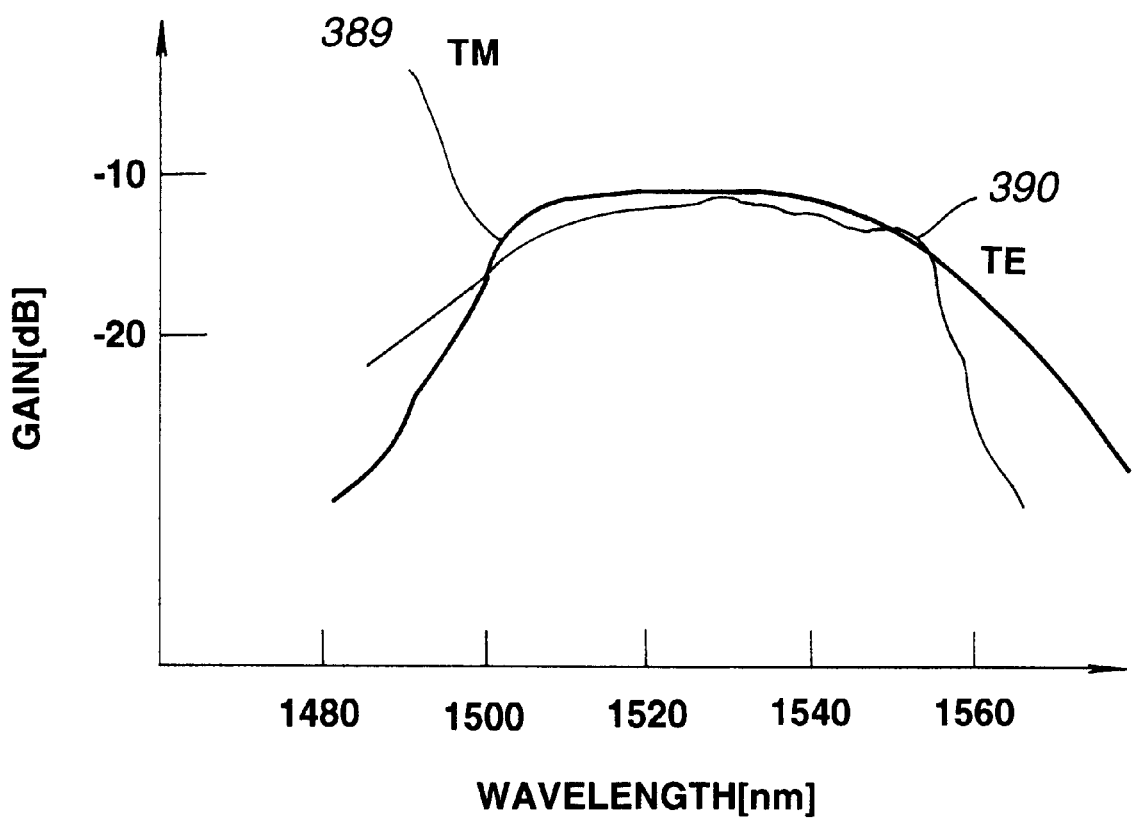
FIG. 20 is a view illustrating gain spectra for the TE mode and the TM mode in the ninth embodiment.

FIG. 20 illustrates the gain distribution or profile of the laser using the above-discussed well layers. Since four compressively-strained well layer are arranged and their strain amounts are varied from 0.8% to 0.5%, a wavelength range of the TE-mode gain indicated by a line 390 extends to a longer wavelength side and is expanded up to 1550 nm from 1500 nm. With respect to the TM-mode gain indicated by a line 389, a wavelength range with a width of about 50 nm is obtained. As described above, the feature of the active layer 63 is that a gain difference between the TE mode and the TM mode can be maintained approximately constant even if the amount of injected current is changed.

If a sufficiently uniform gain can not be attained even by that structure, an additional well layer, which can provide a gain for a wavelength range with an insufficient gain, only needs to be formed. Also in this case, it is desirable that a well layer with a narrower band gap is positioned nearer the p-side and its band gap is increased as the location of the well layer approaches the n-side in the entire active layer.

A method for driving the above-discussed ninth embodiment is the same as that of the third embodiment. In the structure of this embodiment, a gain difference between the TE mode and the TM mode is small in the active layer and gains for the both modes balance and are stable over a wide wavelength range, so that the laser switching between the TE mode and the TM mode can be stably performed.

Tenth Embodiment

A tenth embodiment will be described with reference to FIG. 21. The entire structure of the tenth embodiment is the same as illustrated in FIG. 10.

The layer structure of the active region 113 will be described with reference to FIG. 21. The feature of this embodiment is that the active layer is doped with p-type impurities and that the closer to the n-side the well layer is placed, the wider the band gap of the well layer is. In FIG. 21, an arrow 432 indicates a direction of layering. Reference numeral 112 designates the Si-doped light guide region. The structure of the active layer 113 is divided into a tensile-strained region 434 and a compressively-strained region 433.

The structure of the compressively-strained region 433 for generating the gain of the TE mode will be described. On the light guide layer 112, a well layer 421 of undoped InGaAsP is initially grown with a thickness of 4 nm. A compressive strain of 0.8% is introduced into the well 421. Then, a barrier layer 422 is grown. The layer 422 is comprised of Be-doped InGaAsP, no strain is introduced into the layer 422 and its thickness is 100 Å. On the barrier layer 422, a well layer 423 is laid down. The well layer 423 is composed of undoped InGaAsP, its thickness is 4 nm and its compressive strain amount is 1.0%. Then, a barrier layer, whose composition is the same as that of the barrier layer 422 and into which no strain is introduced, is formed. On this barrier layer, a well layer 424 of undoped InGaAsP is formed with a thickness of 4 nm and a compressive strain amount of 1.2%. Then, a barrier layer 425 for separating the compressively-strained active region 433 from the tensile-strained active region 434 is formed on the well layer 424. Its composition is Be-doped InGaAsP and its thickness is 100 Å. The compressively-strained active region 433 has such a construction. As indicated by a line 446 in FIG. 22, the gain of the TE mode can have an approxilately uniform magnitude over a range from 1460 nm to 1540 nm (i.e., a wide band width of about 80 nm) due to the presence of the compressively-strained active region 433.

The structure of the tensile-strained region 434 will be described. On the barrier layer 425, a well layer 426 of undoped InGaAs is initially grown with a thickness of 130 Å. A tensile strain of 1.0% is introduced into the well layer 426. Then, a barrier layer 427 is grown. The layer 427 is comprised of a Be-doped InGaAsP having a thickness of 100 Å, and a compressive strain of 0.2% is introduced into the layer 427. On the barrier layer 427, a well layer 428 is laid down. The well layer 428 is composed of undoped InGaAs, its thickness is 130 Å and its tensile strain amount is 0.8%. Then, a barrier layer, whose composition is the same as that of the barrier layer 427 and whose thickness is 100 Å, is formed. On this barrier layer, a well layer 429 of undoped InGaAs is formed with a thickness of 130 Å and a tensile strain amount of 0.6%. Such is the structure of the tensile-strained region 434. Since the strain amounts of the well layers 426, 428 and 429 are varied as above, quantum levels of those well layers differ from each other and their band gaps corresponding to inter-quantum-level transition energies is different from each other. Thus, oscillation wavelengths of those well layers 426, 428 and 429 diverge from each other. Hence, wavelength ranges of gains due to those well layers 426, 428 and 429 (primarily for the TM mode) overlap appropriately, and it is possible to obtain approximately uniform gains over a wide wavelength range. As indicated by reference numeral 445 in FIG. 22, due to those well layers 426, 428 and 429, the gain for the TM mode can be approximately uniform over a range from 1470 nm to 1550 nm.

Figure 21:
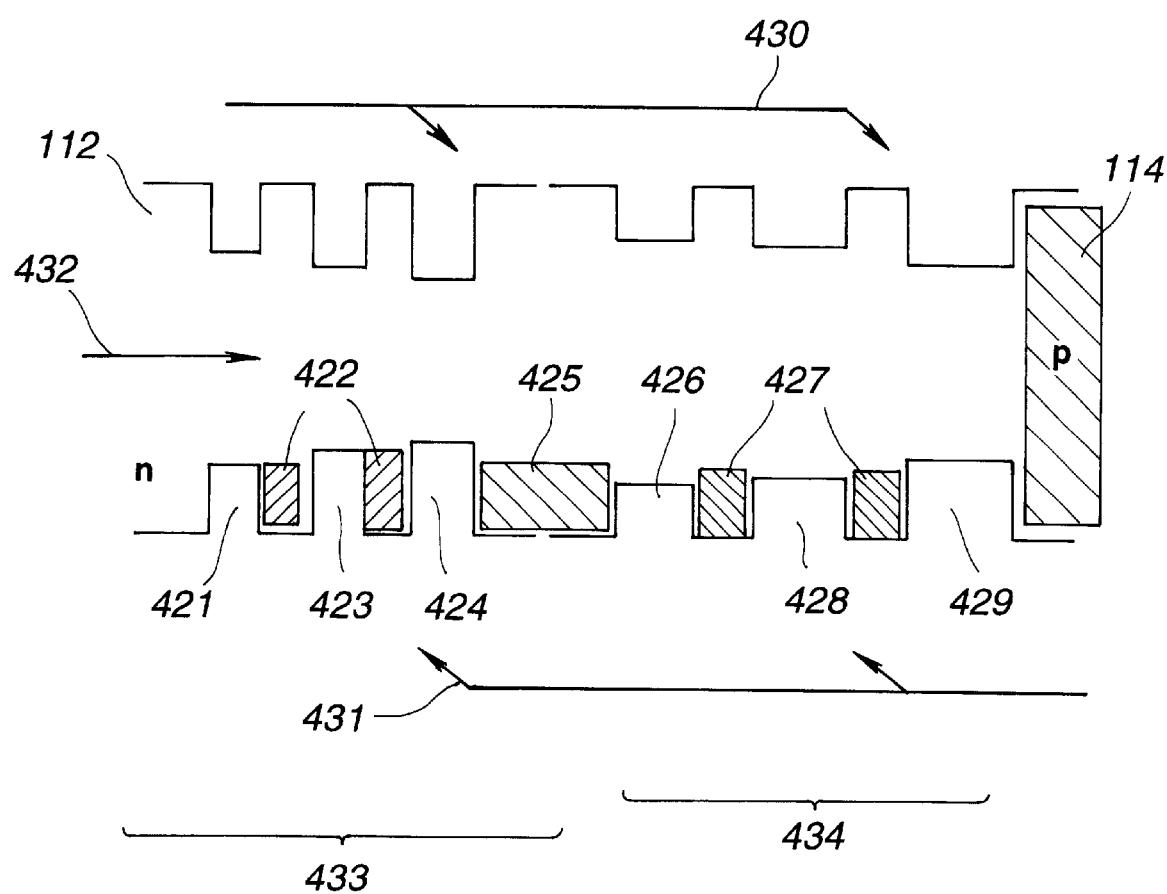
FIG. 21 illustrates the band gap structure of layers around an active layer used in a tenth embodiment.

In FIG. 21, the reason for the p-type doping of the barrier layers in the active layer 113 is to lower the threshold current density. Further, due to the p-type doping, uniformity of the gains of the active layer is promoted by using electrons 430, which are easier to diffuse, as control carriers. As a result, it is possible to achieve the oscillation and the switching in a low-current range due to the readily-diffusible electrons.

The reason for placing the well layer with a wider band gap (i.e., a smaller strain amount) nearer the side of the n-conduction type in the compressively-strained region 433 in FIG. 21 is described above. Namely, uniformity of the gains in a wide wavelength range is promoted by preferentially supplying minority carriers to the well layer with a wide band gap (the minority carriers in this case are electrons 430 but not holes 431 since the p-doped active layer is used). Further, in this emodiment, though only the barrier layers are doped with p-type impurities, the well layers may also be p-doped. Furthermore, it is possible to dope only the compressively-strained region 433 while not Be-doping the tensile-strained region 434. Hence, the rise of the TE-mode gain can be improved and the switching in a low-current range is achieved.

The operation of the tenth embodiment in FIG. 21 is the same as that of the fourth embodiment.

As described in the foregoing, in order to widen the gain-constant ranges in the tensile-strained and compressively-strained regions, the band gaps (i.e., strain amounts) of the well layers are varied and the p-doped active layer is used in the tenth embodiment. Thus, the range, over which the TE-mode and TM-mode gains are approximately constant, can be freely set, and thus an optical semiconductor device, such as a semiconductor laser with approximately constant gains in a wide range, can be achieved.

Figure 22:
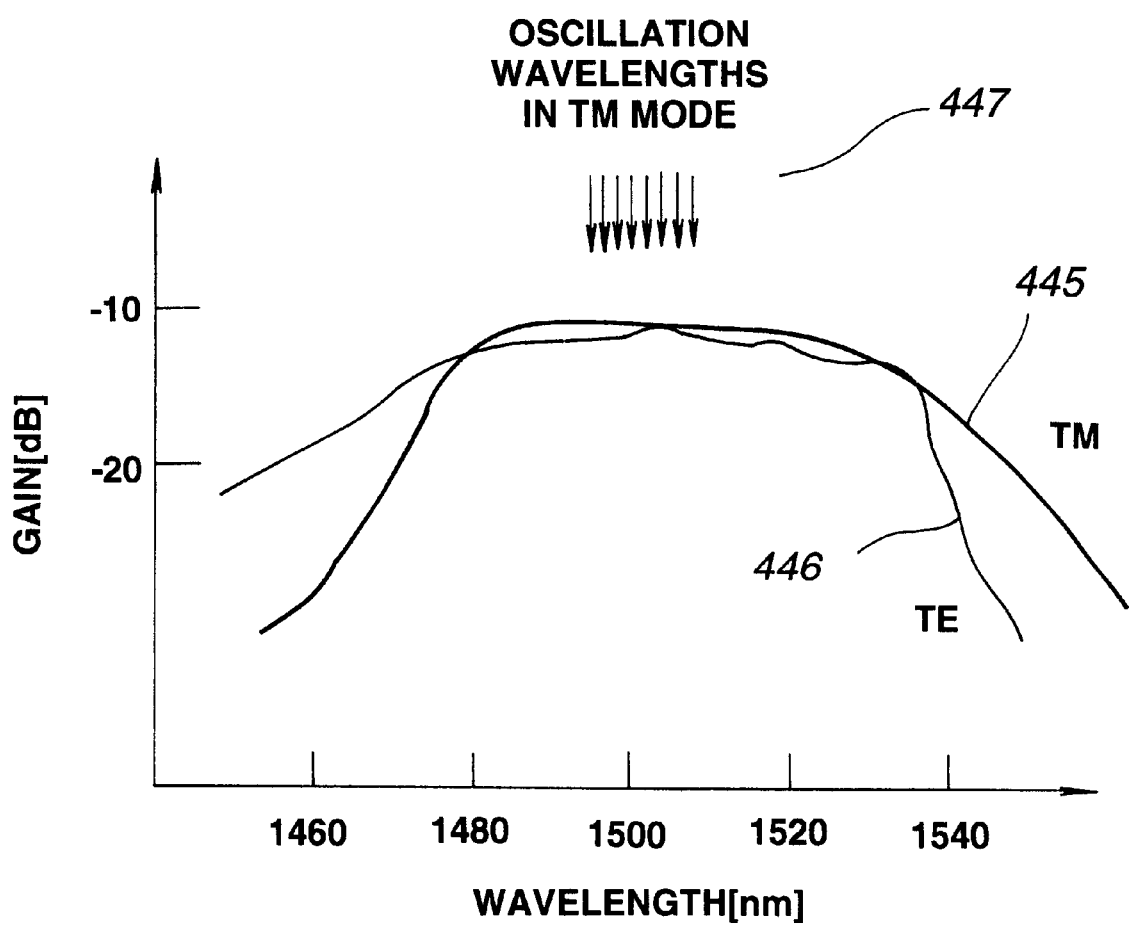
FIG. 22 is a view illustrating gain spectra for the TE mode and the TM mode in the tenth embodiment and oscillation wavelengths in the TM mode of a laser array.

As illustrated in FIG. 22, an array laser using the above active layer as a common layer can also be built by the above-discussed structure. The array laser is constructed such that eight different oscillation wavelengths in the TM mode can be emitted therefrom as illustrated by reference numeral 447 in FIG. 22.

Eleventh Embodiment

In an eleventh embodiment, heights of barriers in an active layer are made different from each other in addition to the control of band gaps of the active layer due to the control of strains to control supplied carriers and promote uniformity of the gain in a wide wavelength range.

Figure 23:
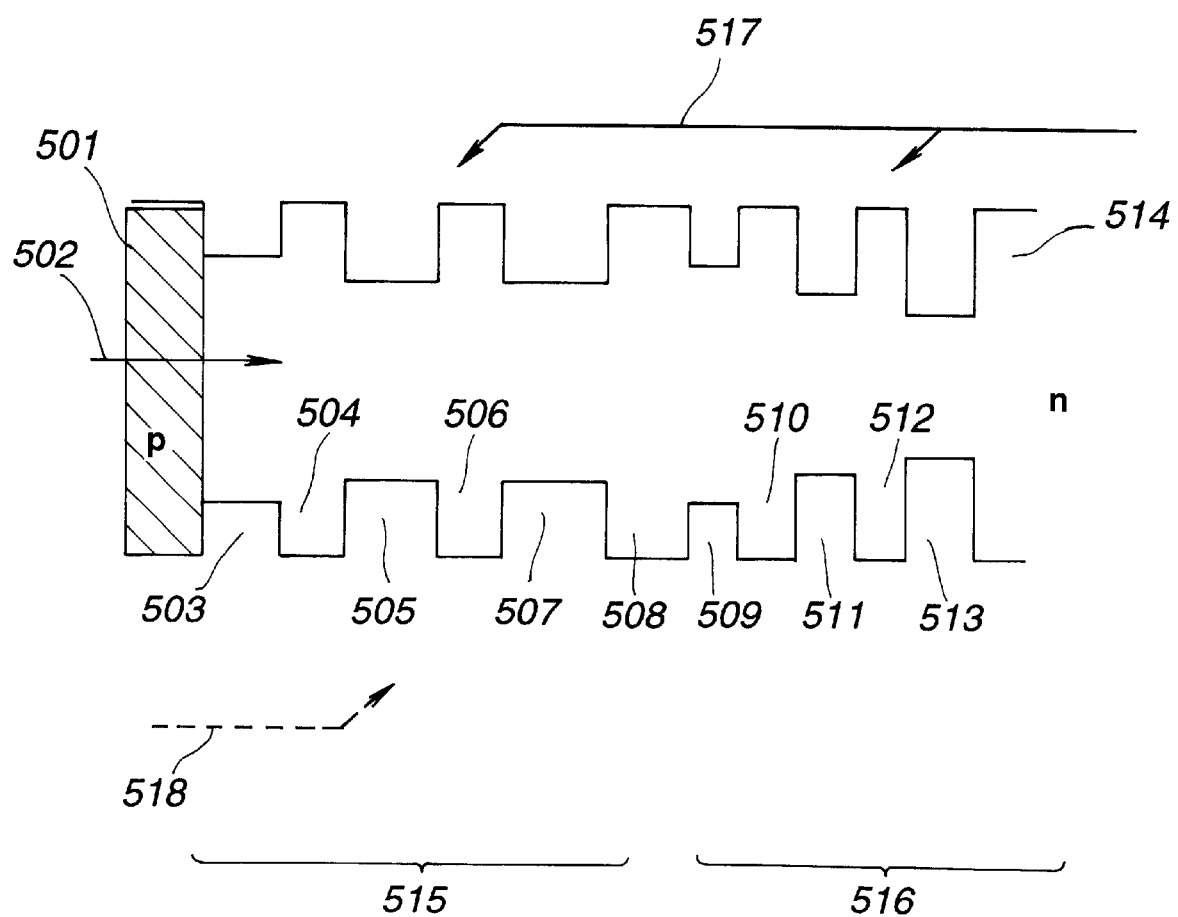
FIG. 23 illustrates the band gap structure of layers around an active layer used in an eleventh embodiment.

The layer structure of the active region of this embodiment will be described with reference to FIG. 23. FIG. 23 shows the band gap structure of layers near the active layer. The structure of the other portion of this embodiment is the same as that of FIG. 4.

In FIG. 23, reference numeral 502 designates a direction of layering, and reference numeral 501 designates a Be-doped light guide layer region which corresponds to the light guide layer region 32 in FIG. 4. The active layer is divided into a tensile-strained active region 515 and a compressively-strained active region 516.

The structure of the tensile-strained active region 515 will be described. On the light guide layer 501, the following layers are formed in the following order. A well layer 503 of undoped InGaAs is initially grown with a thickness of 135 Å. A tensile strain of 1.1% is introduced into the well 503. Then, a barrier layer 504 is grown. The layer 504 is comprised of an undoped InGaAsP layer having a thickness of 100 Å and a band gap wavelength set to 1.20 $\mu$m, and a compressive strain of 0.2% is introduced into the layer 504. On the barrier layer 504, a well layer 505 is laid down. The well layer 505 is composed of undoped InGaAs, its thickness is 135 Å and its tensile strain amount is 0.8%. Then, a barrier layer 506, whose composition is set such that its band gap wavelength is 1.15 $\mu$m (its band gap is wider than that of the barrier layer 504), is formed with a thickness of 100 Å. On this barrier layer, a 0.65% tensile-strained well layer 507 of undoped InGaAs is formed with a thickness of 135 Å. Such is the structure of the tensile-strained region 515. The band gaps or the barrier heights of the barrier layers 504 and 506 are made lower as the location is closer to the p-side whose carriers are harder to supply. Thus, carriers 518 can be uniformly supplied to the active layer more effectively. As a result, wavelength ranges of gains due to the well layers 503, 505 and 507 appropriately overlap, so that it is possible to obtain a wide wavelength range over which the gain (primarily for the TM mode) is approximately uniform.

Then, the structure of the compressively-strained active region 516 for generating the gain for the TE mode will be described. Initially, a barrier layer 508 for separating the tensile-strained active region 515 from the compressively-strained active region 516 is formed on the tensile-strained well layer 507. Its composition is undoped InGaAsP, its thickness is 100 Å and its band gap wavelength is set to 1.15 $\mu$m. On the barrier layer 508, a 0.8% compressively-strained undoped InGaAsP layer 509 is formed with a thickness of 4 nm. An undoped InGaAsP barrier layer 510 is then laid down over the layer 509. No strain is introduced into the barrier layer 510 and its band gap wavelength is set to 1.2 $\mu$m. On the barrier layer 510, a 1.0% compressively-strained undoped InGaAsP well layer 511 is formed with a thickness of 4 nm. An undoped InGaAsP barrier layer 512 laid down over the well layer 511 is non-strained and its band gap wavelength is set to 1.15 $\mu$m.

Further, a 1.2% compressively-strained undoped InGaAsP layer 513 is formed with a thickness of 4 nm. On the layer 513, an upper light guide layer 514 of undoped InGaAsP is formed with a thickness of 0.2 $\mu$m. Its band gap wavelength is set to 1.15 $\mu$m. Such is the structure of the compressively-strained region 516.

As described above, the barrier height in the active layer is controlled such that the barrier height near the side of carriers harder to supply, in this case the holes 518, is made smaller. Thus, the holes are easier to get over the barrier and can be uniformly spread over the active layer. In this embodiment, though the barrier height is controlled separately and independently between the tensile-strained region 515 and the compressively-strained region 516, the barrier height can be continuously varied from the p-side toward the n-side. For example, the height of the barrier layer 508 may be lowered. The laser having such a structure can be driven in the same manner as the fifth embodiment.

Further, in this embodiment, the holes 518 are carriers harder to move. However, as described in the fourth embodiment, it is possible to cause electrons 517 to function as control carriers by p-doping the barrier or the well layer. In this case, as the barrier is closer to the n-side, its height is made lower such that electrons 517 are easier to supply to each well layer.

Twelfth Embodiment

In the eleventh embodiment, heights of barriers in an active layer are varied from each other to improve the supply of carriers which are hard to move. In a twelfth embodiment, thicknesses of barriers in an active layer are varied to control supplied carriers and unify gains at respective wavelengths. The structure of the active layer will be described with reference to FIG. 24. The other portion of this embodiment is the same as that illustrated in FIG. 4.

Figure 24:
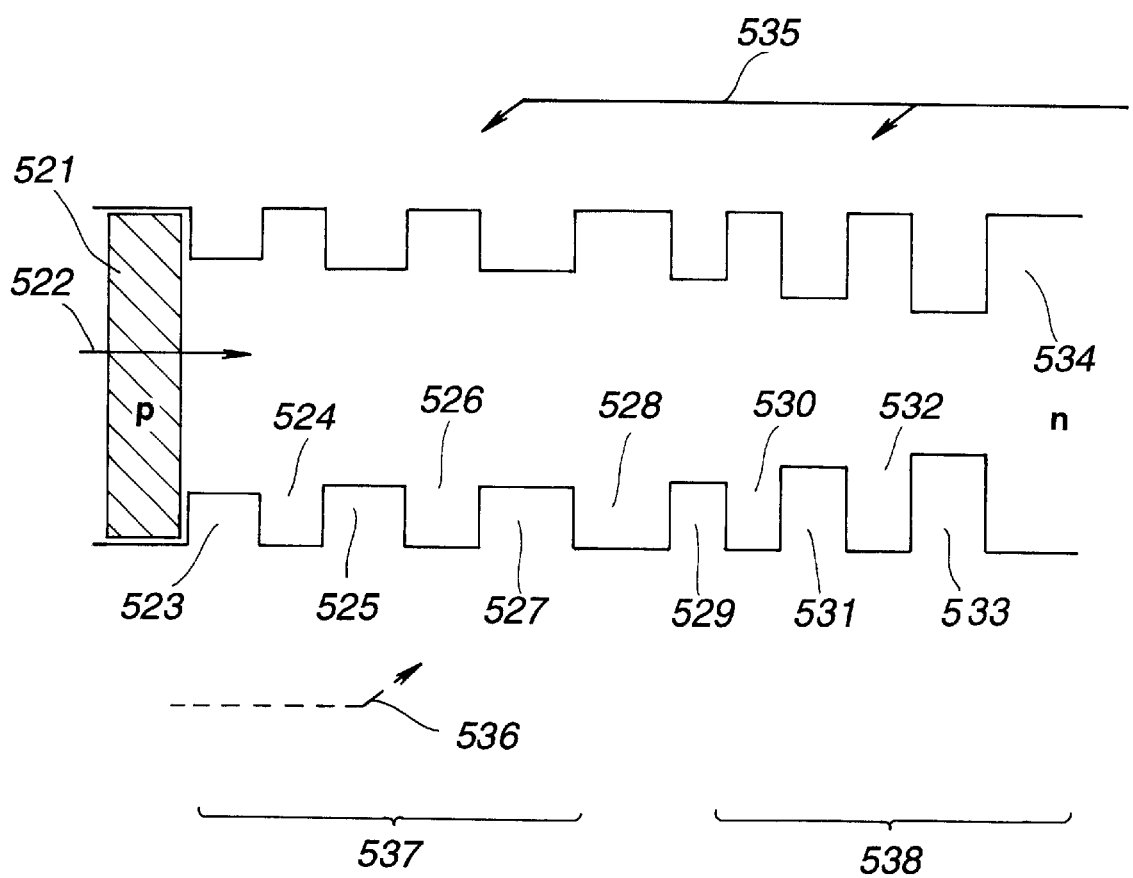
FIG. 24 illustrates the band gap structure of layers around an active layer used in a twelfth embodiment.

In FIG. 24, reference numeral 522 designates a direction of layering, and reference numeral 521 designates a Be-doped light guide layer region which corresponds to the light guide layer 32 in FIG. 4. The active layer is divided into a tensile-strained active region 537 and a compressively-strained active region 538.

The structure of the tensile-strained active region 537 will be initially described. On the light guide layer 521, the following layers are formed in the following order. A well layer 523 of undoped InGaAs is initially grown with a thickness of 130 Å. A tensile strain of 1.0% is introduced into the well 523. Then, a barrier layer 524 is grown. The layer 524 is comprised of an undoped InGaAsP layer having a thickness of 60 Å, and a compressive strain of 0.2% is introduced into the layer 524. On the barrier layer 524, a well layer 525 is laid down. The well layer 525 is composed of undoped InGaAs, its thickness is 130 Å and its tensile strain amount is 0.8%. Then, a barrier layer 526 having the same composition as that of the layer 524 is formed with a thickness of 80 Å. On this barrier layer, a 0.6% tensile-strained well layer 527 of undoped InGaAs is formed with a thickness of 130 Å. Such is the structure of the tensile-strained region 537. The band gaps of the well layers 523, 525 and 527 are varied from each other by varying the strain amounts thereof, and their oscillation wavelengths are varied from each other. As a result, wavelength ranges of gains due to the well layers 523, 525 and 527 appropriately overlap, so that it is possible to obtain a wide wavelength range over which gains are approximately uniform. Additionally, in the twelfth embodiment, the thicknesses or widths of the barriers 524 and 526 are varied to improve the supply of carriers which are harder to move.

The reason for placing a narrower barrier layer nearer the p-side in the tensile-strained region 537 of FIG. 24 is the same as that described in the sixth embodiment. Thus, gains of the respective well layers 523, 525 and 527 in the tensile-strained region 537 can be regulated, and gains can be made approximately even over a wide wavelength range.

Then, the structure of the compressively-strained active region 538 for generating the gain for the TE mode will be described. Initially, a barrier layer 528 for separating the tensile-strained active region 537 from the compressively-strained active region 538 is formed on the tensile-strained well layer 527. Its composition is undoped InGaAsP and its thickness is 100 Å. On the barrier layer 528, a 0.2% compressively-strained undoped InGaAs layer 529 is formed with a thickness of 4 nm. An undoped InGaAsP barrier layer 530 is then laid down over the layer 529. No strain is introduced into the barrier layer 530, and its thickness is 60 Å. On the barrier layer 530, a 0.4% compressively-strained undoped InGaAsP well layer 531 is formed with a thickness of 4 nm. An undoped InGaAsP barrier layer 532 laid down over the well layer 531 has the same composition as that of the barrier layer 530, and its thickness is 80 Å.

Further, a 0.6% compressively-strained undoped InGaAsP well layer 533 is formed with a thickness of 4 nm. On the layer 533, an upper light guide layer 534 of undoped InGaAsP is formed with a thickness of 0.2 μm. Such is the structure of the compressively-strained region 536.

As described above, the barrier thickness in the active layer near the side of carriers harder to supply, in this case holes 536, is made thinner. Thus, the holes can more easily get over the barrier and can be uniformly spread over the active layer. The laser having such a structure can be driven in the same manner as the laser of the sixth embodiment.

In this embodiment, though the barrier thickness is controlled separately and independently between the tensile-strained region 537 and the compressively-strained region 538, the barrier thickness can be continuously varied from the p-side to the n-side, for example.

Further, in this embodiment, the holes are carriers harder to move. However, as described in the tenth embodiment, it is possible to cause electrons 535 to function as control carriers by p-doping the barrier or the well layer. In this case, as the barrier is closer to the n-side, its thickness is made thinner such that the electrons can be easily supplied to each well layer.

Thirteenth Embodiment

A cross section of the entire structure of a polarization selective laser of a thirteenth embodiment in its cavity direction is the same as that illustrated in FIG. 1A. In the thirteenth embodiment, a well layer, in which the gain should be preferentially generated, is placed on the minority carrier supply side.

Figure 25:
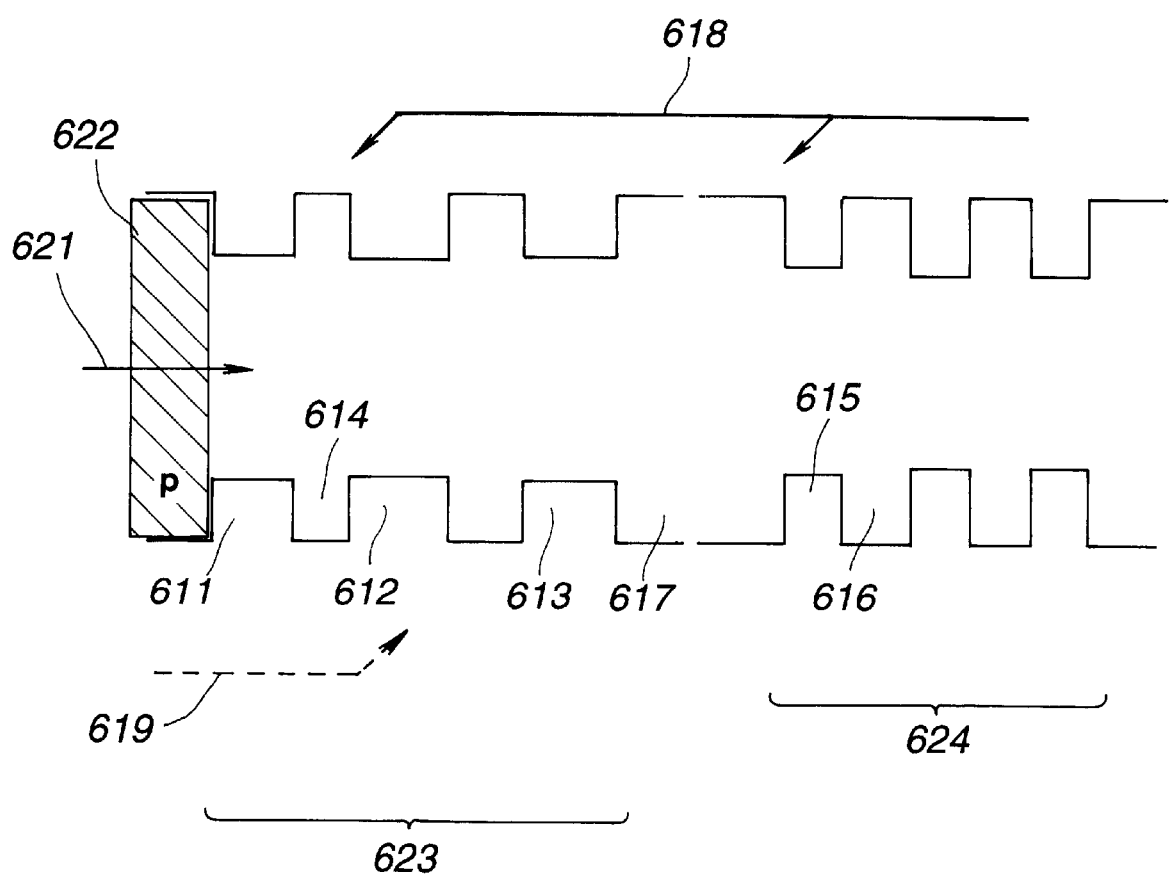
FIG. 25 illustrates the band gap structure of layers around an active layer used in a thirteenth embodiment.

The layer structure of the active region 3 will be described with reference to FIG. 25 that illustrates the band gap structure. In FIG. 25, an arrow 621 indicates a direction of layering. Reference numeral 622 designates a Be-doped light guide region which corresponds to the light guide layer 2 in FIG. 1A. The structure of the active layer 3 is divided into a tensile-strained region 623 and a non-strained region 624. The structure of the tensile-strained region 623 will be described. On the light guide layer 622, a well layer 611 of undoped InGaAs is initially grown with a thickness of 90 Å. A tensile strain of 1.0% is introduced into the well 611. Then, a barrier layer 614 is grown. The layer 614 is comprised of an undoped InGaAsP layer having a thickness of 70 Å, and a compressive strain of 0.2% is introduced into the layer 614. The compressive strain opposite to the tensile strain is introduced into the barrier layer 614 to improve the crystal quality of the well layer and the like due to the strain compensation effect.

On the barrier layer 614, a well layer 612 is laid down. The well layer 612 is composed of undoped InGaAs, its thickness is 130 Å and its tensile strain amount is 1.0% Then, a barrier layer, whose composition is the same as that of the barrier layer 614 and whose thickness is 70 Å, is formed. On this barrier layer 614, a well layer 613 of undoped InGaAs is formed with a thickness of 110 Å and a tensile strain amount of 1.0%. Such is the structure of the tensile-strained region 623.

Figure 26:
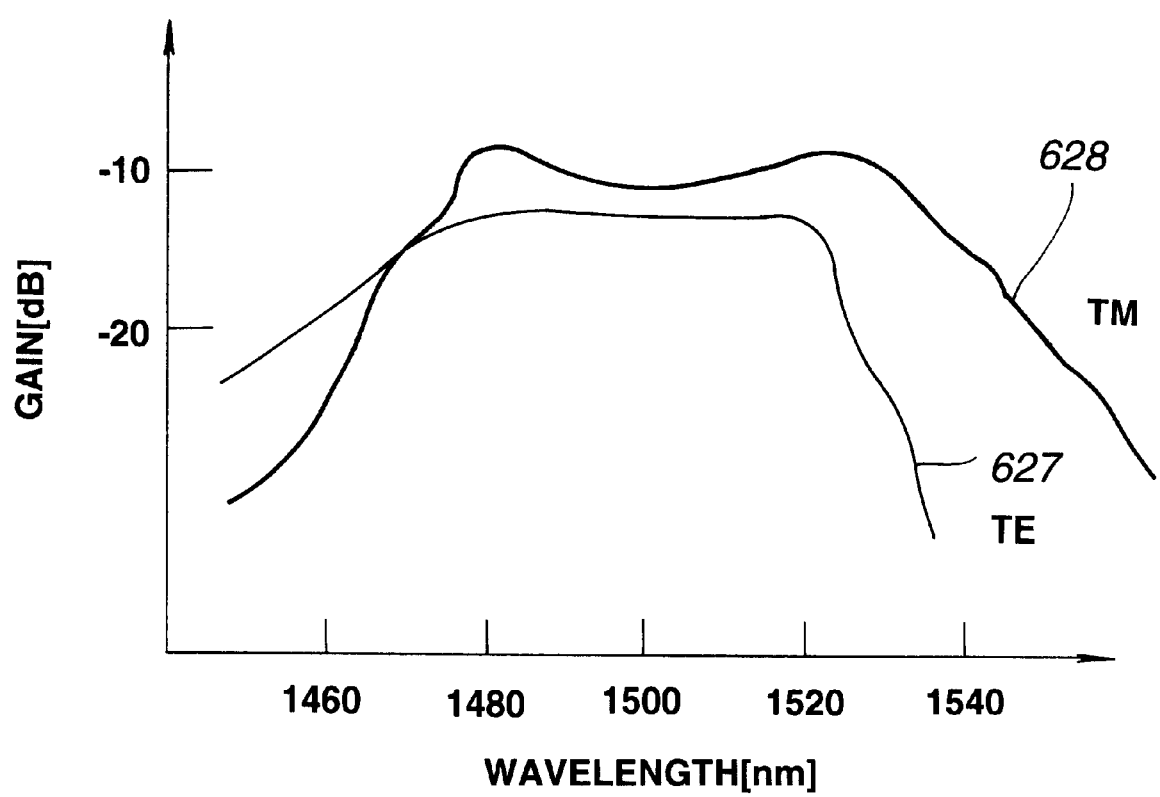
FIG. 26 is a view illustrating gain spectra for the TE mode and the TM mode in the thirteenth embodiment.

FIG. 26 illustrates the gain distribution or profile obtained by that active region. As indicated by a line 628 in FIG. 26, since the well layer 611 with a small thickness is formed adjacent to the well layer 612 with a large thickness in this embodiment, the gain for the TM mode is sufficient on both of shorter and longer wavelength sides and hence a range, over which the gain for the TM mode is approximately uniform, is widened. As a result, as illustrated in FIG. 26, the gain of the TM mode can have an approxilately uniform magnitude over a range from 1480 nm to 1520 nm.

In the tensile-strained region 623 of FIG. 25, the reason a well layer, whose gain is desired to be preferentially generated, is placed near the p-type layer is as follows. As described above, the diffusion distance of p-type holes 619 is relatively short compared with that of n-type electrons 618, and thus the diffusion length of holes 619 is short while n-type electrons 618 are supplied over the entire active layer as illustrated in FIG. 25. Thus, initially the well layer located near the p-side can acquire the gain more easily. On the other hand, the quantum level rises as the thickness of the well layer decreases, and hence the confinement of carriers is lowered therein. As a result, it is considered that the gain is harder to generate when the well layer with a small thicness is formed away from the p-type layer. Therefore, the well layer, whose gain needs to be preferentially generated, is positioned near the p-side.

Hence, as shown in FIG. 26, it is possible to regulate the gains of the well layers 611, 612 and 613 in the tensile-strained region 623, and a substantially uniform gain can be obtained over a wide wavelength range. If a sufficiently uniform gain can not be attained even by that structure, an additional well layer, which can provide a gain in a wavelength range with an insufficient gain, only needs to be formed. Also in this case, it is necessary that a well layer with a small thickness is positioned near the p-side in the tensile-strained region 623.

Here, the tensile-strained well layers 611, 612 and 613 generate not only the gain for the TM mode but also the gain for the TE mode, as already described. In a well layer with a tensile strain of 1.0%, a peak wavelength of the gain for the TE mode generated thereby is on a shorter wavelength side than a peak wavelength of the gain for the TM mode, and this difference is about 20 nm under a current-injected condition near its threshold.

Then, the structure of the non-strained active region 624 for generating the gain for the TE mode will be described. Initially, a barrier layer 617 for separating the tensile-strained active region 623 from the non-strained active region 624 is formed on the tensile-strained well layer 613. Its composition is undoped InGaAsP and its thickness is 100 Å. On the barrier layer 617, a non-strained undoped InGaAs well layer 615 is formed with a thickness of 6 nm. An undoped InGaAsP barrier layer 616 is then laid down over the layer 615. No strain is introduced into the barrier layer 616, and its thickness is 70 Å. Three well layers 615 of the same structure and two barrier layers 616 of the same structure are deposited. The non-strained active region 624 has such a construction.

An oscillation wavelength range of the non-strained active region 624 has a center wavelength of 1500 nm, and a wavelength width of an approximately uniform gain for the TE mode is about 20 nm. In this embodiment, the gain for the TE mode consists of the gain generated by the non-strained active region 624 and the gain for the TE mode generated by the tensile-strained active region 623. Therefore, the total wavelength range of an approximately uniform gain for the TE mode is wider than the wavelength range of an approximately uniform gain for the TE mode generated by the non-strained well layer 615, and extends from about 1480 nm to about 1520 nm (i.e., a band width of about 40 nm), as illustrated by reference numeral 627 in FIG. 26.

A method for driving the above-discussed thirteenth embodiment with the above construction is the same as that of the first embodiment.

As described in the foregoing, in the seventh embodiment, thicknesses of the well layers in the tensile-strained active region are made different from each other to widen a wavelength range over which gains are approximately uniform and balance, and the well layers with a small thickness and a large thickness are placed adjacently to each other on the p-side to preferentially acquire gains on shorter and longer wavelength sides. Thus, a semiconductor optical device, such as a semiconductor laser whose gains are approximately uniform and balance over a wide wavelength range, can be established.

Well layers with various layer thicknesses are not limited to the tensile-strained wells. The non-strained well layers may have various layer thicknesses to improve the wavelength range of a uniform gain. Further, where the well layer of a narrower thickness is located nearer the p-side layer, there is an assumption that the well or barrier in the active layer, to which holes are hard to diffuse, is undoped or n-doped.

Fourteenth Embodiment

A fourteenth embodiment will be described with reference to FIGS. 27 and 28. In this embodiment, formations of not only the tensile-strained region but the compressively-strained region are modified in order to promote competition of gains between the TE mode and the TM mode. Further, propagation constants of the waveguides are beforehand controlled so that the switching between the TE mode and the TM mode can be stably performed by the phase control.

The entire structure of this embodiment is the same as illustrated in FIG. 7, except that the substrate is composed of a p-InP layer and conduction types of respective layers are differently set.

The layer structure of the active region 33 will be described with reference to FIG. 27. In FIG. 27, an arrow 652 indicates a direction of layering. Reference numeral 632 designates a Be-doped light guide region. The structure of the active layer is divided into a tensile-strained region 653 and a compressively-strained region 654.

The structure of the tensile-strained region 653 will be described. On the light guide layer 632, a well layer 641 of undoped InGaAs is initially grown with a thickness of 80 Å. A tensile strain of 0.8% is introduced into the well 641. Then, a barrier layer 644 is grown. The layer 644 is comprised of an undoped InGaAsP layer having a thickness of 100 Å, and a compressive strain of 0.2% is introduced into the layer 644.

On the barrier layer 644, a well layer 642 is laid down. The well layer 642 is composed of undoped InGaAs, its thickness is 120 Å and its tensile strain amount is 0.8%. Then, a barrier layer, whose composition is the same as that of the barrier layer 644 and whose thickness is 100 Å, is formed. On this barrier layer, a well layer 643 of undoped InGaAs is formed with a thickness of 100 Å and a tensile strain amount of 0.8%. Such is the structure of the tensile-strained region 653.

Figure 28:
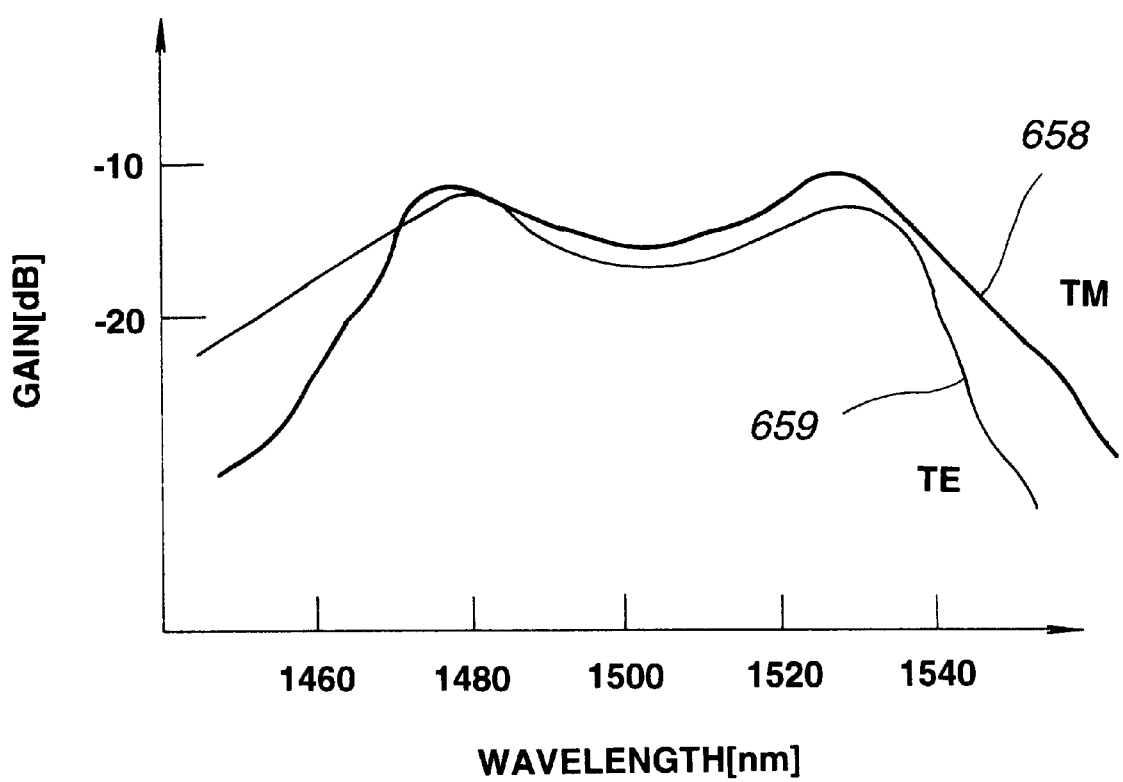
FIG. 28 is a view illustrating gain spectra for the TE mode and the TM mode in the fourteenth embodiment.

FIG. 28 illustrates the gain distribution or profile obtained by that active region. Since the well layer 641 with a small thickness is formed adjacently to the well layer 642 with a large thickness in this embodiment, gains on both of shorter and longer wavelength sides can be preferentially acquired and hence a range, over which the gain is approximately uniform, is widened. As a result, as illustrated by a line 658 in FIG. 28, the gain of the TM mode can have an approximately uniform magnitude over a range from 1480 nm to 1530 nm.

Figure 27:
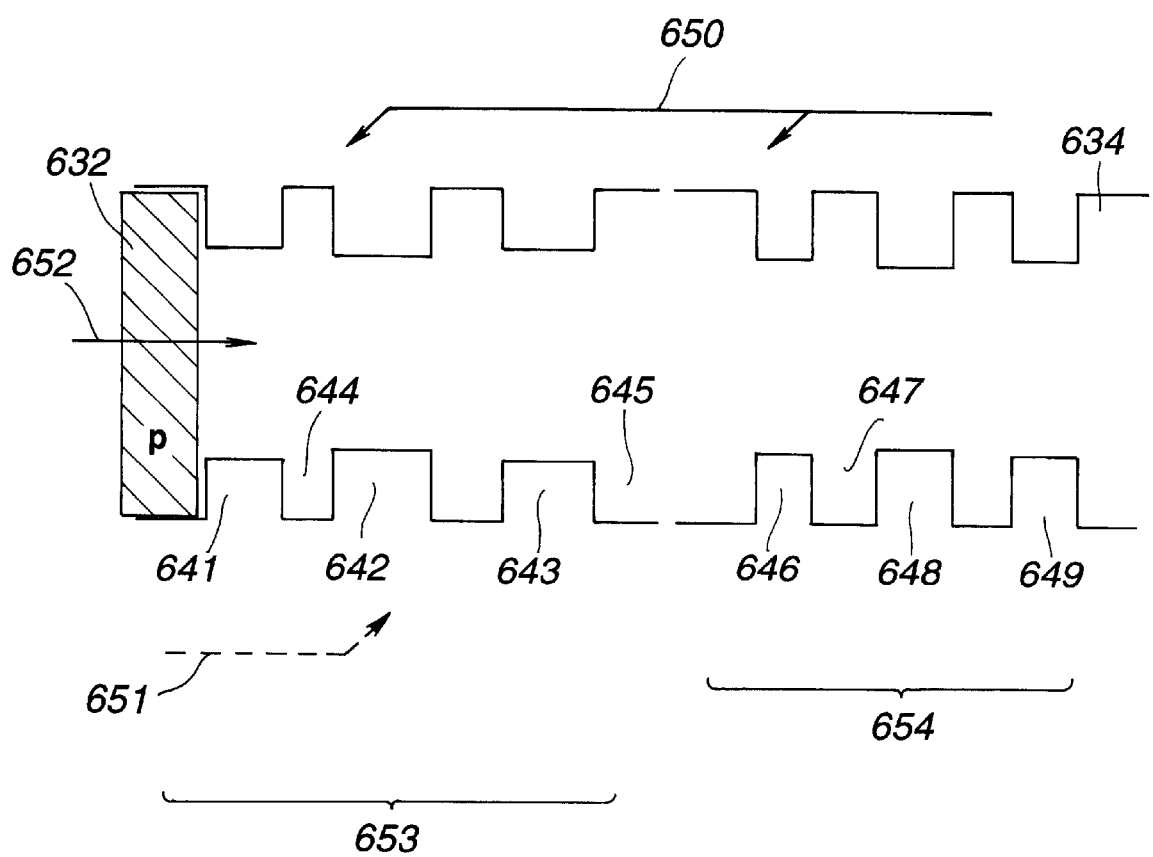
FIG. 27 illustrates the band gap structure of layers around an active layer used in a fourteenth embodiment.

In the tensile-strained region 653 of FIG. 27, the reason a well layer, whose gain is desired to be preferentially generated, is placed near the p-type layer (the supply side of holes 651 opposite to the supply side of electrons 650)) is described in the thirteenth embodiment.

Then, the structure of the compressively-strained active region for generating the gain for the TE mode will be described. Initially, a barrier layer 645 for separating the tensile-strained active region 653 from the compressively-strained active region 654 is formed on the tensile-strained well layer 643. Its composition is undoped InGaAsP and its thickness is 150 Å. On the barrier layer 645, a 0.4% compressively-strained undoped InGaAs layer 646 is formed with a thickness of 30 Å. An undoped InGaAsP barrier layer 647 is then laid down over the layer 646. No strain is introduced into the barrier layer 647. Further, a 0.4% compressively-strained undoped InGaAs layer 648 is formed with a thickness of 50 Å. An undoped InGaAsP barrier layer, which is the same as the layer 647, is then laid down over the layer 646. No strain is introduced into this barrier layer. Then, a 0.4% compressively-strained undoped InGaAs layer 649 is formed with a thickness of 40 Å. An upper light guide layer 634 of Si-doped InGaAsP is formed with a thickness of 0.2 μm. Such is the structure of the compressively-strained region 654. Due to the compressively-strained region 654, the gain for the TE mode can be unified over a wide wavelength range from about 1470 nm to 1530 nm (i.e., a band width of 60 nm) as indicated by a line 659 in FIG. 28.

A wavelength range, over which gains for both of the TE mode and the TM mode are approximately constant and balance, extends over a width of about 50 nm from 1480 nm to 1530 nm. If the TE-mode and TM-mode gains do not well balance under its near-threshold condition even by the above layer structure, an additional well layer, which can provide a gain for a wavelength range with an insufficient gain, only needs to be formed to improve the balance of gains. Further, in this embodiment, though three well layers are provided in each of the tensile-strained region 653 and the compressively-strained region 654, the number of the well layers is not limited to this number.

In this embodiment, a well layer with the narrowest thickness is formed adjacent to a well layer with the largest thickness to acquire the gain over a wide range. Thus, this embodiment can be applied to a structure having at least two layers. As an arrangement of a plurality of well layers, it is desirable that well layers with the narrowest thickness and the largest thickness are adjacently grown, then well layers with the second narrowest thickness and the second largest thickness are adjacently grown, then well layers with the third narrowest thickness and the third largest thickness are adjacently grown, and so on. Thus, gains on shorter and longer wavelength sides in a needed wavelength range can be preferentially acquired, and the gains can be unified.

The switching method between the TE mode and the TM mode is the same as that of the third embodiment. Also in this embodiment, a gain difference between the TE mode and the TM mode in the active layer is small, and the gains are stable over a wide range. Thus, a semiconductor optical laser, such as a semiconductor laser which can stably switch its oscillation mode between the TE mode and the TM mode, can be realized.

Fifteenth Embodiment

A fifteenth embodiment will be described with reference to FIG. 29. The entire structure of the fifteenth embodiment is the same as illustrated in FIG. 10.

The layer structure of the active region 113 will be described with reference to FIG. 29. The feature of this embodiment is that the active layer is doped with p-type impurities to cause electrons to function as control carriers. In FIG. 29, an arrow 732 indicates a direction of layering. Reference numeral 112 designates the Si-doped light guide region illustrated in FIG. 10. The structure of the active layer 113 is divided into a tensile-strained region 734 and a compressively-strained region 733.

Figure 30:
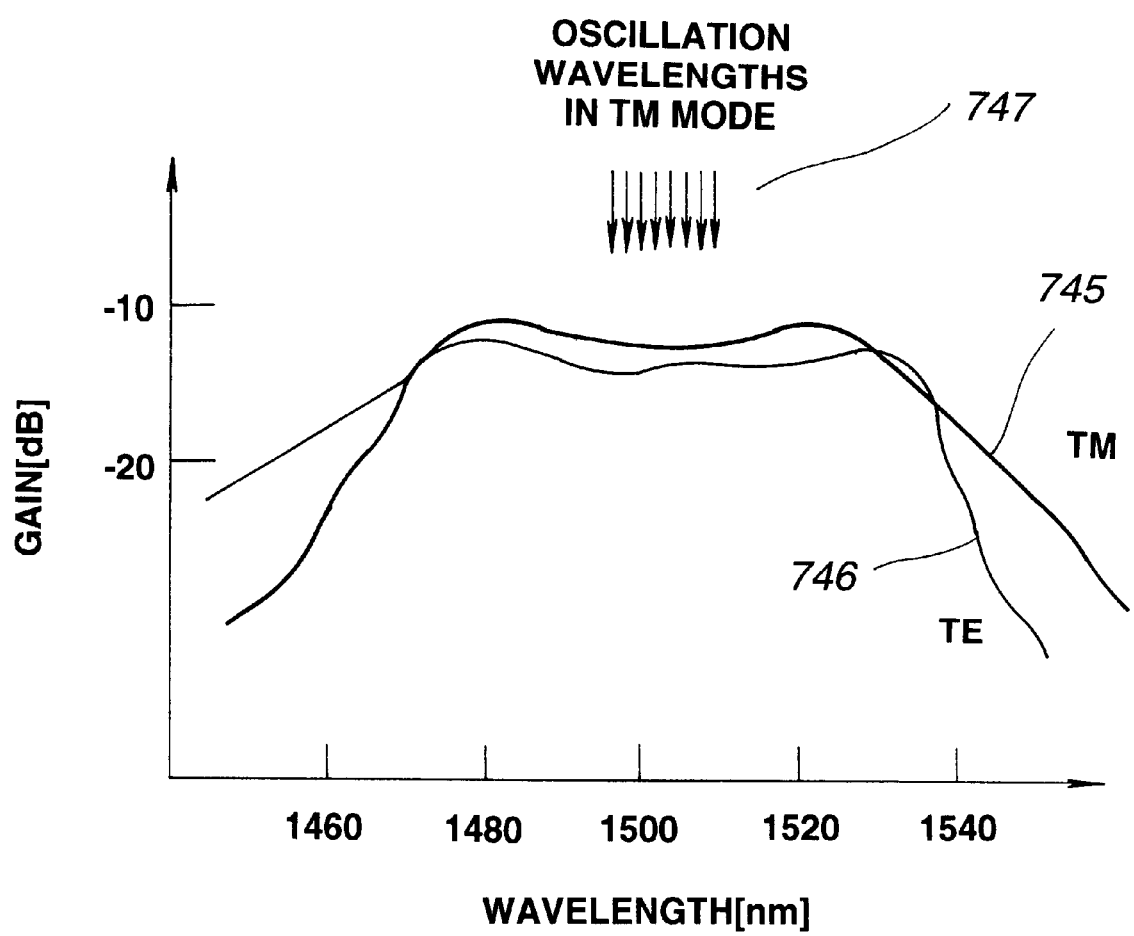
FIG. 30 is a view illustrating gain spectra for the TE mode and the TM mode in the fifteenth embodiment and oscillation wavelengths in the TM mode in a laser array.

The structure of the compressively-strained region 733 for generating the gain of the TE mode will be described. On the light guide layer 112, a well layer 721 of undoped InGaAsP is initially grown with a thickness of 50Å. A compressive strain of 0.8% is introduced into the well 721. Then, a barrier layer 722 is grown. The layer 722 is comprised of Be-doped InGaAsP, and no strain is introduced into the layer 722. On the barrier layer 722, a well layer 723 is laid down. The well layer 723 is composed of undoped InGaAsP, its thickness is 70 Å and its compressive strain amount is 0.8%. Then, a barrier layer, whose composition is the same as that of the barrier layer 722 and into which no strain is introduced, is formed. On this barrier layer, a well layer 724 of undoped InGaAsP is formed with a thickness of 60 Å and a compressive strain amount of 0.8%. Then, a barrier layer 725 for separating the compressively-strained active region 733 from the tensile-strained active region 734 is formed on the well layer 724. Its composition is Be-doped InGaAsP, and its thickness is 200 Å. The compressively-strained active region 733 has such a construction. As indicated by a line 746 in FIG. 30, the gain of the TE mode can have an approxilately uniform magnitude over a range from 1480 nm to 1540 nm (i.e., a wide band width of about 60 nm) due to the presence of the compressively-strained active region 733.

The structure of the tensile-strained region 734 will be described. On the barrier layer 725, a well layer 726 of undoped InGaAs is initially grown with a thickness of 80 Å. A tensile strain of 1.0% is introduced into the well layer 726. Then, a barrier layer 727 is grown. The layer 727 is comprised of a Be-doped InGaAsP layer having a thickness of 100 Å, and a compressive strain of 0.2% is introduced into the layer 727. On the barrier layer 727, a well layer 728 is laid down. The well layer 728 is composed of undoped InGaAs, its thickness is 120 Å and its tensile strain amount is 1.0%. Then, a barrier layer, whose composition is the same as that of the barrier layer 727 and whose thickness is 100 Å, is formed. On this barrier layer, a well layer 729 of undoped InGaAs is formed with a thickness of 100 Å and a tensile strain amount of 1.0%. Such is the structure of the tensile-strained region 734. The well layers 726 and 728 with a small thickness and a large thickness are formed adjacently to each other so that gains in shorter and longer wavelength ranges can be preferentially acquired. Hence, an approximately uniform gain can be obtained over a wide wavelength range. As indicated by reference numeral 745 in FIG. 30, due to those well layers 726 and 728, the gain for the TM mode can be approximately uniform over a range from 1470 nm to 1530 nm.

Figure 29:
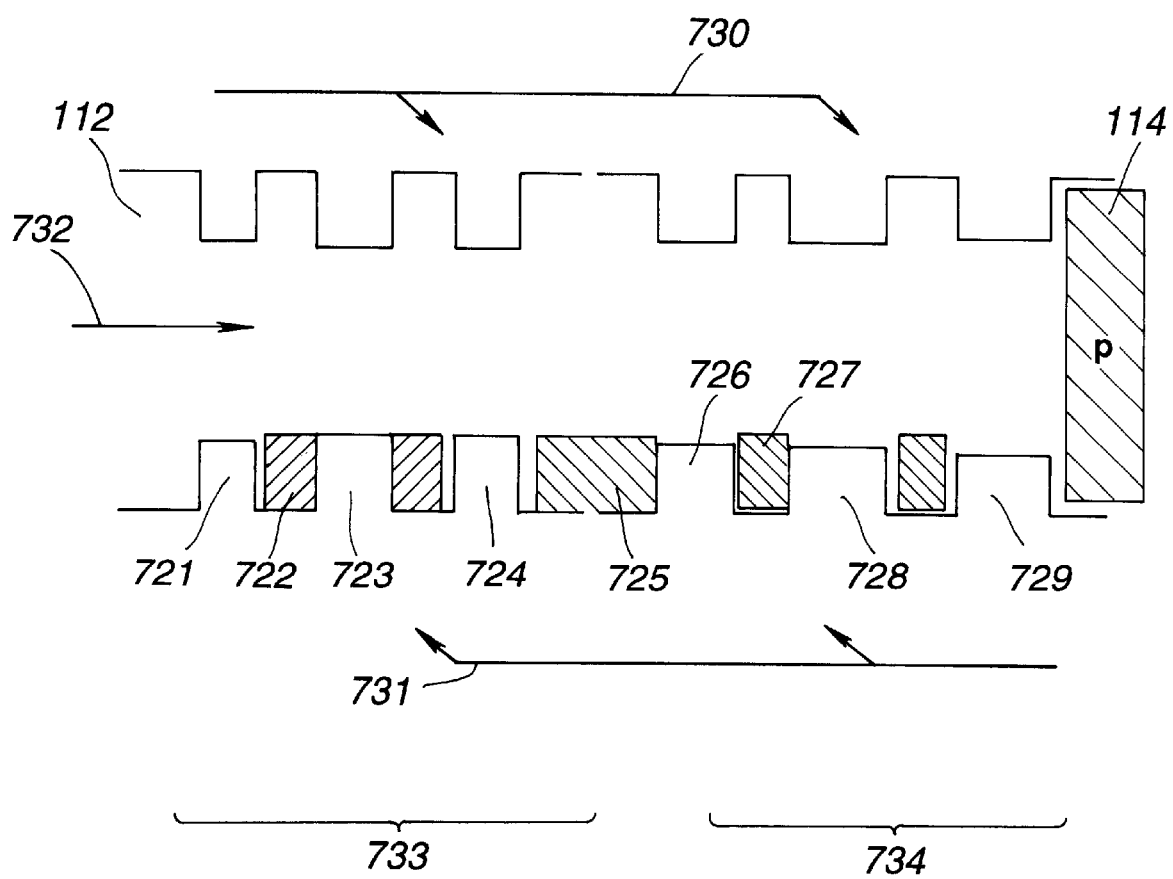
FIG. 29 illustrates the band gap structure of layers around an active layer used in a fifteenth embodiment.

In FIG. 29, the reason for the p-type doping of the barrier layers in the active layer 113 is to lower the threshold current density. Further, due to the p-type doping, uniformity of the gains of the active layer is promoted by using electrons 730, which are easier to diffuse, as control carriers. As a result, it is possible to achieve the oscillation and the switching in a low-current range due to the readily-diffusible electrons.

The reason for placing a well layer, whose gain is desired to be preferentially acquired, near the side of the n-conduction type in the compressively-strained region 733 in FIG. 29 is described above. Namely, uniformity of the gains in a wide wavelength range is promoted by preferentially supplying minority carriers to the well layers on shorter and longer wavelength sides. Further, in this emodiment, though only the barrier layers are doped with p-type impurities, the well layers may also be p-doped. Furthermore, it is possible to dope only the compressively-strained region 733 while not Be-doping the tensile-strained region 734. Hence, the rise of the TE-mode gain can be improved and the switching in a low-current range is achieved.

The operation of the fifteenth embodiment is the same as that of the fourth embodiment.

As described in the foregoing, in order to widen the gain-constant ranges due to the tensile-strained and compressively-strained regions, thicknesses of the well layers are varied and the p-doped active layer is used in this embodiment. Thus, the range, over which the TE-mode and TM-mode gains are approximately constant, can be freely set, and thus an optical semiconductor device, such as a semiconductor laser with approximately constant gains in a wide range, can be achieved.

An array laser can be constructed by using the above active layer as a common active layer. For example, the array laser is constructed such that eight different oscillation wavelengths in the TM mode can be emitted from respective lasers as illustrated by reference numeral 747 in FIG. 30. Since a wide wavelength range, over which gains for the TE mode and the TM mode are approximately uniform and balance, can be formed, a multi-wavelength array laser can be readily fabricated with a small number of process steps by using a common active layer.

In the thirteenth to fifteenth embodiments, a well layer with the smallest thickness is placed on the minority carrier supply side and a well layer with the largest thickness is formed adjacent thereto in each of the tensile-strained and compressively-strained regions. However, if necessary, tensile-strained and compressively-strained wells may be treated in a mixed way, and a well layer with the smallest thickness out of all well layers is placed on the minority carrier supply side while a well layer with the largest thickness out of all well layers is formed adjacent thereto. Thus, gains in shorter and longer wavelength regions can be preferentially acquired.

Sixteenth Embodiment

Figure 31:
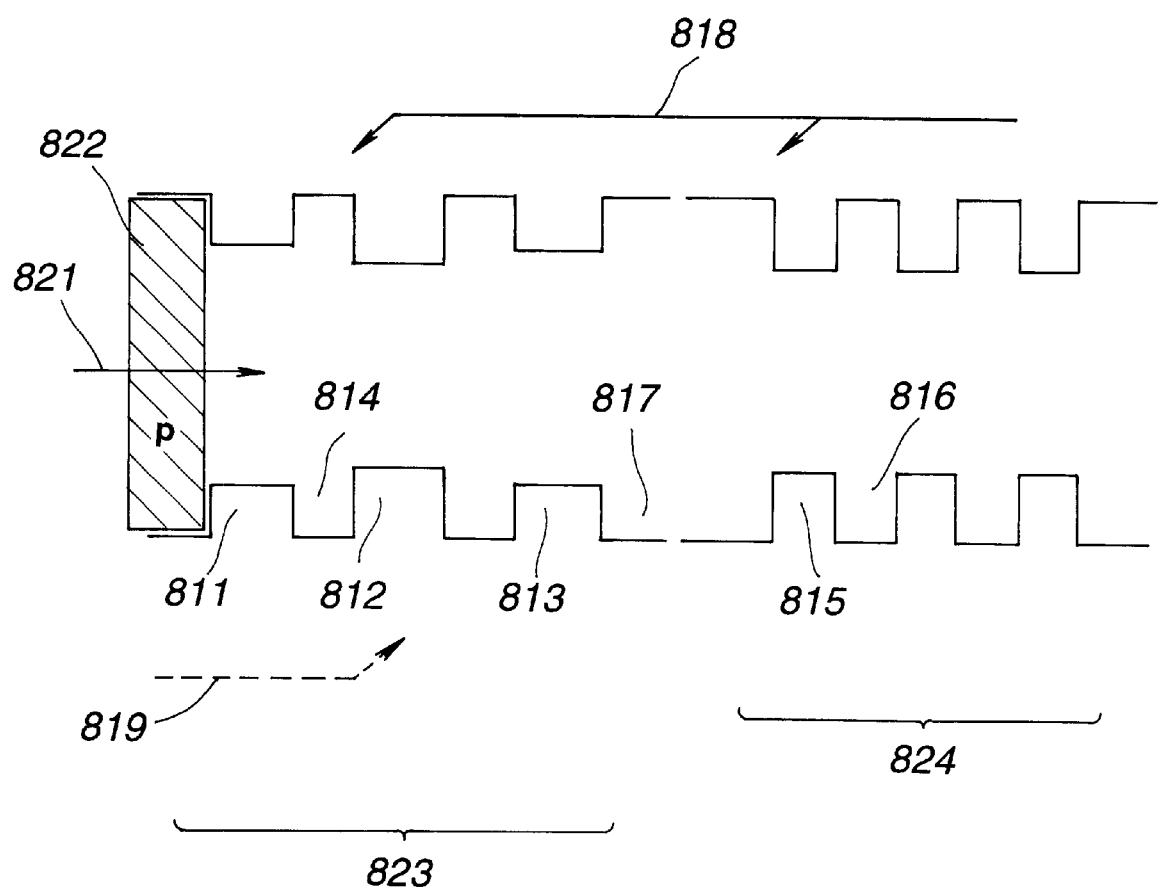
FIG. 31 illustrates the band gap structure of layers around an active layer used in a sixteenth embodiment.
Figure 32:
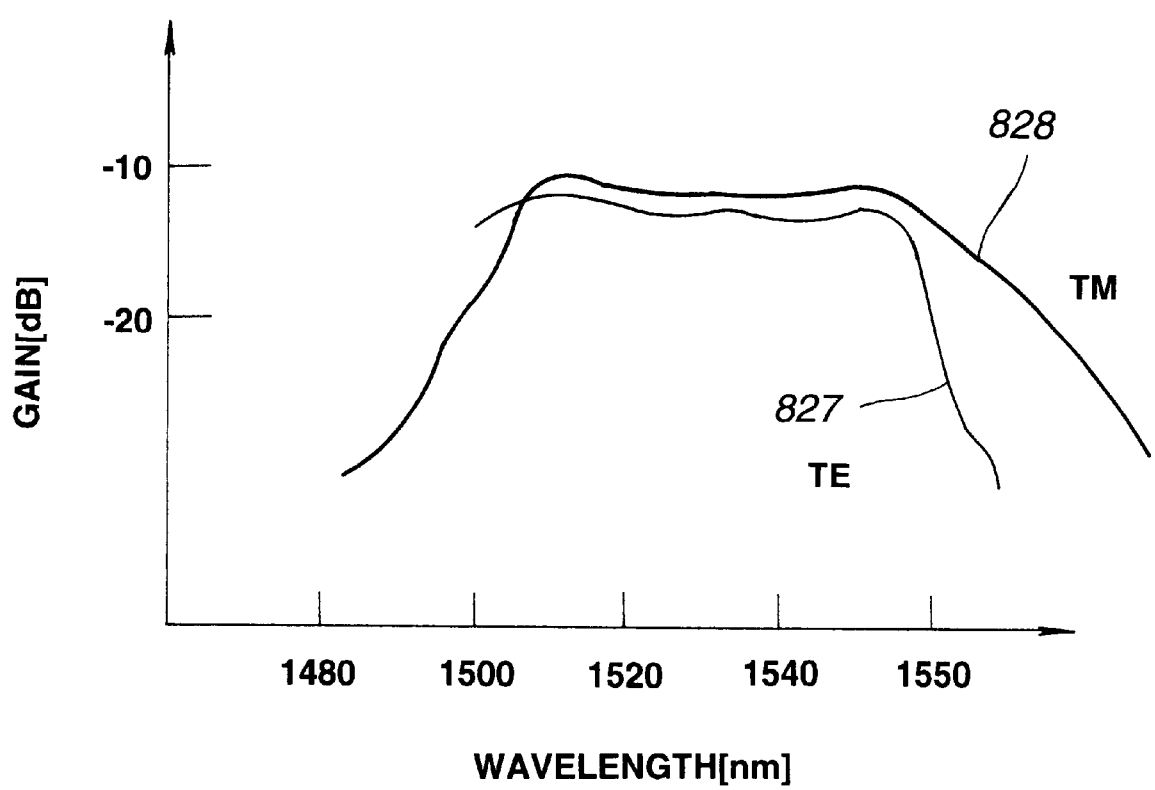
FIG. 32 is a view illustrating gain spectra for the TE mode and the TM mode in the sixteenth embodiment.

A cross section of the entire structure of a polarization selective laser of a sixteenth embodiment in its cavity direction is the same as that illustrated in FIG. 1A. In the sixteenth embodiment, a well layer, whose gain should be preferentially generated, is placed on the minority-carrier supply side as illustrated in FIGS. 31 and 32.

The layer structure of the active region 3 will be described with reference to FIG. 31 that illustrates the band gap structure. In FIG. 31, an arrow 821 indicates a direction of layering. Reference numeral 822 designates a Be-doped light guide region which corresponds to the light guide layer 2 in FIG. 1A. The structure of the active layer 3 is divided into a tensile-strained region 823 and a non-strained region 824.

The structure of the tensile-strained region 823 will be described. On the light guide layer 822, a well layer 811 of undoped InGaAs is initially grown with a thickness of 120 Å. A tensile strain of 1.2% is introduced into the well layer 811. Then, a barrier layer 814 is grown. The layer 814 is comprised of an undoped InGaAsP layer having a thickness of 100 Å, and a compressive strain of 0.2% is introduced into the layer 814. The compressive strain opposite to the tensile strain is introduced into the barrier layer 814 to improve the crystal quality of the well layer and the like due to the strain compensation effect.

On the barrier layer 814, a well layer 812 is laid down. The well layer 812 is composed of undoped InGaAs, its thickness is 120 Å and its tensile strain amount is 0.6%. Then, a barrier layer, whose composition is the same as that of the barrier layer 814 and whose thickness is 100 Å, is formed. On this barrier layer 814, a well layer 813 of undoped InGaAs is formed with a thickness of 120 Å and a tensile strain amount of 0.9%. Such is the structure of the tensile-strained region 823. Since the strain amounts of the well layers 811, 812 and 813 are set as described above, band gaps of the respective well layers are varied from each other and hence oscillation wavelengths thereof are varied (i.e., as the tensile strain amount increases, the interval between quantum levels is widened to expand its band gap). Together therewith, since the well layer 811 with a large strain amount and the well layer 812 with a small strain amount are formed adjacently to each other, it is possible to acquire gains in regions where the gain is conventionally low. Thus, an approximately constant gain can be obtained over a wide wavelength range.

FIG. 32 illustrates the gain distribution or profile obtained by that active region. As indicated by a line 828 in FIG. 32, the gain of the TM mode is approximately uniform over a range from 1500 nm to 1550 nm due to the presence of the above-discussed well layers.

In the tensile-strained region 823 of FIG. 31, the reason a well layer, whose gain is desired to be preferentially generated, is placed near the p-type layer is as follows. As described above, the diffusion distance of p-type holes 819 is relatively short compared with that of n-type electrons 818, and thus the diffusion length of holes 819 is short while n-type electrons 818 are supplied over the entire active layer as illustrated in FIG. 31. Thus, initially the well layer located near the p-side can acquire the gain more easily. On the other hand, the band gap of the well material expands to raise the ground level as the strain amount of the tensile-strained well layer increases. Hence, a barrier difference between the barrier layer and the quantum level becomes harder to obtain and the confinement of carriers is lowered therein. As a result, it is considered that the gain is hard to uniformly generate when the well layer with a large strain (i.e., with a large band gap) is formed aloof from the p-type layer. Therefore, the well layer in the tensile-strained region, whose strain amount is large, is positioned near the p-side in order to compensate for the decrease in the carrier confinement.

The reason the well layer with the smallest strain amount is formed adjacent to the well layer with the largest strain amount is that gains on shorter and longer wavelength sides, where the decrease in the gain is conventionally very large, are compensated for thereby to widen a wavelength range over which a sufficient gain is obtained. Hence, as shown in FIG. 32, it is possible to preferentially acquire the gains on shorter and longer wavelength sides in the tensile-strained region 823, and a substantially uniform gain can be obtained over a wide wavelength range. If a sufficiently uniform gain can not be attained even by that structure, an additional well layer, which can provide a gain in a wavelength range with a small gain, only needs to be formed.

Here, the tensile-strained well layers 811, 812 and 813 generate not only the gain for the TM mode but also the gain for the TE mode, as already described. In a well layer with a tensile strain of 1.0%, a peak wavelength of the gain for the TE mode generated thereby is on a shorter wavelength side than that of the gain for the TM mode generated thereby, and this difference is about 20 nm under a current-injected condition near its threshold.

Then, the structure of the non-strained active region 824 for generating the gain for the TE mode will be described. Initially, a barrier layer 817 for separating the tensile-strained active region 823 from the non-strained active region 824 is formed on the tensile-strained well layer 813. Its composition is undoped InGaAsP and its thickness is 150 Å. On the barrier layer 817, a non-strained undoped InGaAs layer 815 is formed with a thickness of 6 nm. An undoped InGaAsP barrier layer 816 is then laid down over the layer 815. No strain is introduced into the barrier layer 816, and its thickness is 100 Å. Three well layers 815 of the same structure and two barrier layers 816 of the same structure are deposited. The non-strained active region 824 has such a construction.

An oscillation wavelength range of the non-strained active region 824 has a center wavelength of 1500 nm, and a wavelength width of an approximately uniform gain for the TE mode is about 20 nm. In this embodiment, the gain for the TE mode consists of the gain generated by the non-strained active region 824 and the gain for the TE mode generated by the tensile-strained active region 823. Therefore, the total wavelength range of an approximately uniform gain for the TE mode is wider than the wavelength range of an approximately uniform gain for the TE mode generated by the non-strained well region 824 only, and extends from about 1500 nm to about 1550 nm (i.e., a band width of about 50 nm), as illustrated by reference numeral 827 in FIG. 32.

A method for driving the above-discussed sixteenth embodiment with the above construction is the same as that of the first embodiment.

As described in the foregoing, in the sixteenth embodiment, strain amounts of the well layers in the tensile-strained active region are made different from each other and well layers with the largest and smallest strain amounts are placed on the p-side to widen a wavelength range over which gains are approximately uniform and balance. Thus, a semiconductor optical device, such as a semiconductor laser whose gains are approximately uniform and balance over a wide wavelength range, can be established.

Well layers with various strain amounts are not limited to the tensile-strained wells. The compressively-strained well layers may have various strain amounts to improve the wavelength range of a uniform gain. Further, where the well layer of a large strain amount is located near the p-side layer, there is an assumption that the well or barrier in the active layer, to which holes are hard to diffuse, is undoped or n-doped.

Seventeenth Embodiment

A seventeenth embodiment will be described with reference to FIGS. 33 and 34. In this embodiment, propagation constants of the waveguides are beforehand controlled so that the switching between the TE mode and the TM mode can be stably performed by the phase control.

The entire structure of this embodiment is the same as illustrated in FIGS. 7A and 7B, except that the substrate is composed of a p-InP layer and conduction types of respective layers are differently set.

The structure of the active layer will be described with reference to FIG. 33. The feature of this embodiment is that an expansion of a wavelength range, over which a gain with an enough magnitude is obtained due to various strain amounts, is executed not only in the tensile-strained region but in the compressively-strained region. In FIG. 33, an arrow 852 indicates a direction of layering. Reference numeral 832 designates a Be-doped light guide region which corresponds to the layer 62 in FIG. 7A. The structure of the active layer is divided into a tensile-strained region 853 and a compressively-strained region 854.

The structure of the tensile-strained region 853 will be described. On the light guide layer 832, a well layer 841 of undoped InGaAs is initially grown with a thickness of 130 Å. A tensile strain of 1.1% is introduced into the well layer 841. Then, a barrier layer 844 is grown. The layer 844 is comprised of an undoped InGaAsP layer having a thickness of 80 Å, and a compressive strain of 0.2% is introduced into the layer 844.

On the barrier layer 844, a well layer 842 is laid down. The well layer 842 is composed of undoped InGaAs, its thickness is 130 Å and its tensile strain amount is 0.7%. Then, a barrier layer, whose composition is the same as that of the barrier layer 844 and whose thickness is 80 Å, is formed. On this barrier layer, a well layer 843 of undoped InGaAs is formed with a thickness of 130 Å and a tensile strain amount of 0.9%. Such is the structure of the tensile-strained region 853.

Figure 33:
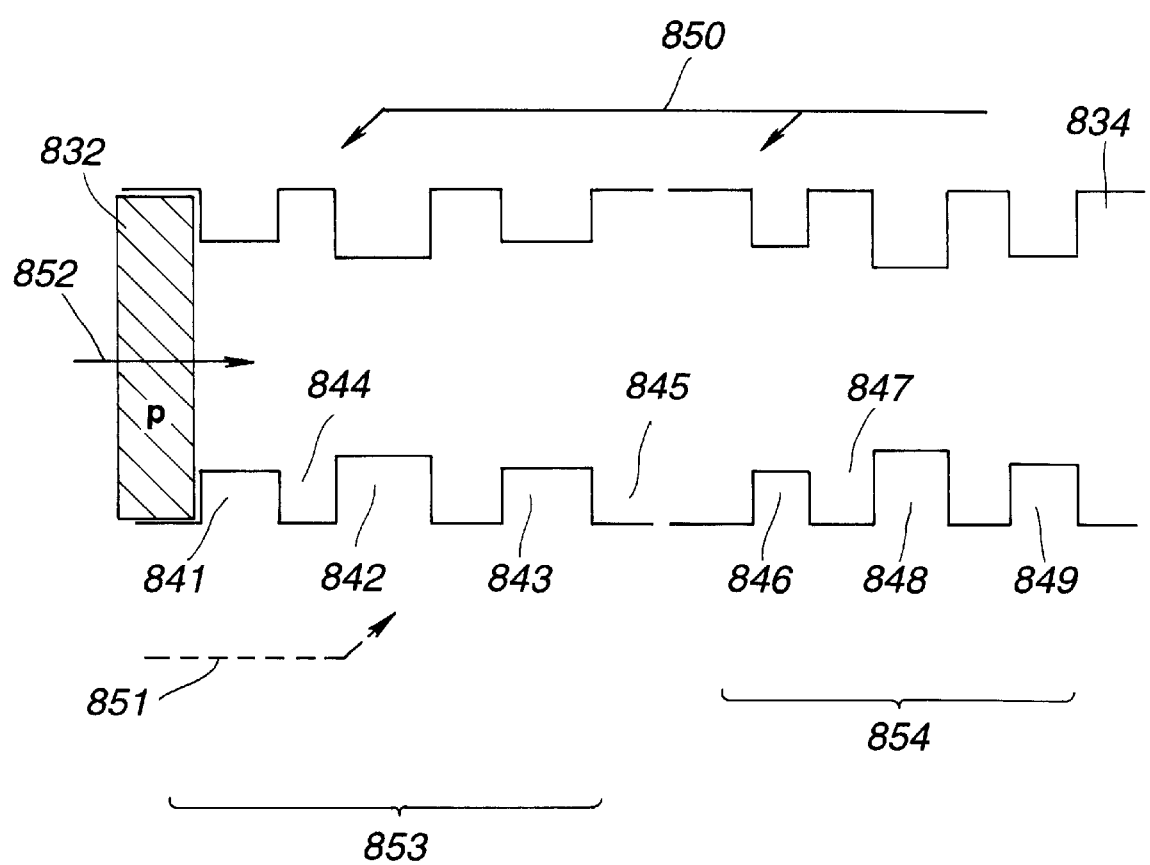
FIG. 33 illustrates the band gap structure of layers around an active layer used in a seventeenth embodiment.
Figure 34:
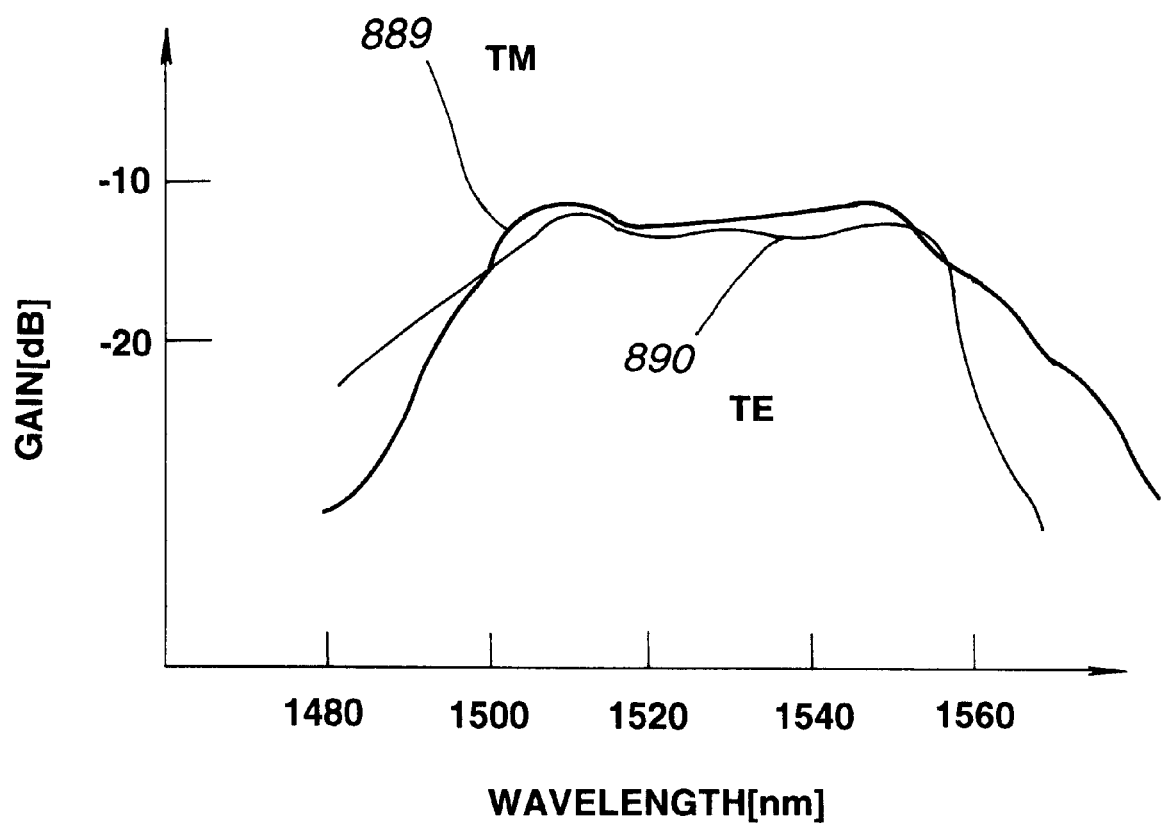
FIG. 34 is a view illustrating gain spectra for the TE mode and the TM mode in the seventeenth embodiment.

FIG. 34 illustrates the gain distribution or profile obtained by that active region. Since strain amounts of the well layers 841, 842 and 843 illustrated in FIG. 33 are varied from each other, their band gaps are varied from each other and their oscillation wavelengths diverge from each other. At the same time, since the well layer 841 with a large strain amount is formed adjacent to the well layer 842 with a small strain amount in this embodiment, the gain in a region with a low gain can be increased and hence a range, over which the gain is approximately uniform, can be widened. As a result, as illustrated by a line 889 in FIG. 34, the gain of the TM mode can have an approxilately uniform magnitude over a range from 1500 nm to 1560 nm.

In the tensile-strained region 853 of FIG. 33, the reason a well layer, whose gain is desired to be preferentially generated, is placed near the p-type layer is described in the sixteenth embodiment.

Hence, as shown in FIG. 34, it is possible to regulate the gains of the well layers in the tensile-strained region 853, and a substantially uniform gain can be obtained over a wide wavelength range. If a sufficiently uniform gain can not be attained even by that structure, an additional well layer, which can provide a gain in a wavelength range with an insufficient gain, only needs to be formed. Also in this case, it is necessary that a well layer with a large strain amount is positioned near the p-side in the tensile-strained region 853.

Then, the structure of the compressively-strained active region 854 for generating the gain for the TE mode will be described. Initially, a barrier layer 845 for separating the tensile-strained active region 853 from the compressively-strained active region 854 is formed on the tensile-strained well layer 843. Its composition is undoped InGaAsP, and its thickness is 100 Å. On the barrier layer 845, a 0.6% compressively-strained undoped InGaAsP layer 846 is formed with a thickness of 5 nm. An undoped InGaAsP barrier layer 847 is then laid down over the layer 846. No strain is introduced into the barrier layer 847. Further, a 1.1% compressively-strained undoped InGaAsP well layer 848 is formed with a thickness of 5 nm. An undoped InGaAsP barrier layer, which is the same as the barrier layer 847, is then laid down over the layer 846. No strain is introduced into this barrier layer. Then, a 0.8% compressively-strained undoped InGaAs well layer 849 is formed with a thickness of 5 nm. An upper light guide layer 834 of Si-doped InGaAsP, which corresponds to the upper light guide layer 64 in FIG. 7A, is formed with a thickness of 0.2 μm. Such is the structure of the compressively-strained region 854.

In the compressive strain, when the well thickness remains unchanged, the strain amount increases as the content of In increases. Therefore, the band gap of InGaAsP used in the well is narrowed, i.e., its band gap wavelength is increased. In that structure, the band gap of the well layer 846 is the largest, and the band gap decreases as the strain amount increases in the order of the well layer 849 and the well layer 848. Therefore, in the well layers of the compressively-strained active region 854, their band gaps are varied from each other and their oscillation wavelengths diverge from each other. At the same time, since the well layer 846 with a small strain amount is formed adjacent to the well layer 848 with a large strain amount on the p-side, the gain in a region with a low gain can be increased and hence a range, over which the gain is approximately uniform, can be widened. In that compressively-strained region, the gain of the TE mode can be obtained over a wide range from about 1480 nm to 1550 nm (a band width of 70 nm).

In this embodiment, a wavelength range, over which gains for both of the TE mode and the TM mode are approximately constant and balance, extends over a width of about 50 nm from 1500 nm to 1550 nm. If the TE-mode and TM-mode gains do not well balance under a condition near the threshold even by the above layer structure, an additional well layer, which can provide a gain for a wavelength range with an insufficient gain, only needs to be formed to improve the balance of gains. Further, in this embodiment, though three well layers are provided in each of the tensile-strained region 853 and the compressively-strained region 854, the number of the well layers is not limited to this number.

In this embodiment, although the tensile-strained region is formed near the p-side, to which holes 851 of minority carriers are supplied, and the compressively-strained region is formed near the n-side, to which electrons 850 of majority carriers are supplied, this configuration is not necessary. The compressively-strained region may be formed at the minority-carrier supply side. What is needed in this embodiment is to place the well layers with the largest band gap and the smallest band gap, whose gains are preferentially needed, at the minority-carrier supply side in each of the tensile-strained region and the compressively-strained or non-strained region. If necessary, however, those srained regions can be treated in a mixed manner, and the well layers with the largest band gap and the smallest band gap out of all well layers may be placed at the minority-carrier supply side.

As described above, in this embodiment, the strain amounts of the well layers are varied and the well layers with a large band gap and a small band gap are formed at the p-side to widen a wavelength range with a sufficient gain in each of the tensile-strained and compressively-strained regions. Hence, in this embodiment, the gain distributions of the TE mode and the TM mode can be more freely set, compared with the sixteenth embodiment, and a semiconductor laser with approximately constant gains over a wide range can be achieved, as indicated by lines 889 and 890 in FIG. 34. Although the p-type substrate is used in this embodiment, an n-type substrate can be used likewise.

The switching method between the TE mode and the TM mode is substantially the same as that of the third embodiment. Also in this embodiment, a gain difference between the TE mode and the TM mode in the active layer is small and the gains are stable over a wide range. Thus, a semiconductor optical laser, such as a semiconductor laser which can stably switch its oscillation mode between the TE mode and the TM mode, can be realized.

Eighteenth Embodiment

An eighteenth embodiment will be described with reference to FIGS. 35 and 36. The entire structure of the eighteenth embodiment is the same as illustrated in FIG. 10.

The layer structure of the active region 113 of this embodiment will be described with reference to FIG. 35. The features of this embodiment are that the active layer is doped with p-type impurities 931 to cause electrons 930 to function as control carriers and that the band gap of a well layer placed near the n-side is set wide. In FIG. 35, an arrow 932 indicates a direction of layering. Reference numeral 112 designates the Si-doped light guide layer region. The structure of the active layer 113 is divided into a tensile-strained region 934 and a compressively-strained region 933.

The structure of the compressively-strained region 933 for generating the gain of the TE mode will be described. On the light guide layer 112, a well layer 921 of undoped InGaAsP is initially grown with a thickness of 4 nm. A compressive strain of 0.8% is introduced into the well 921. Then, a barrier layer 922 is grown. The layer 922 is comprised of Be-doped InGaAsP, and no strain is introduced into the layer 922. On the barrier layer 922, a well layer 923 is laid down. The well layer 923 is composed of undoped InGaAsP, its thickness is 4 nm and its compressive strain amount is 1.2%. Then, a barrier layer, whose composition is the same as that of the barrier layer 922 and into which no strain is introduced, is formed. On this barrier layer, a well layer 924 of undoped InGaAsP is formed with a thickness of 4 nm and a compressive strain amount of 1.0%. Then, a barrier layer 925 for separating the compressively-strained active region 933 from the tensile-strained active region 934 is formed on the well layer 924. Its composition is Be-doped InGaAsP and its thickness is 100 Å. The compressively-strained active region 933 has such a construction. As indicated by a line 946 in FIG. 36, the gain for the TE mode can have an approxilately uniform magnitude over a range from 1460 nm to 1540 nm (i.e., a wide band width of about 80 nm) due to the presence of the compressively-strained active region 933.

The structure of the tensile-strained region 934 will be described. On the barrier layer 925, a well layer 926 of undoped InGaAs is initially grown with a thickness of 130 Å. A tensile strain of 1.0% is introduced into the well layer 926. Then, a barrier layer 927 is grown. The layer 927 is comprised of Be-doped InGaAsP having a thickness of 100 Å, and a compressive strain of 0.2% is introduced into the layer 927. On the barrier layer 927, a well layer 928 is laid down. The well layer 928 is composed of undoped InGaAs, its thickness is 130 Å and its tensile strain amount is 0.6%. Then, a barrier layer, whose composition is the same as that of the barrier layer 927 and whose thickness is 100 Å, is formed. On this barrier layer, a well layer 929 of undoped InGaAs is formed with a thickness of 130 Å and a tensile strain amount of 0.8%. Such is the structure of the tensile-strained region 934. The tensile strain amounts of the well layers 926, 928 and 929 are varied from each other, so that band gaps of the respective well layers are varied and their oscillation wavelengths diverge from each other. Hence, gains due to the well layers 926, 928 and 929 are appropriately overlapped, and an approximately uniform gain can be obtained over a wide wavelength range. As indicated by reference numeral 945 in FIG. 36, due to those well layers 926, 928 and 929, the gain for the TM mode can be approximately uniform over a range from 1470 nm to 1550 nm.

Figure 35:
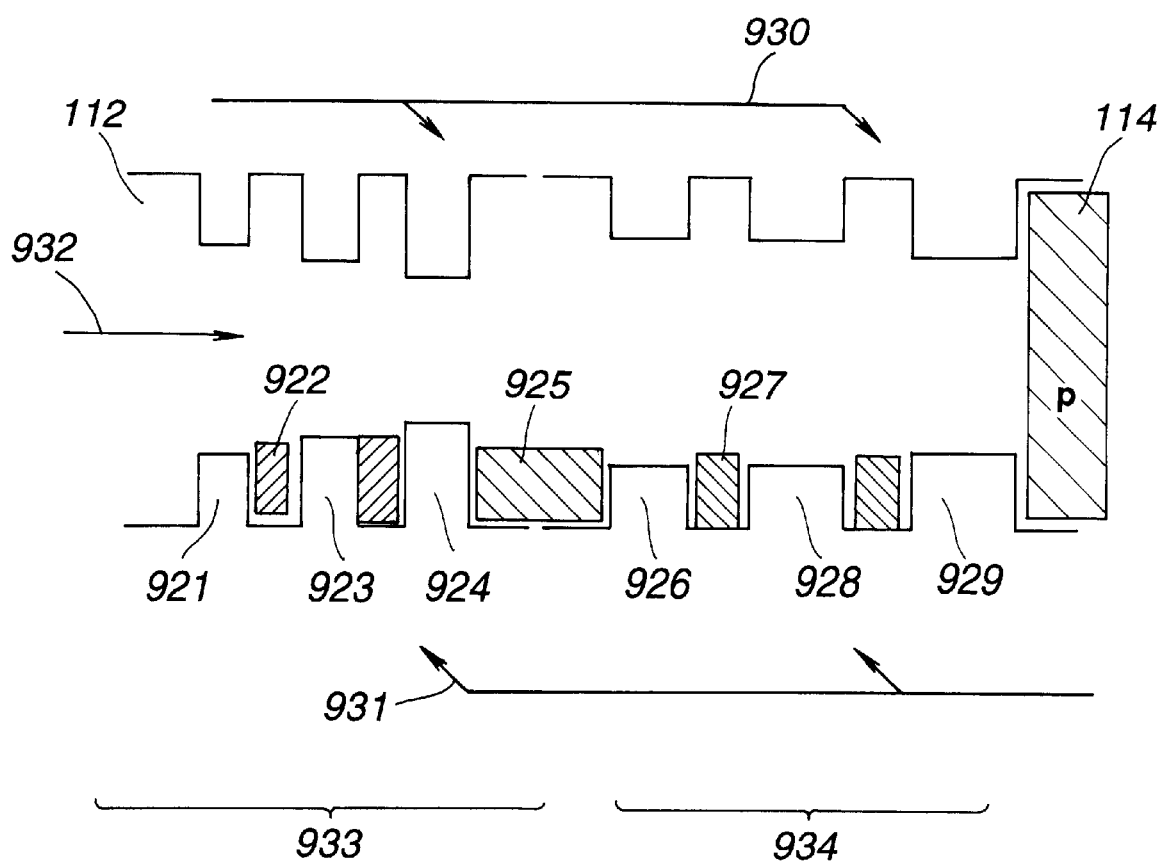
FIG. 35 illustrates the band gap structure of layers around an active layer used in an eighteenth embodiment.
Figure 36:
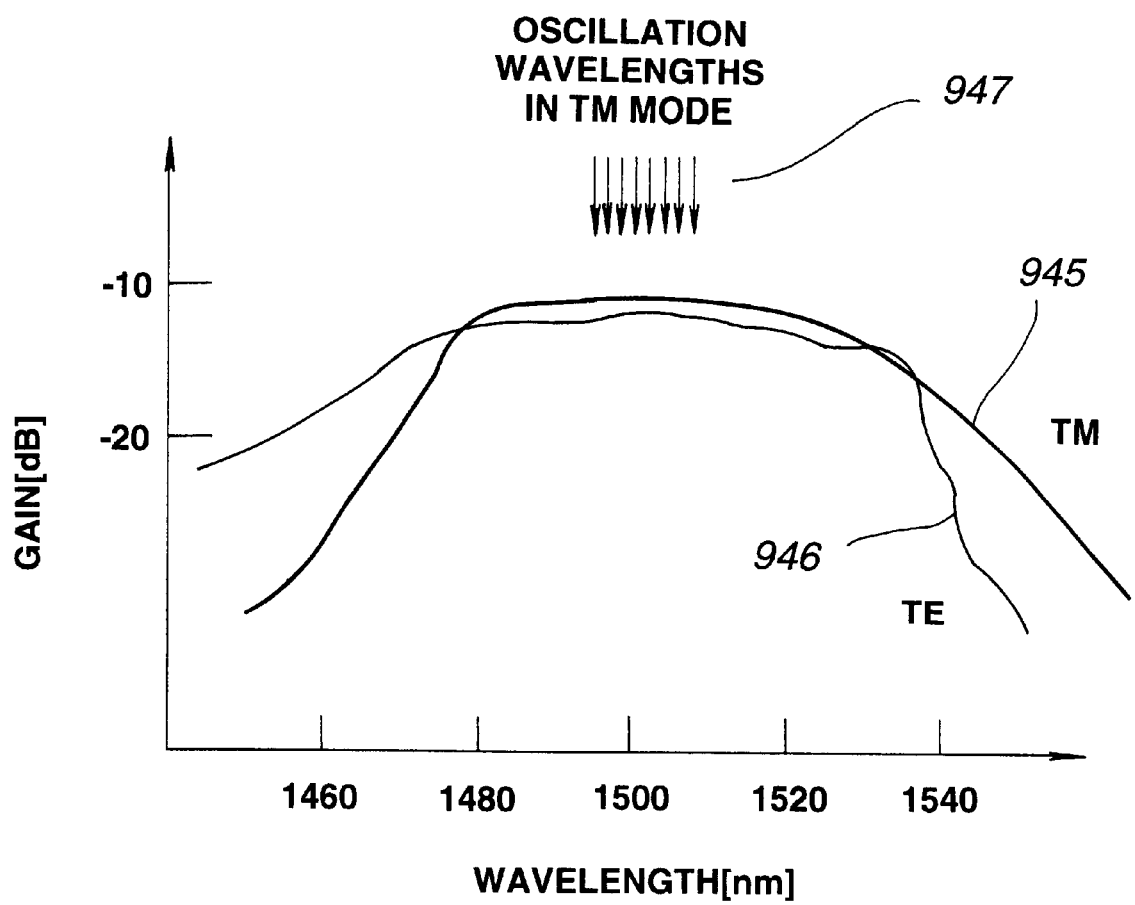
FIG. 36 is a view illustrating gain spectra for the TE mode and the TM mode in the eighteenth embodiment and oscillation wavelengths in the TM mode of the laser array.

In FIG. 35, the reason for the p-type doping of the barrier layers in the active layer 113 is to lower the threshold current density. Further, due to the p-type doping, uniformity of the gains of the active layer is promoted by using electrons 930 with a longer diffusion length as control carriers. As a result, it is possible to achieve the oscillation and the switching in a low-current range due to the readily-diffusible electrons.

The reason for placing a well layer, whose gain is desired to be preferentially acquired, near the side of the n-conduction type in the tensile-strained region 933 in FIG. 35 is described above. Namely, uniformity of the gains in a wide wavelength range is promoted. Further, in this emodiment, though only the barrier layers are doped with p-type impurities, the well layers may also be p-doped. Furthermore, it is possible to dope only the compressively-strained region 933 while not Be-doping the tensile-strained region 934. Hence, the rise of the TE-mode gain can be improved and the switching in a low-current range is achieved.

The operation of the eighteenth embodiment is the same as that of the sixteenth embodiment.

As described in the foregoing, in order to widen the gain-constant ranges in the tensile-strained and compressively-strained regions 934 and 933, band gaps of the well layers are varied (the relationship between the band gap and the strain amount in the tensile-strained region is opposite to that in the compressively-strained region) and the p-doped active layer is used in this embodiment. Thus, the range, over which the TE-mode and TM-mode gains are approximately constant, can be freely set, and thus an optical semiconductor device, such as a semiconductor laser with approximately constant gains in a wide wavelength range, can be achieved.

An array laser can be constructed by using the above active layer as a common active layer. In the array laser, a plurality of lasers are arranged in a lateral direction and an interval between oscillation wavelengths of the respective lasers is set to 1 nm by varying grating pitches of those lasers. For example, the array laser is constructed such that eight different oscillation wavelengths in the TM mode can

Nineteenth Embodiment

In a nineteenth embodiment, heights of barriers in an active alyer are made different from each other in addition to the control of band gaps in the active layer due to the control of strains in order to control supplied carriers and promote uniformity of the gain in a wide wavelength range.

Figure 37:
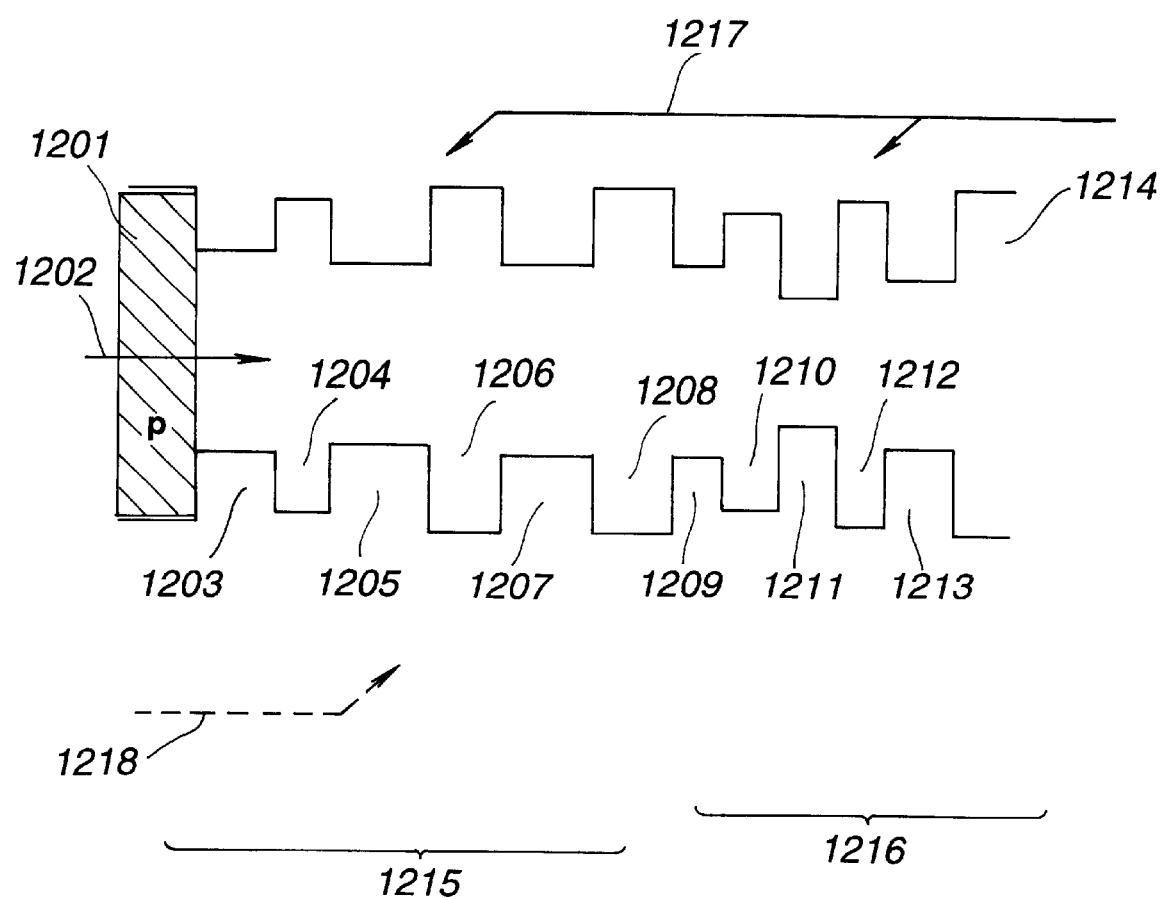
FIG. 37 illustrates the band gap structure of layers around an active layer used in a nineteenth embodiment.

The layer structure of the active region of this embodiment will be described with reference to FIG. 37. FIG. 37 shows the band gap structure of layers near the active layer. The structure of the other portion of this embodiment is the same as that of FIG. 1A.

In FIG. 37, reference numeral 1202 designates a direction of layering, and reference numeral 1201 designates a Be-doped light guide layer region which corresponds to the light guide layer region 2 in FIG. 1A. The active layer is divided into a tensile-strained active region 1215 and a compressively-strained active region 1216.

The structure of the tensile-strained active region 1215 will be described. On the light guide layer 1201, the following layers are formed in the following order. A well layer 1203 of undoped InGaAs is initially grown with a thickness of 135 Å. A tensile strain of 1.1% is introduced into the well 1203. Then, a barrier layer 1204 is grown. The layer 1204 is comprised of an undoped InGaAsP layer having a thickness of 100 Å and a band gap wavelength set to 1.20 μm, and a compressive strain of 0.2% is introduced into the layer 1204. On the barrier layer 1204, a well layer 1205 is laid down. The well layer 1205 is composed of undoped InGaAs, its thickness is 135 Å and its tensile strain amount is 0.65%. Then, a barrier layer 1206, whose composition is set such that its band gap wavelength is 1.15 μm (its band gap is wider than that of the barrier layer 1204), is formed with a thickness of 100 Å. On this barrier layer 1206, a 0.8% tensile-strained well layer 1207 of undoped InGaAs is formed with a thickness of 135 Å. Such is the structure of the tensile-strained region 1215. The band gaps or the barrier heights of the barrier layers 1204 and 1206 are made lower nearer the p-side whose carriers 1218 are harder to supply. Thus, carriers 1218 can be uniformly supplied to the active layer more effectively. As a result, wavelength ranges of gains due to the well layers 1203, 1205 and 1207 are appropriately overlapped, so that it is possible to obtain a wide wavelength range over which the gain is approximately uniform.

Then, the structure of a compressively-strained active region 1216 for generating the gain for the TE mode will be described. Initially, a barrier layer 1208 for separating the tensile-strained active region 1215 from the compressively-strained active region 1216 is formed on the tensile-strained well layer 1207. Its composition is undoped InGaAsP, its thickness is 100 Å and its band gap wavelength is set to 1.15 μm. On the barrier layer 1208, a 0.8% compressively-strained undoped InGaAsP well layer 1209 is formed with a thickness of 4 nm. An undoped InGaAsP barrier layer 1210 is then laid down over the layer 1209. No strain is introduced into the barrier layer 1210, and its band gap wavelength is set to 1.2 μm. On the barrier layer 1210, a 1.2% compressively-strained undoped InGaAsP well layer 1211 is formed with a thickness of 4 nm. An undoped InGaAsP barrier layer 1212 laid down over the well layer 1211 is non-strained and its band gap wavelength is set to 1.15 μm. Further, a 1.0% compressively-strained undoped InGaAsP layer 1213 is formed with a thickness of 4 nm. On the layer 1213, an upper light guide layer 1214 of Si-doped InGaAsP is formed with a thickness of 0.2 μm. Its band gap wavelength is set to 1.15 μm. Such is the structure of the compressively-strained region 1216.

As described above, the barrier height in the active layer near the side of carriers harder to supply, in this case holes 1218, is made smaller. Thus, the holes are easier to get over the barrier and can be uniformly spread over the active layer. In this embodiment, though the barrier height is controlled separately and independently between the tensile-strained region 1215 and the compressively-strained region 1216, the barrier height can be continuously varied from the p-side toward the n-side. For example, the height of the barrier layer 1208 may be lowered. The laser having such a structure can be driven in the same manner as the above embodiment.

Further, in this embodiment, the holes 1218 are carriers harder to move. However, as described in the eighteenth embodiment, it is possible to cause electrons 1217 to function as control carriers by p-doping the barrier or the well layer. In this case, as the barrier is closer to the n-side, its height is made lower such that the electrons 1217 are easier to supply to each well layer.

Twentieth Embodiment

In the nineteenth embodiment, heights or band gaps of barriers in the active layer are varied from each other to improve the supply of carriers which are hard to move. In a twentieth embodiment, thicknesses of barriers in the active layer are varied to control supplied carriers and unify gains at respective wavelengths. The structure of the active layer will be described with reference to FIG. 38. The other portion of this embodiment is the same as that illustrated in FIG. 1A.

Figure 38:
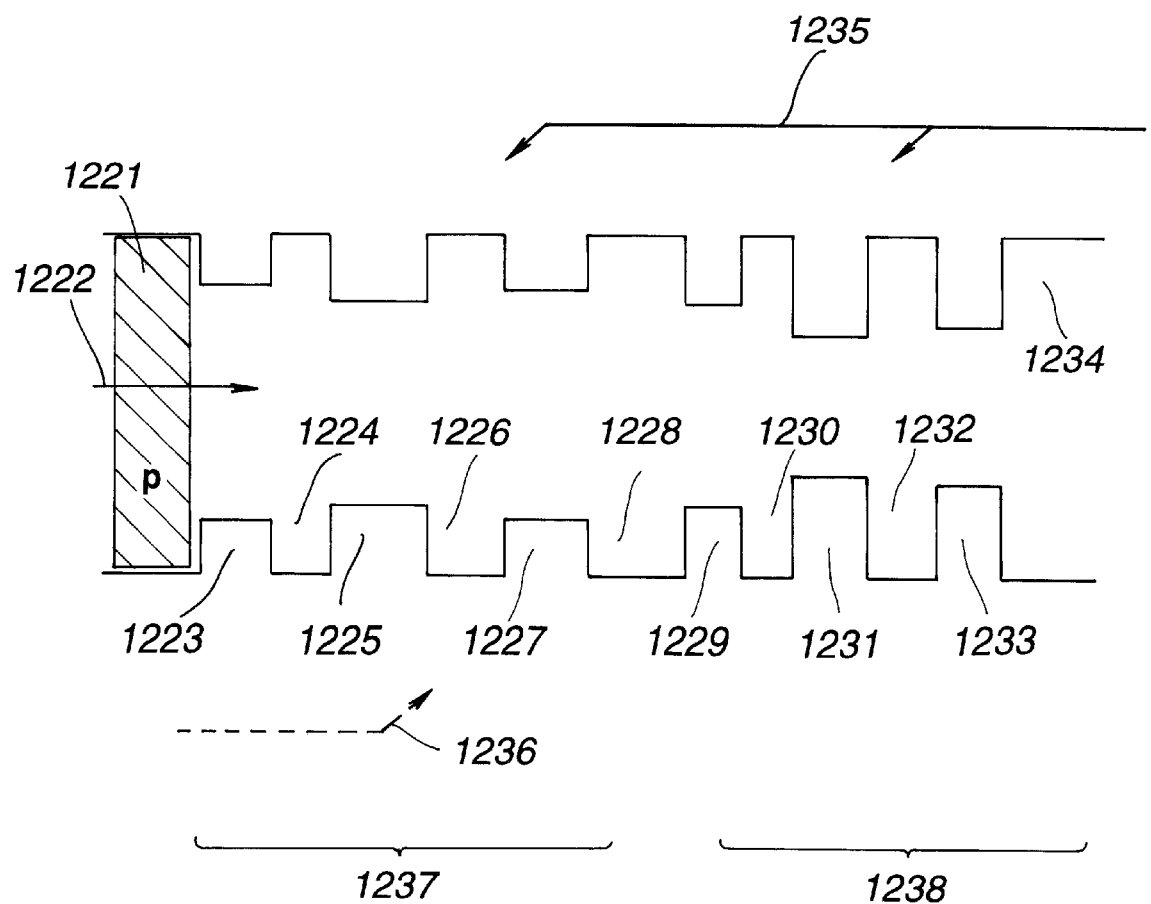
FIG. 38 illustrates the band gap structure of layers around an active layer used in a twentieth embodiment.

In FIG. 38, reference numeral 1222 designates a direction of layering, and reference numeral 1221 designates a Be-doped light guide layer region which corresponds to the light guide layer 2 in FIG. 1A. The active layer is divided into a tensile-strained active region 1237 and a compressively-strained active region 1238.

The structure of the tensile-strained active region 1237 will be initially described. On the light guide layer 1221, the following layers are formed in the following order. A well layer 1223 of undoped InGaAs is initially grown with a thickness of 130 Å. A tensile strain of 1.0% is introduced into the well 1223. Then, a barrier layer 1224 is grown. The layer 1224 is comprised of an undoped InGaAsP layer having a thickness of 60 Å, and a compressive strain of 0.2% is introduced into the layer 1224. On the barrier layer 1224, a well layer 1225 is laid down. The well layer 1225 is composed of undoped InGaAs, its thickness is 130 Å and its tensile strain amount is 0.6%. Then, a barrier layer 1226 having the same composition as that of the layer 1224 is formed with a thickness of 80 Å. On this barrier layer, a 0.8% tensile-strained well layer 1227 of undoped InGaAs is formed with a thickness of 130 Å. Such is the structure of the tensile-strained region 1237.

The band gaps of the well layers 1223, 1225 and 1227 are varied frm each other by varying the strain amounts thereof, and their oscillation wavelengths are varied from each other. As a result, wavelength ranges of gains due to the well layers 1223, 1225 and 1227 appropriately overlap, so that it is possible to obtain a wide wavelength range over which gains are approximately uniform. Additionally, in the twentieth embodiment, thicknesses or widths of the barriers 1224 and 1226 are varied to improve the supply of carriers which are harder to move.

The reason for placing a narrower barrier layer nearer the p-side in the tensile-strained region 1237 of FIG. 38 is the same as that described in the sixth embodiment.

Then, the structure of the compressively-strained active region 1238 for generating the gain for the TE mode will be described. Initially, a barrier layer 1228 for separating the tensile-strained active region 1237 from the compressively-strained active region 1238 is formed on the tensile-strained well layer 1227. Its composition is undoped InGaAsP, and its thickness is 100 Å. On the barrier layer 1228, a 0.2% compressively-strained undoped InGaAs layer 1229 is formed with a thickness of 4 nm. An undoped InGaAsP barrier layer 1230 is then laid down over the layer 1229. No strain is introduced into the barrier layer 1230, and its thickness is 60 Å. On the barrier layer 1230, a 0.6% compressively-strained undoped InGaAsP well layer 1231 is formed with a thickness of 4 nm. An undoped InGaAsP barrier layer 1232 laid down over the well layer 1231 has the same composition as that of the barrier layer 1230, and its thickness is 80 Å.

Further, a 0.4% compressively-strained undoped InGaAsP well layer 1233 is formed with a thickness of 4 nm. On the layer 1233, an upper light guide layer 1234 of Si-doped InGaAsP is formed with a thickness of 0.2 $\mu$m. Such is the structure of the compressively-strained region 1238.

As described above, the barrier thickness in the active layer near the side of carriers harder to supply, in this case holes 1236, is made thinner. Thus, the holes 1236 can more easily get over the barrier and can be uniformly spread over the active layer. The laser having such a structure can be driven in the same manner as the laser of the above embodiment.

In this embodiment, though the barrier thickness is controlled separately and independently between the tensile-strained region 1237 and the compressively-strained region 1238, the barrier thickness can be continuously varied from the p-side to the n-side, for example.

Further, in this embodiment, the holes are carriers harder to move. However, as described in the eighteenth embodiment, it is possible to cause electrons 1235 to function as control carriers by p-doping the barrier or the well layer. In this case, as the barrier is closer to the n-side, its thickness is made thinner such that the electrons can be more easily supplied to each well layer.

Twenty First Embodiment

Figure 39:
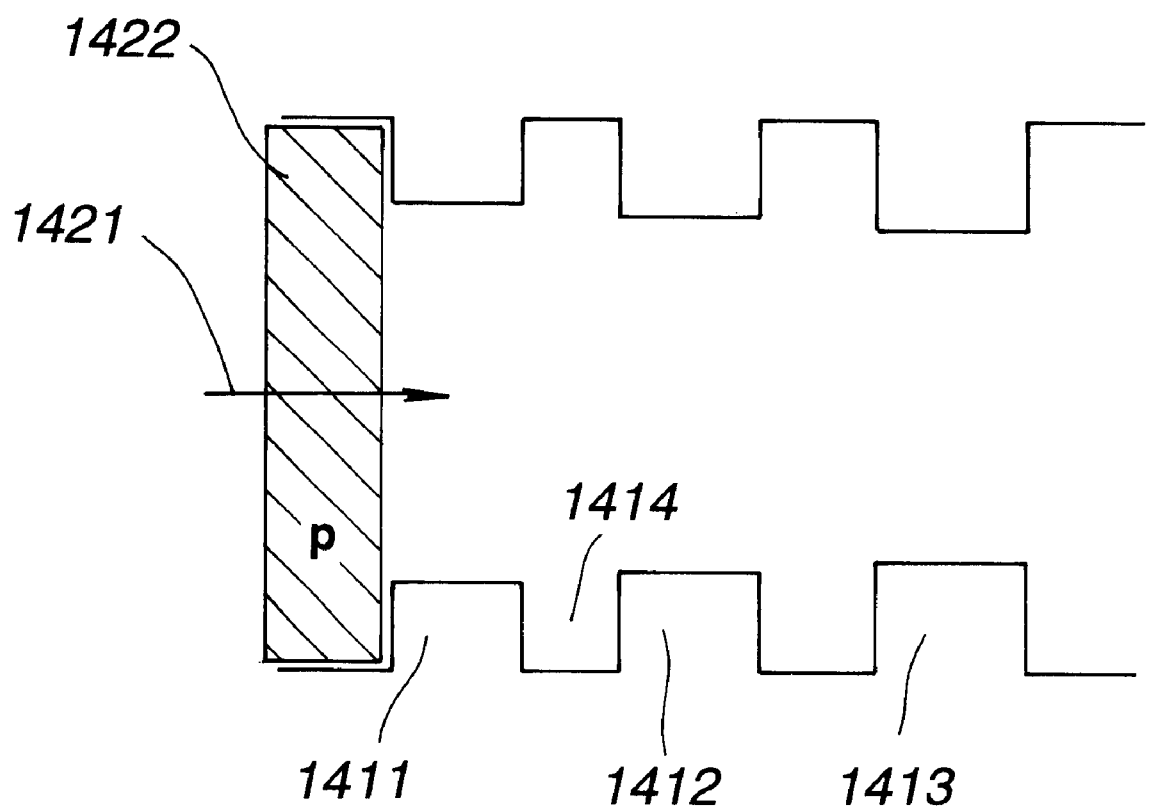
FIG. 39 illustrates the band gap structure of layers around an active layer used in a twenty first embodiment.

A twenty first embodiment will be described with reference to FIGS. 39 and 40. The twenty first embodiment is directed to a device whose actve layer consists of a plurality of tensile-strained well layers and barrier layers formed therebetween. A cross section of the entire structure of a polarization selective laser of the twenty first embodiment in its cavity direction is the same as that illustrated in FIG. 1A, except that a diffraction grating with a pitch of 242.1 nm and a depth of 500 Å is formed on a substrate of a p-InP layer 1.

The layer structure of an active region will be described with reference to FIG. 39 that illustrates its band gap structure. In FIG. 39, an arrow 1421 indicates a direction of layering. Reference numeral 1422 designates a Be-doped light guide layer region which corresponds to the light guide layer 2 in FIG. 1A. On the light guide layer 1422, a well layer 1411 of undoped InGaAs is initially grown with a thickness of 120 Å. A tensile strain of 0.7% is introduced into the well 1411. Then, a barrier layer 1414 is grown. The layer 1414 is comprised of an undoped InGaAsP layer having a thickness of 100 Å, and a compressive strain of 0.2% is introduced into the layer 1414. The compressive strain opposite to the tensile strain is introduced into the barrier layer 1414 to improve the crystal quality of the well layer and the like due to the strain compensation effect.

On the barrier layer 1414, a well layer 1412 is laid down. The well layer 1412 is composed of undoped InGaAs, its thickness is 120 Å and its tensile strain amount is 0.65%. Then, a barrier layer, whose composition is the same as that of the barrier layer 1414 and whose thickness is 100 Å, is formed. On this barrier layer 1414, a well layer 1413 of undoped InGaAs is formed with a thickness of 120 Å and a tensile strain amount of 0.6%. Such is the structure of the active layer 3. Strain amounts of the well layers 1411, 1412 and 1413 are set as above (i.e., 0.7%, 0.65% and 0.6%), so that their band gaps are varied from each other and their oscillation wavelengths diverge from each other. Therefore, wavelength ranges of gains due to the respective well layers 1411, 1412 and 1413 are appropriately overlapped with being shifted from each other. Thus, approximately uniform gains can be obtained over a wide wavelength range.

Figure 40:
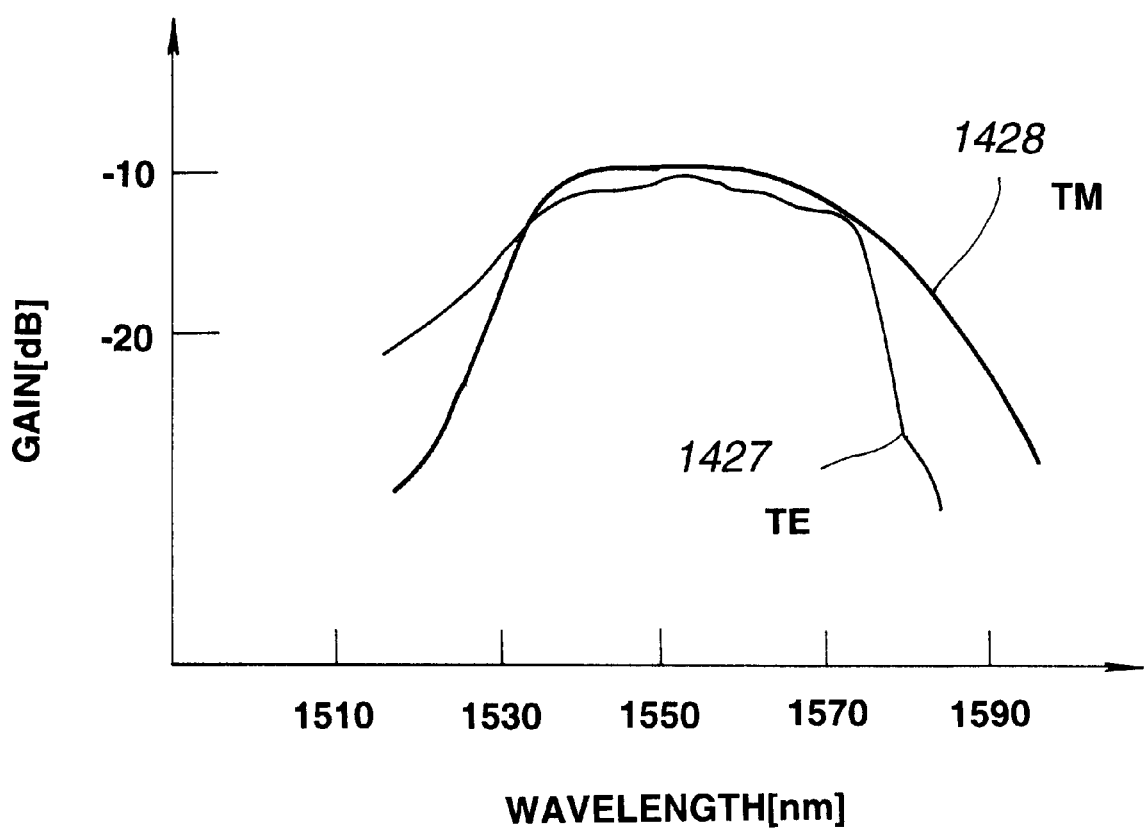
FIG. 40 is a view illustrating gain spectra for the TE mode and the TM mode in the twenty first embodiment.

FIG. 40 illustrates the gain distribution or profile obtained by that active region. As indicated by lines 1427 and 1428 in FIG. 40, due to the well layers 1411, 1412 and 1413, gains of both of the TE mode and the TM mode can have approxilately uniform magnitudes over a range from 1530 nm to 1570 nm. If a sufficiently uniform gain can not be attained even by that structure, an additional well layer, which can provide a gain in a wavelength range with an insufficient gain, only needs to be formed.

In the above structure, the reason for using the well layers with a thickness of 12 nm and tensile strain amounts from 0.6% to 0.7% in the active layer 3 will be described with reference to FIG. 41.

Figure 41:
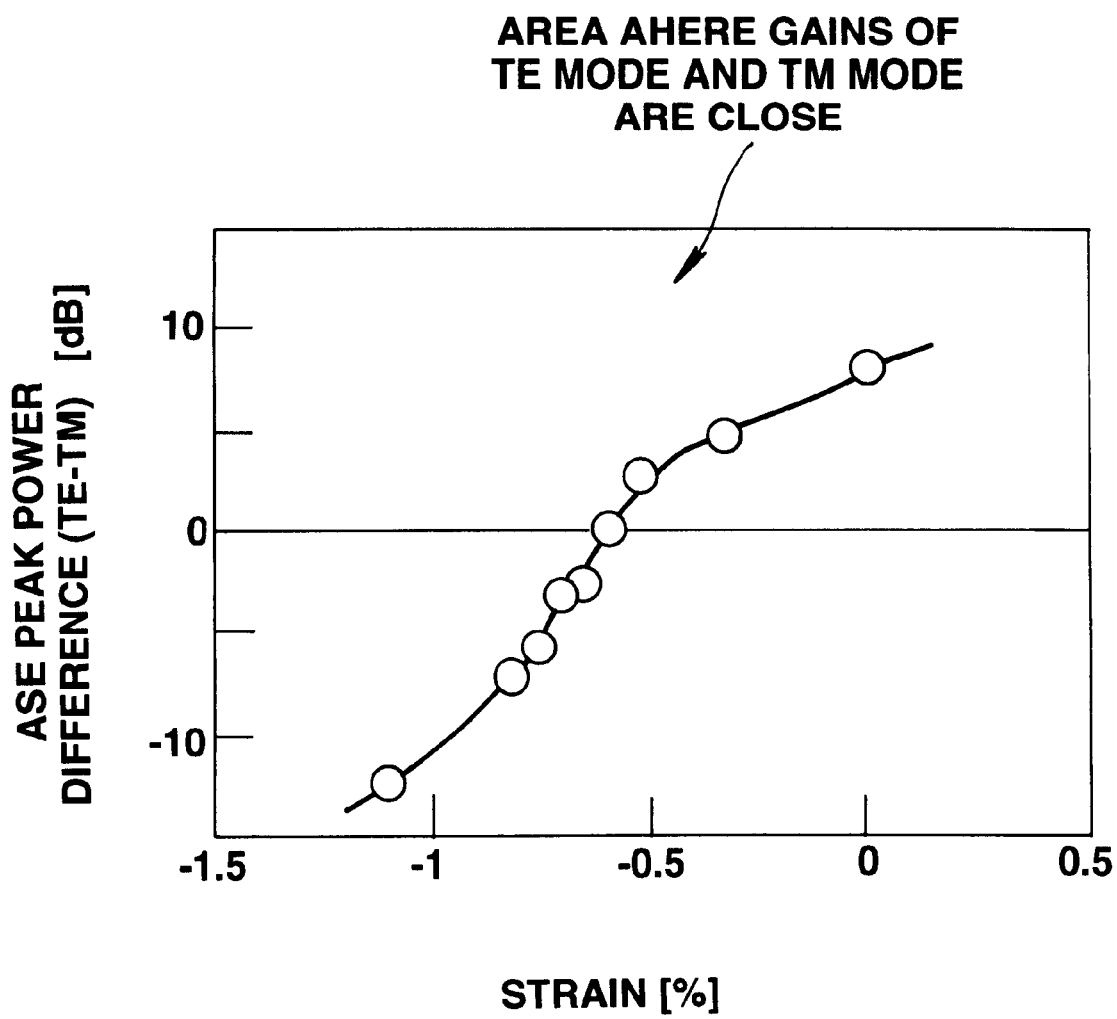
FIG. 41 is a view illustrating the relationship between a strain amount of a tensile-strained well and a gain difference between the TE mode and the TM mode.

FIG. 41 shows the relationship between the strain amount and an intensity difference between light components in the TE mode and the TM mode (i.e., a difference between peak powers of the respective amplified spontaneous emissions (ASE)) emitted from a laser end facet obtained under conditions under which the number of well layers in the active layer is three, a common thickness of the wells is 12 nm and a common strain is introduced into each of the three wells). Its ordinate indicates a gain difference between ASEs in the TE mode and the TM mode, and its abscissa indicates the tensile strain amount of the well layer. In the above structure, the tensile strain amount of the well layer in a device, whose polarization switching operation can be confirmed, ranges from 0.5% to 0.75% (in FIG. 41, from −0.5% to −0.75%). The polarization switching can not be confirmed if the tensile strain amount deviates from that range. It can be seen from FIG. 41 that a difference between the TE-mode gain and the TM-mode gain is within 3 [dB] when the polarization switching can be confirmed. That is, when that difference is within 3 [dB], it is possible to switch the oscillation polarization mode between the TE mode and the TM mode by changing the amount of current injected through the electrode.

The driving method and the switching operation of the above-discussed twenty first embodiment with the above construction are the same as those of the first embodiment.

In this embodiment, on the condition that respective tensile-strained well layers can approximately evenly generate gains for the TE mode and the TM mode, strain amounts of those well layers used in the active layer are varied from each other. Thus, wavelength ranges of gains generated by those well layers diverge from each other, so that the gains for the TE mode and the TM mode balance and are acquired in a wide wavelength range. Since the gains for both modes in respective wavelength regions compete with each other in each well layer, a stable switching can be achieved.

As described in the foregoing, in the twenty first embodiment, well layers, in each of which a ratio between gain generations in the TE mode and the TM mode is about even, are used in the tensile-strained active layer, and the strain amounts of those well layers are slightly varied. Hence, a semiconductor optical device, such as a semiconductor laser whose gains for the TE mode and the TM mode are approximately uniform and balance over a wide wavelength range, can be established. Also in the above structure, a gain difference between the TE mode and the TM mode in the active layer is small, and the gains for both modes balance and are stable in a wide range. Therefore, a laser, whose polarization mode is stably switched between the TE mode and the TM mode, can be fabricated.

Twenty Second Embodiment

Figure 42:
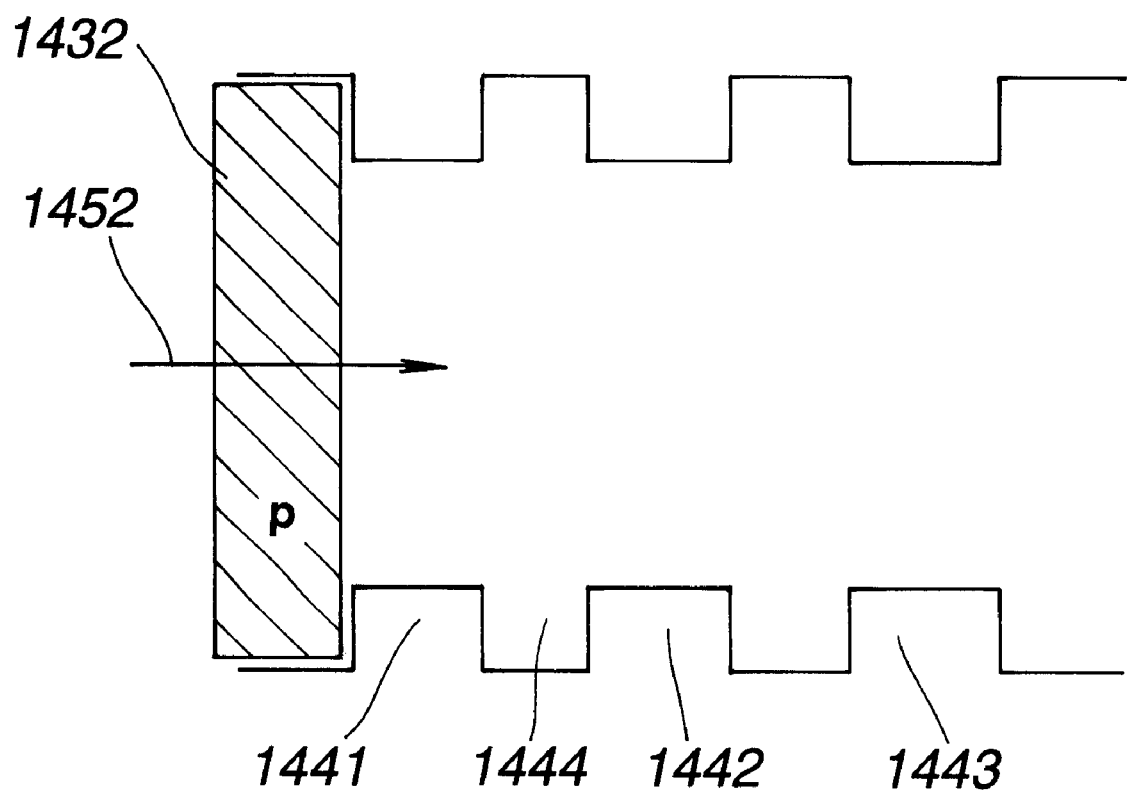
FIG. 42 illustrates the band gap structure of layers around an active layer used in a twenty second embodiment.

A twenty second embodiment will be described with reference to FIG. 42. The entire structure of the twenty second embodiment is the same as that of the second embodiment of FIG. 4, except that a diffraction grating with a pitch of 238.3 nm and a depth of 400 Å is formed on a substrate of a p-InP layer 31.

The layer structure of the active region 33 will be described with reference to FIG. 42. The feature of the twenty second embodiment is that thicknesses of well layers (not strain amounts thereof) are varied in order to expand a wavelength range of balancing gains. In FIG. 42, an arrow 1452 indicates a direction of layering. Reference numeral 1432 designates a Be-doped light guide layer region which corresponds to the light guide layer 32 in FIG. 4.

The structure of the active layer will be described. On the light guide layer 1432, a well layer 1441 of undoped InGaAs is initially grown with a thickness of 110 Å. A tensile strain of 0.6% is introduced into the well 1441. Then, a barrier layer 1444 is grown. The layer 1444 is comprised of an undoped InGaAsP layer having a thickness of 80 Å, and a compressive strain of 0.2% is introduced into the layer 1444.

On the barrier layer 1444, a well layer 1442 is laid down. The well layer 1442 is composed of undoped InGaAs, its thickness is 120 Å and its tensile strain amount is 0.6%. Then, a barrier layer, whose composition is the same as that of the barrier layer 1444 and whose thickness is 80 Å, is formed. On this barrier layer, a well layer 1443 of undoped InGaAs is formed with a thickness of 130 Å and a tensile strain amount of 0.8%.

Since thicknesses of the well layers 1441, 1442 and 1443 are varied as above (110 Å, 120 Å and 130 Å) with their strains amount being common (0.6%), quantum levels or band gaps of those well layers differ from each other and their oscillation wavelengths diverge from each other. Hence, wavelength ranges of gains due to those well layers 1441, 1442 and 1443 are appropriately overlapped each other and it is possible to obtain a wide wavelength range over which gains for the TE mode and the TM mode are approximately constant and balance. Gains for the TE mode and the TM mode are approximately constant over a range from 1510 nm to 1550 nm in this embodiment. In this embodiment, the number of the tensile-strained well layers is three, but the number thereof is not limited to this number. This embodiment can be applied to a device with well layers of different thicknesses or two or more than two well layers.

As described in the foregoing, thicknesses of the well layers are varied with their strain amounts being common, so that a wavelength range of approximately uniform gains for the TE mode and the TM mode can be set. Thus, a semiconductor optical laser, such as a semiconductor laser which has approximately constant gains over a wide wavelength range, can be realized. Although a p-type substrate is used in this embodiment, an n-type substrate may be used as described in an embodiment to be described later. The operation of this embodiment is substantially the same as that of the twenty first embodiment.

Twenty Third Embodiment

A twenty third embodiment will be described with reference to FIGS. 43 and 44. Features of this embodiment are that band gaps and thicknesses of well layers are controlled such that gains for the TE mode and the TM mode compete with each other, that the well layers are arranged from a p-side to an n-side in the order of their thicknesses (i.e., a wider well layer is placed nearer the p-side) and that propagation constants of fabricated waveguides are controlled by their physical structures such that the switching between the TE mode and the TM mode can be achieved by the phase control.

The entire structure of this embodiment is the same as that illustrated in FIGS. 7A and 7B, except that a diffraction grating with a pitch of 237 nm and a depth of 300 Å is partially formed on an n-InP substrate 61.

With respect to stripe widths of waveguides in the semiconductor laser, the stripe width D2 of a region with electrodes 69 and 71 is relatively narrow, say 1.5 μm, and the stripe width D1 of a region with an electrode 70 is relatively wide, say 3.0 μm.

The layer structure of the active layer region 63 will be described with reference to FIG. 43. A fundamental concept is that well layers with tensile strain amounts, which generate competing gains for the TE mode and the TM mode, are used and that the layering order of the well layers is determined only by considering a band gap difference between the well layers without distinguishing controls of the band gap by well thicknesses and strain amounts from each other. In this embodiment, a well layer with a wider band gap is placed nearer to a side into which carriers with a short diffusion length are injected, and the band gap of the well layer becomes narrower towards the other side.

Figure 43:
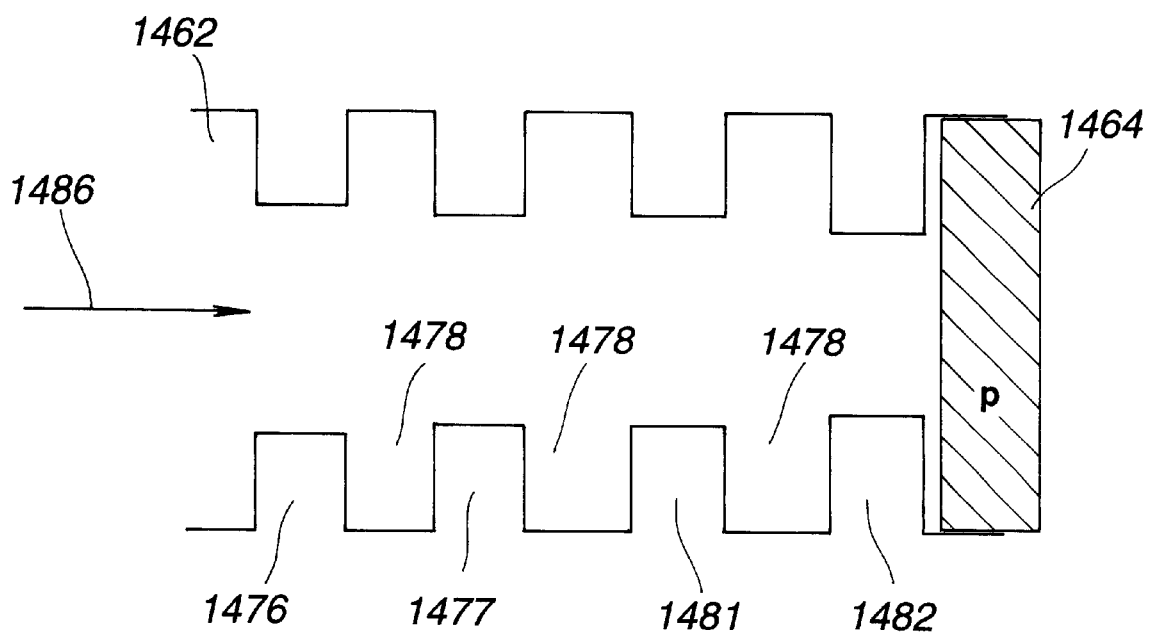
FIG. 43 illustrates the band gap structure of layers around an active layer used in a twenty third embodiment.

In FIG. 43, reference numeral 1486 designates a direction of layering, and reference numeral 1462 designates a lower light guide layer. The layer 1462 is composed of Si-doped InGaAsP, its carrier concentration is $1\times10^{17}\text{cm}^{-3}$, and its thickness is 0.2 μm. On the lower light guide layer 1462, the following layers are formed in the following order. A well layer 1476 of undoped InGaAs is initially grown with a thickness of 110 Å. A tensile strain of 0.75% is introduced into the well 1476. Then, a barrier layer 1478 is grown. The layer 1478 is comprised of an undoped InGaAsP layer having a thickness of 100 Å, and no strain (0.0%) is introduced into the layer 1478. On the barrier layer 1478, a well layer 1477 is laid down. The well layer 1477 is composed of undoped InGaAs, its thickness is 110 Å and its tensile strain amount is 0.7%. Then, a barrier layer, whose composition is the same as that of the barrier layer 1478, is formed. On this barrier layer, a 0.7% tensile-strained well layer 1481 of undoped InGaAs is formed with a thickness of 130 Å. Reference numeral 1478 denotes a barrier layer. Reference numeral 1482 denotes a 0.6% tensile-strained well layer of undoped InGaAs, and its thickness is 130 Å.

Reference numeral 1464 designates an upper light guide layer of Be-doped InGaAsP having a thickness of 0.2 μm. Such is the structure of the active layer.

Well layers having relatively wide band gaps are placed at the side of holes with a short diffusion distance (i.e., the side of the p-type light guide layer 1464), and the band gap of the well layer decreases as its location approaches the n-side. The reason for placing a well layer with a wider band gap nearer the side of the conduction type of the carriers with a short diffusion length is as follows. The gain of a well layer tends to be readily saturated as its band gap increases. If carriers are preferentially supplied to a well layer with a narrow band gap, which is hard to saturate, the gain of the well layer with a narrow band gap increases and it becomes imppossible that the gain of a well layer with a wide band gap catches up with the gain of the well layer with a narrow band gap. In order to make the gains for the TE mode and the TM mode approximately uniform over a wide wavelength range, it is necessary to preferentially obtain the gain of the well layer with a wide band gap. Therefore, the well layer with a wider band gap needs to be placed closer to the side of the conduction type of carriers having a shorter diffusion length. In the above-discussed active layer, there are arranged four strained well layers. Also in this embodiment, the number of the well layers in the active layer is not limited to the above example. However, there are physical limitations in the critical layer thickness and the like. Similarly, the thickness of each well layer is not limited to the above example. The thickness of the well layer only needs to be controlled such that its oscillation wavelength coincides with needed one. However, there are likewise physical limitations in the critical layer thickness.

Figure 44:
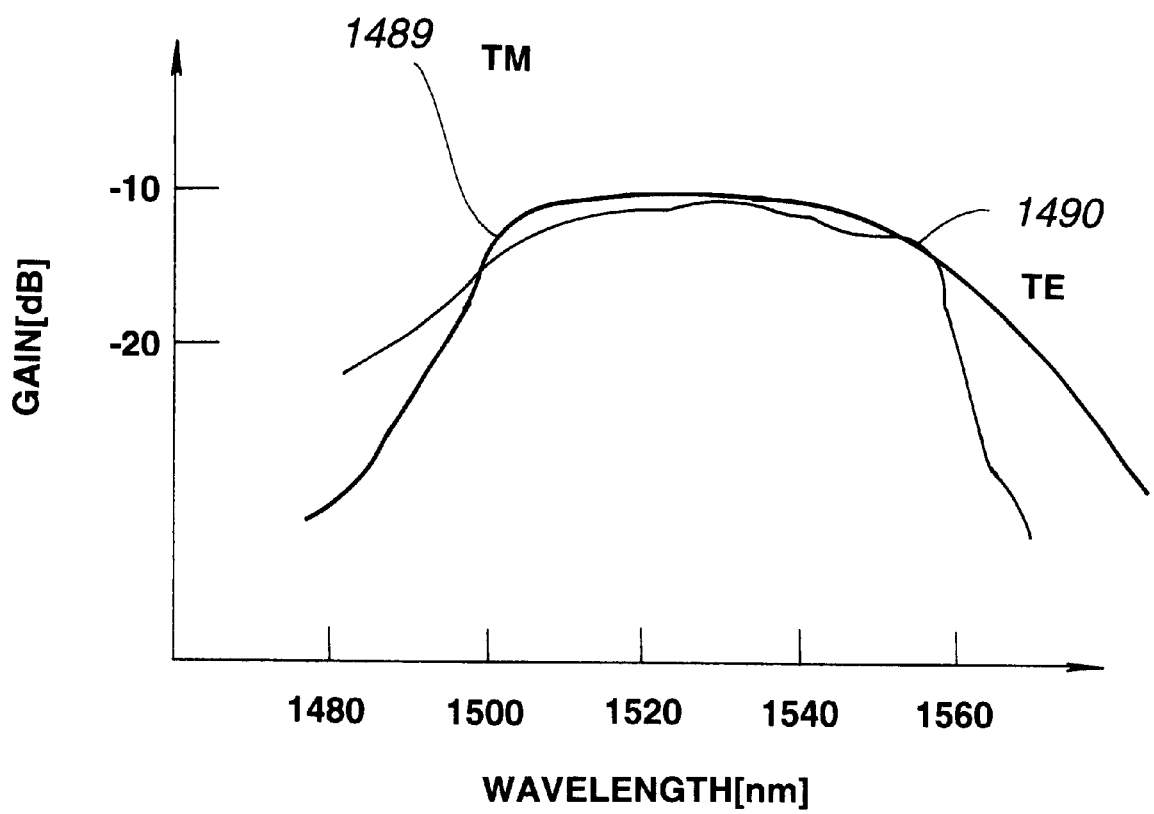
FIG. 44 is a view illustrating gain spectra for the TE mode and the TM mode in the twenty third embodiment.

FIG. 44 illustrates the gain distribution or profile for the TE mode and the TM mode of the laser using the above-discussed well layers. Four tensile-strained well layers are arranged, their strain amounts are varied from 0.75% to 0.6% and thicknesses of the well layers are varied from 11 nm to 13 nm, so that wavelength ranges of the gains extend to a longer wavelength side and is expanded from 1500 nm up to 1550 nm as indicated by lines 1489 and 1490. If a sufficiently uniform gain can not be attained even by that structure, an additional well layer, which can provide a gain for a wavelength range with an insufficient gain, only needs to be formed. Also in this case, it is desirable that a well layer with a wider band gap is positioned nearer the p-side and its band gap decreases as the location of the well layer approaches the n-side in the entire active layer.

The driving method and the switching operation of the above-discussed twenty third embodiment with the above construction are the same as those of the third embodiment of FIGS. 7A and 7B. Also in the structure of this embodiment, a gain difference between the TE mode and the TM mode is small in the active layer and gains for the both modes balance and are stable over a wide wavelength range, so that the laser switching between the TE mode and the TM mode can be stably performed.

Twenty Fourth Embodiment

A twenty fourth embodiment will be described with reference to FIG. 45. A cross section of its entire structure in its cavity direction is the same as that illustrated in FIG. 10.

The layer structure of the active region 113 will be described with reference to FIG. 45. The feature of the twenty fourth embodiment is that the active layer is doped with p-type impurities. In FIG. 45, an arrow 1521 indicates a direction of layering. Reference numeral 112 designates the Si-doped light guide layer region.

The structure of the active layer will be described. On the light guide layer 112, a well layer 1522 of undoped InGaAs is initially grown with a thickness of 12 nm. A tensile strain of 0.7% is introduced into the well 1522. Then, a barrier layer 1525 is grown. The layer 1525 is comprised of Be-doped InGaAsP, its thickness is 100 Å and no strain is introduced into the layer 1525. On the barrier layer 1525, a well layer 1523 is laid down. The well layer 1523 is composed of undoped InGaAsP, its thickness is 12 nm and its tensile strain amount is 0.65%. Then, a barrier layer, whose composition is the same as that of the barrier layer 1525 and into which no strain is introduced, is formed. On this barrier layer, a well layer 1524 of undoped InGaAsP is formed with a thickness of 12 nm and a tensile strain amount of 0.6%. The active region 113 has such a construction.

Figure 46:
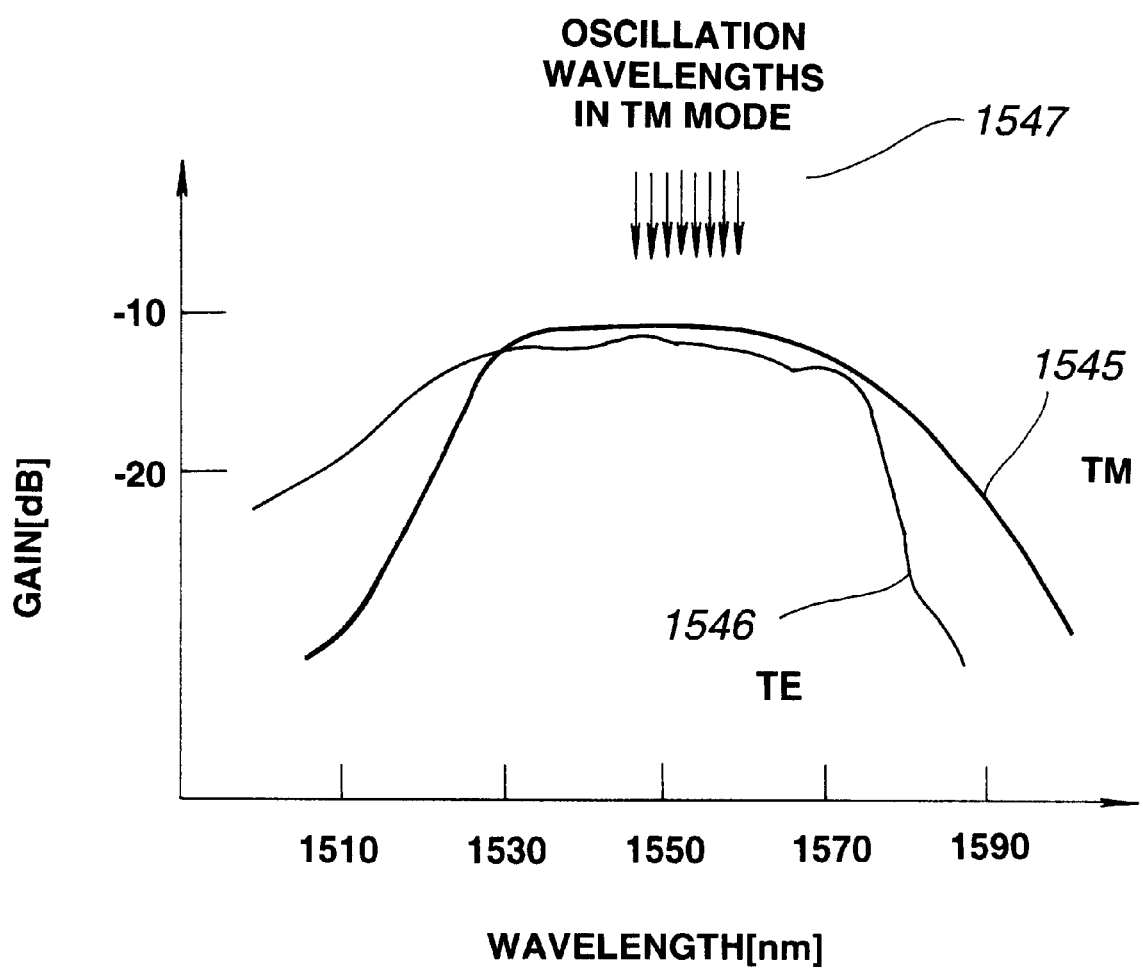
FIG. 46 is a view illustrating gain spectra for the TE mode and the TM mode in the twenty fourth embodiment and oscillation wavelengths in the TM mode of a laser array.

Since the strain amounts of the well layers 1522, 1523 and 1524 are varied as 0.7%, 0.65% and 0.6%, quantum levels of those well layers differ from each other and their band gaps corresponding to inter-quantum-level transition energies are different from each other. Thus, oscillation wavelengths of those well layers 1522, 1523 and 1524 diverge from each other. Hence, wavelength ranges of gains due to those well layers 1522, 1523 and 1524 are overlapped each other with being shifted appropriately, and it is possible to obtain approximately uniform gains for the TE mode and the TM mode over a wide wavelength range. FIG. 46 illustrates the gain profile. Due to those well layers 1522, 1523 and 1524, the gains for the TE mode and the TM mode can be approximately uniform over a range from about 1530 nm to 1570 nm as indicated by lines 1545 and 1546.

Figure 45:
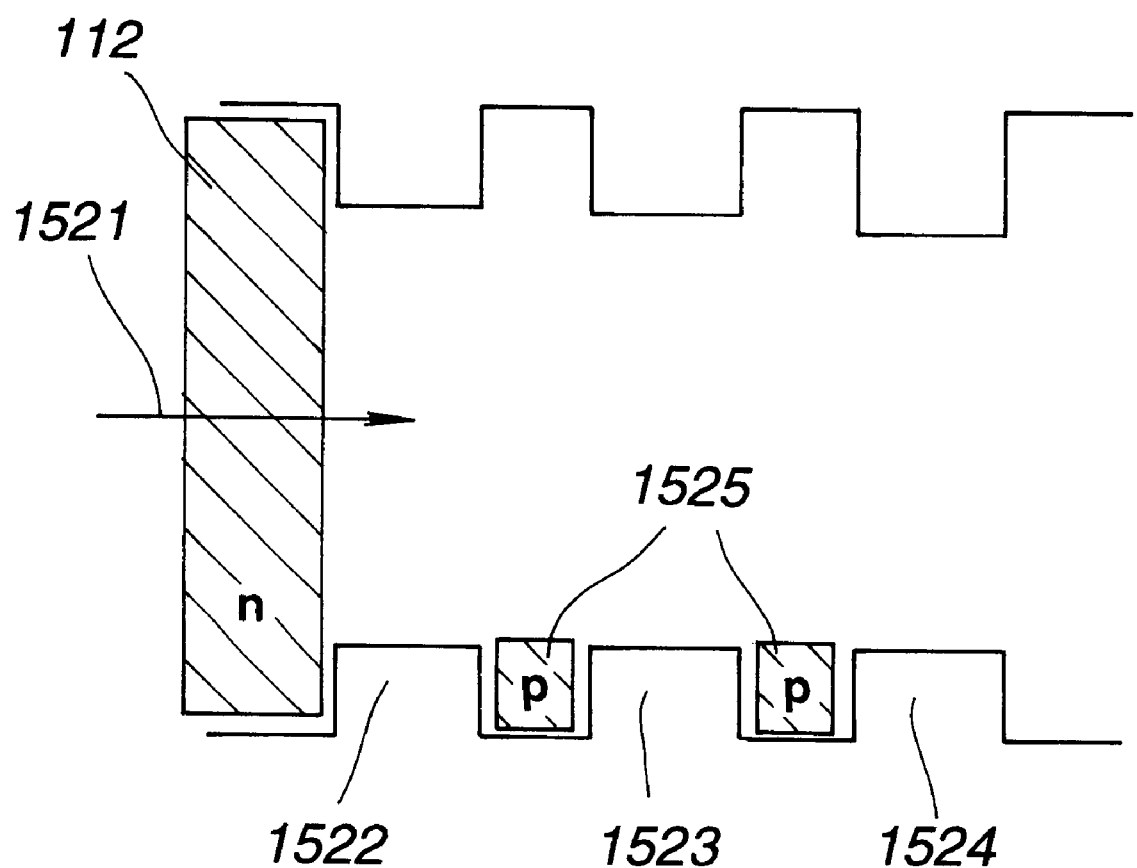
FIG. 45 illustrates the band gap structure of layers around an active layer used in a twenty fourth embodiment.

In FIG. 45, the reason for the p-type doping of the barrier layer 1525 in the active layer 113 is to lower the threshold current density. Further, due to the p-type doping, uniformity of the gains of the active layer 113 is promoted by using electrons, which are easier to diffuse, as control carriers. As a result, it is possible to achieve the oscillation and the switching between the TE mode and the TM mode in a low-current range due to the readily-diffusible electrons.

The reason for placing the well layer with a wider band gap (i.e., with a larger tensile strain amount) nearer the side of the n-conduction type in the active region in FIG. 45 is described above. Namely, uniformity of the gains in a wide wavelength range is promoted by preferentially supplying minority carriers (in this case, electrons) to the well layer with a wide band gap. In this emodiment, though only the barrier layer is doped with p-type impurities, the well layers may also be p-doped.

The operation of the twenty fourth embodiment is the same as that of the above embodiment. Further, although the grating is formed under the active layer in this embodiment, the grating may be formed on the active layer.

As described in the foregoing, in order to widen the gain-balancing range, the band gaps of the well layers are varied (this is attained by varying the strain amount and/or well thickness) and the p-doped active layer is used in the twenty fourth embodiment. Thus, the range, over which the TE-mode and TM-mode gains are approximately constant, can be more freely set, and thus an optical semiconductor device, such as a semiconductor laser with approximately constant gains for both of the polarization modes in a wide range, can be achieved.

An array laser can also be constructed by using the above active layer as a common active layer. In the array laser, a plurality of lasers are arranged in a lateral direction with a pitch of 600 μm and an interval between oscillation wavelengths of the respective lasers is set to 1 nm by varying grating pitches of those lasers. Grating pitches of the respective lasers are varied from 240.65 nm to 242.21 nm with an interval of 0.15 nm. For example, the array laser is constructed such that eight different oscillation wavelengths in the TM mode can be emitted from respective lasers as illustrated by reference numeral 1547 in FIG. 46.

In the twenty first to twenty fourth embodiments, the active layer consists of the tensile-strained well layers only, on the basis of the fact that gains for the TE mode and the TM mode balance in a well layer when an appropriate amount of tensile strain is introduced into the well layer. However, if necessary, a non-strained or compressively-strained well layer may be contained in the active layer. Its number, location, strain amount, way of arrangement and the like only need to be set according to the purpose. Also in this case, the operation principle is substantially the same as that of the above embodiment.

Twenty Fifth Embodiment

Figure 47:
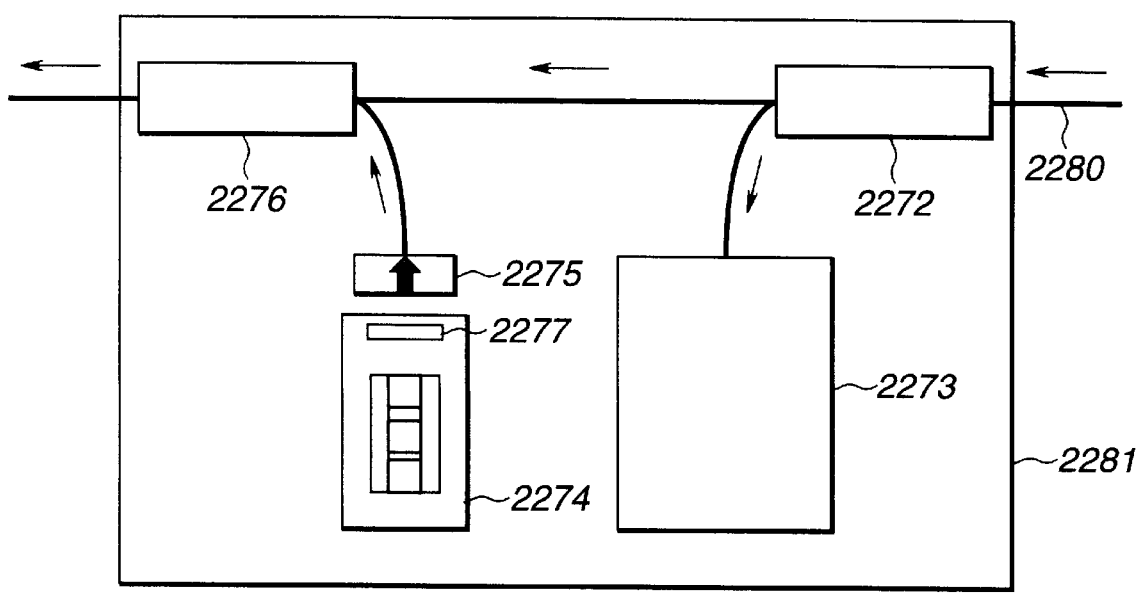
FIG. 47 is a block diagram illustrating the structure of a node using an optical semiconductor device of the present invention.

A twenty fifth embodiment will now be described with reference to FIGS. 47, 48 and 49. The fifteenth embodiment is directed to an optical local area network (LAN) system or a wavelength division multiplexing optical LAN system using an optical semiconductor device of the present invention as a light source in a transmitter, for example. FIG. 47 illustrates an opto-electric converting unit (node), which is connected to a terminal of the optical LAN system shown in FIG. 48.

In this embodiment, the polarization mode of the semiconductor laser of this invention is changed by a modulation current with a small amplitude. A polarizer is arranged in front of the laser, and an intensity-modulated transmission signal is obtained through the polarizer. Either of the TE mode and the TM mode may be selected as a transmission signal. Japanese Patent Laid-Open No. 2 (1990)-159781 discloses such a direct polarization modulating system.

Figure 48:
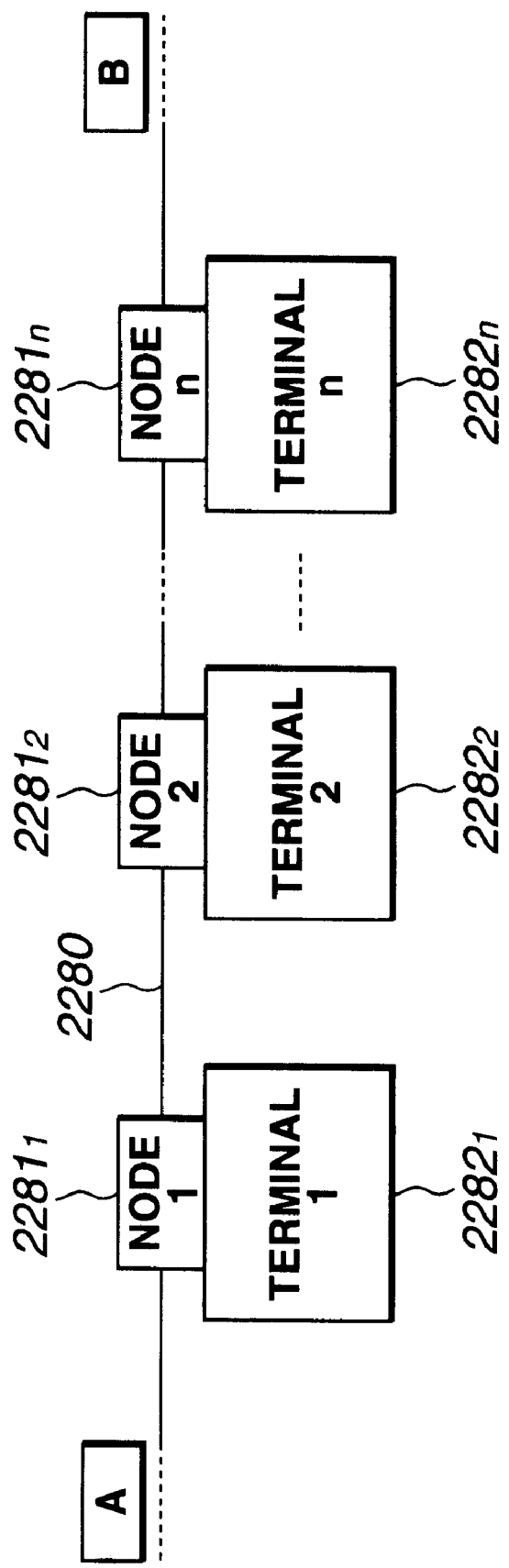
FIG. 48 is a block diagram illustrating the structure of a bus-type optical communication system using the node of FIG. 47.

In the bus-type network shown in FIG. 48, multiple terminals $2282_1$, $2282_2$, . . . , $2282_n$ are respectively connected to an optical fiber 2280 through nodes $2281_1$, $2281_2$, . . . , $2281_n$ along a direction A-B. Where a large number of the nodes 2281 are connected, it is desirable to serially provide optical amplifiers (an optical semiconductor device of the present invention may be used as an optical amplifier with a small polarization sensibility) on the optical fiber 2280 to compensate for attenuation of light.

In FIG. 47, a light signal is taken into the node 2281 through the optical fiber 2280, and a portion of the signal is input into an optical receiver 2273 by a branching device 2272. The optical receiver 2273 includes a tunable optical filter and a photodetector, and only signal light at a selected wavelength is taken out from the incident signal light, and the signal is detected.

On the other hand, when a light signal is transmitted from the node 2281, signal light from an optical semiconductor device 2274 of the present invention is input into the optical fiber 2280 at a combining portion 2276 through an isolator 2275. The laser 2274 is driven by a method described in the above embodiments, and a polarization-modulated light wave emitted from the laser 2274 is converted to an intensity-modulated light output by a polarizer 2277 or the like. Where the array laser 140 of FIG. 12 is used as the semiconductor laser device 2274, for example, each laser may be used with its wavelength being fixed. Where the semiconductor laser of the other embodiment is used as the semiconductor laser device 2274, its bias curent ratio only needs to be appropriately controlled and the laser may be used as a wavelength changeable laser.

A plurality of tunable optical filters and semiconductor lasers may be arranged in a node to widen the wavelength tunable range. Further, two nodes may be connected to each terminal and two optical fibers may be provided to accomplish bi-directional transmission of a DQDB system.

As a network, a loop type, which is constructed by connecting A and B in FIG. 48, a star type, or a compound configuration thereof may be used.

Figure 49:
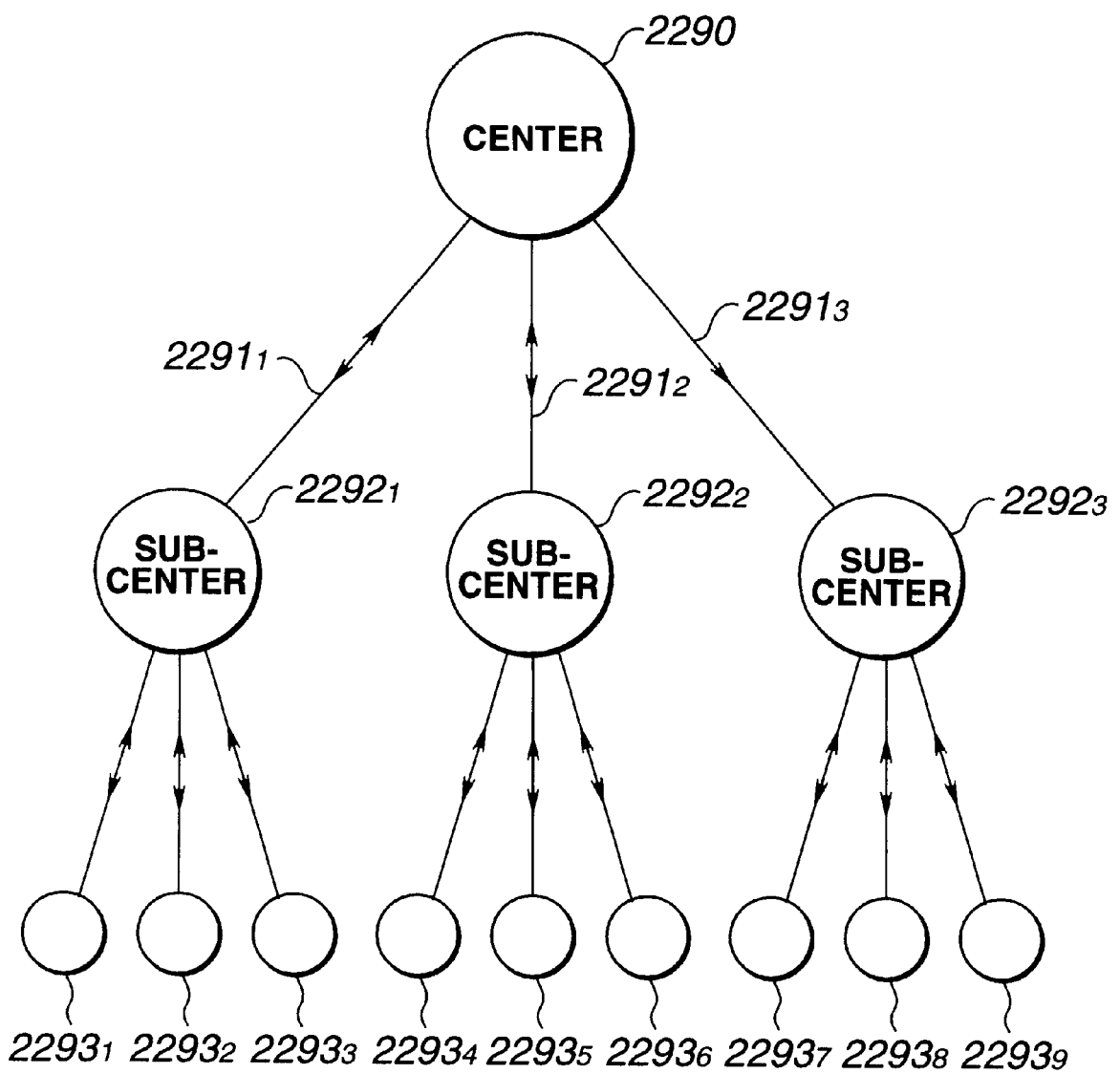
FIG. 49 is a block diagram illustrating the structure of a bi-directional optical CATV system using the node of FIG. 47.

A bi-directional optical CATV system, as shown in FIG. 49, can be constructed using a semiconductor device and an optical communication system of the present invention. In FIG. 49, reference numeral 2290 is a CATV center, reference numerals $2292_1$, $2292_2$ and $2292_3$ are respectively sub-centers connected to the center 2290 by optical fibers $2291_1$, $2291_2$ and $2291_3$, and reference numerals $2293_1$, $2293_2$, . . . , $2293_9$ are respectively receivers of subscribers connected to the sub-centers $2292_1$, $2292_2$ and $2292_3$. In the center 2290, a light source apparatus or tunable laser is polarization-modulated by a driving method described in the above embodiments, and a plurality of video signals are carried on signal light of different wavelengths and transmitted to the receivers $2293_1$, $2293_2$, . . . , $2293_9$. Each receiver includes a tunable wavelength filter and a photodetector, and only signal light at a desired wavelength of input signal light is detected to reproduce a picture image on a monitor. On the subscriber side, the transmission wavelength of the tunable filter is changed to select a desired channel. Thus, a desired picture image can be obtained. Conventionally, it was difficult to use such a DFB filter in that system due to the dynamic wavelength fluctuation of a DFB laser. The present invention enables the use of such a DFB filter.

Further, a bi-directional CATV is possible in the following manner. Each of the receivers $2293_1$, $2293_2$, . . . , $2293_9$ has an external modulator (an example of a simple bi-directional optical CATV, see, for example, Ishikawa and Furuta "LiNbO$_3$ Optical Wavelength Modulator For Bi-directional Transmission in Optical CATV Subscriber Systems", OCS 91-82 1991), and a signal from the subscriber is received as a reflected light (reflected light of a signal light transmitted to the subscriber) from its external modulator. Thus, highly improved services can be obtained.

Except as otherwise disclosed herein, the various components shown in outline or block form in any of the FIGS. 1–29 are individually well known in the optical semiconductor device and optical communication arts, and their internal construction and operation are not described herein.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. An oscillation polarization-mode selective semiconductor laser comprising:

a substrate; and an active region formed on said substrate, which comprises (1) a tensile-strained region, the tensile-strained region having a plurality of tensile-strained quantum well layers wherein at least one of said tensile-strained quantum well layers has a band gap different from that of the other tensile-strained quantum well layers, and (2) a compressively-strained region, the compressively-strained region having a plurality of compressively strained quantum well layers wherein at least one of said compressively strained quantum well layers has a band gap different from that of the other compressively strained quantum well layers, said oscillation polarization-mode selective semiconductor laser having a TE mode and a TM mode, and wherein TE mode and TM mode gains balance with each other, or are approximately equal to each other, in a wavelength range in which switching between the TE mode and the TM mode can be achieved.

2. A semiconductor laser according to claim 1, wherein tensile strain amounts of said plurality of tensile-strained quantum well layers range from 0.5% to 0.75%.

3. A semiconductor laser according to claim 1, wherein said plurality of tensile-strained quantum well layers have well thicknesses different from each other.

4. A semiconductor laser according to claim 3, wherein said plurality of tensile-strained quantum well layers are arranged in order of width, being narrower toward a minority carrier supply side and wider toward a majority carrier supply side.

5. A semiconductor laser according to claim 1, wherein said plurality of tensile-strained quantum well layers have tensile strain amounts different from each other.

6. A semiconductor laser according to claim 1, wherein, among said plurality of tensile-strained quantum well layers, well layers with wider band gaps are placed on a minority carrier side closer together than are well layers with narrower band gaps.

7. A semiconductor laser according to claim 1, wherein said active region comprises more than three tensile-strained quantum well layers having band gaps different from each other, and these tensile-strained quantum well layers are arranged in order of width, being narrower toward a minority carrier supply side and wider toward a majority carrier supply side.

8. A semiconductor laser according to claim 1, wherein said active region comprises more than three tensile-strained quantum well layers having band gaps different from each other, and a plurality of barrier layers with thicknesses different from each other which are placed between these quantum well layers, and wherein said barrier layers are arranged in order of thickness, being thinner toward a minority carrier supply side and thicker toward a majority carrier supply side.

9. A semiconductor laser according to claim 1, wherein said active region further comprises strained quantum well layers having band gaps different from each other.

10. A semiconductor laser according to claim 1, wherein said active region further comprises a plurality of non-strained quantum well layers having band gaps different from each other.

11. A semiconductor laser according to any one of claims 1–10, wherein said active region is selected from the group consisting of (i) non-doped and (ii) at least partly n-doped.

12. A semiconductor laser according to any one of claims 1–10, wherein said active region is at least partly p-doped.

13. A semiconductor laser according to any one of claims 1–10, wherein said semiconductor laser is constructed as a distributed feedback semiconductor laser.

14. A semiconductor laser according to any one of claims 1–10, having a cavity, and wherein there are arranged a plurality of regions along a cavity direction, and wherein said regions are constructed such that currents can be injected into said respective regions independently.

15. A semiconductor laser according to claim 14, wherein at least two of said regions have propagation constants that are different from each other.

16. A light source apparatus comprising a semiconductor laser according to any one of claims 1–10, and polarization mode selecting means for selecting light in one of two different polarization modes emitted from said semiconductor laser.

17. An optical communication system for communicating over a light transmission line that transmits a signal from a transmitter side to a receiver side, said system comprising:
 a light source apparatus, said light source apparatus including: a semiconductor laser according to any one of claims 1–10;
 polarization mode selecting means for selecting light in one of two different polarization modes emitted from said semiconductor laser;
 coupling means for coupling light in one of the two different polarization modes from said semiconductor laser to the light transmission line; and
 a receiver for detecting the light in one of the two different polarization modes transmitted through the light transmission line, said receiver being disposed on the receiver side.

18. An optical communication method for communicating over a light transmission line that transmits a signal from a transmitter side to a receiver side, said method comprising the steps of:
 preparing a light source apparatus, the light source apparatus including a semiconductor laser according to any one of claims 1–10 and polarization mode selecting means for selecting light in one of two different polarization modes emitted from the semiconductor laser;
 supplying to the semiconductor laser a current which is produced by superimposing a modulation signal modulated in accordance with a transmission signal on a predetermined bias current; and
 selecting a signal intensity-modulated in accordance with the transmission signal by the polarization mode selecting means to transmit the intensity-modulated signal to the receiver side.

19. A method for driving an optical semiconductor device, said method comprising the steps of:
 preparing a semiconductor laser according to any one of claims 1–10;
 superimposing a modulation signal modulated in accordance with a transmission signal on a predetermined bias current; and
 modulating a polarization mode of light emitted from the semiconductor laser between two different polarization modes in accordance with the transmission signal.

20. A method for using an optical amplifier with a small polarization sensibility, said method comprising the steps of:
 preparing a semiconductor laser according to any one of claims 1–10, the semiconductor laser having a threshold;
 supplying to the semiconductor laser a bias current which is close to and below its threshold; and
 inputting light into the semiconductor laser to amplify the light.

21. A semiconductor laser according to claim 1, wherein owing to said tensile-strained quantum well layers and compressively-strained quantum well layers, TE-mode and TM-mode gains balance with each other or are approximately equal to each other.

22. A semiconductor laser according to claim 1, wherein said band gap means transition energies between quantum levels.

23. A semiconductor laser according to claim 1, wherein among said plurality of tensile-strained quantum well layers the narrowest well layer is placed immediately to p-type layer, which is formed on the surface of the substrate, which constitutes said semiconductor laser.

* * * * *

UNITED STATES PATENT AND TRADEMARK OFFICE
CERTIFICATE OF CORRECTION

PATENT NO.    : 6,288,410 B1
DATED         : September 11, 2001
INVENTOR(S)   : Seiichi Miyazawa It is certified that error appears in the above-identified patent and that said Letters Patent is hereby corrected as shown below:

<u>Title page,</u>
Item [*], insert:

-- [*] Notice:   This patent issued on a continued prosecution application filed under 37 CFR 1.53 (d). and is subject to the twenty year patent term provisions of 35 U.S.C. 154(a)(2). --.

Item [56], References Cited, FOREIGN PATENT DOCUMENTS,
"02117190 should read -- 02-117190
  07162088"                  07-162088 --.

<u>Drawings,</u>
Sheet 41, FIG. 41, "AHERE" should read -- WHERE --.

<u>Column 1,</u>
Line 13, "an" should read -- a --.

<u>Column 7,</u>
Line 24, "in" should read -- in a --; and
Line 28, "the" second occurrence should read -- in the --.

<u>Column 9,</u>
Line 44, "approxilately" should read -- approximately --.

<u>Column 13,</u>
Line 66, "nGaAsP" should read -- InGaAsP --.

<u>Column 14,</u>
Line 16, "approxilately" should read -- approximately --.

<u>Column 17,</u>
Line 19, "tothe" should read -- to the --.

<u>Column 19,</u>
Line 13, "approxilately" should read -- approximately --.

<u>Column 20,</u>
Line 48, "barier" should read -- barrier --.

UNITED STATES PATENT AND TRADEMARK OFFICE
CERTIFICATE OF CORRECTION

PATENT NO. : 6,288,410 B1
DATED : September 11, 2001
INVENTOR(S) : Seiichi Miyazawa It is certified that error appears in the above-identified patent and that said Letters Patent is hereby corrected as shown below:

Column 24,
Line 15, "an" should be deleted; and
Line 22, "approxilately" should read -- approximately --.

Column 26,
Line 55, "approxilately" should read -- approximately --.

Column 28,
Line 16, "40μ." should read -- 40Å. --.

Column 29,
Line 61, "approxilately" should read -- approximately --.

Column 34,
Line 17, "approxilately" should read -- approximately --; and
Line 31, "thicness" should read -- thickness --.

Column 36,
Line 21, ")" (2nd occurrence) should be deleted.

Column 37,
Line 49, "approxilately" should read -- approximately --.

Column 45,
Line 6, "alyer" should read -- layer --.

UNITED STATES PATENT AND TRADEMARK OFFICE
CERTIFICATE OF CORRECTION

PATENT NO.    : 6,288,410 B1
DATED         : September 11, 2001
INVENTOR(S)   : Seiichi Miyazawa It is certified that error appears in the above-identified patent and that said Letters Patent is hereby corrected as shown below:

Column 51,
Line 15, "impposible" should read -- impossible --.

Signed and Sealed this

Twenty-seventh Day of August, 2002

Attest:

JAMES E. ROGAN
Attesting Officer         Director of the United States Patent and Trademark Office